(12) United States Patent
Toda

(10) Patent No.: US 8,168,938 B2
(45) Date of Patent: May 1, 2012

(54) METHOD OF MANUFACTURING AN OPTICAL MEMBER HAVING STACKED HIGH AND LOW REFRACTIVE INDEX LAYERS

(75) Inventor: Atsushi Toda, Kanagawa (JP)

(73) Assignee: Sony Coproration, Tokyo (JP)

( * ) Notice: Subject to any disclaimer, the term of this patent is extended or adjusted under 35 U.S.C. 154(b) by 0 days.

(21) Appl. No.: 13/093,525

(22) Filed: Apr. 25, 2011

(65) Prior Publication Data

US 2011/0201144 A1 Aug. 18, 2011

Related U.S. Application Data

(60) Continuation of application No. 12/487,133, filed on Jun. 18, 2009, which is a division of application No. 12/132,042, filed on Jun. 3, 2008, now abandoned.

(30) Foreign Application Priority Data

Jun. 4, 2007 (JP) .................................. 2007-148165

(51) Int. Cl.
*H01J 3/14* (2006.01)
*H01L 21/00* (2006.01)

(52) U.S. Cl. .......................................... 250/216; 438/69
(58) Field of Classification Search .................. 250/216; 359/565, 566, 569–576; 438/69, 71
See application file for complete search history.

(56) References Cited

U.S. PATENT DOCUMENTS

| 7,683,449 B2 * | 3/2010 | Minixhofer ................... 257/432 |
| 2006/0115230 A1 | 6/2006 | Komoguchi et al. |
| 2006/0125948 A1 | 6/2006 | Orita et al. |
| 2006/0284052 A1 | 12/2006 | Toshikiyo et al. |
| 2007/0200055 A1 | 8/2007 | Reznik et al. |

FOREIGN PATENT DOCUMENTS

| EP | 1 696 249 | 8/2006 |
| JP | 2005-011969 | 1/2005 |
| JP | 2006-351972 | 12/2006 |

\* cited by examiner

*Primary Examiner* — Thanh X Luu
(74) *Attorney, Agent, or Firm* — SNR Denton US LLP

(57) ABSTRACT

A method of making an optical member including high refractive index layers and low refractive index layers, which are each relatively thin as compared with an optical length, and disposed alternately in the lateral direction with respect to an optical axis. Each width of the high refractive index layers and the low refractive index layers is equal to or smaller than the wavelength order of incident light.

21 Claims, 46 Drawing Sheets

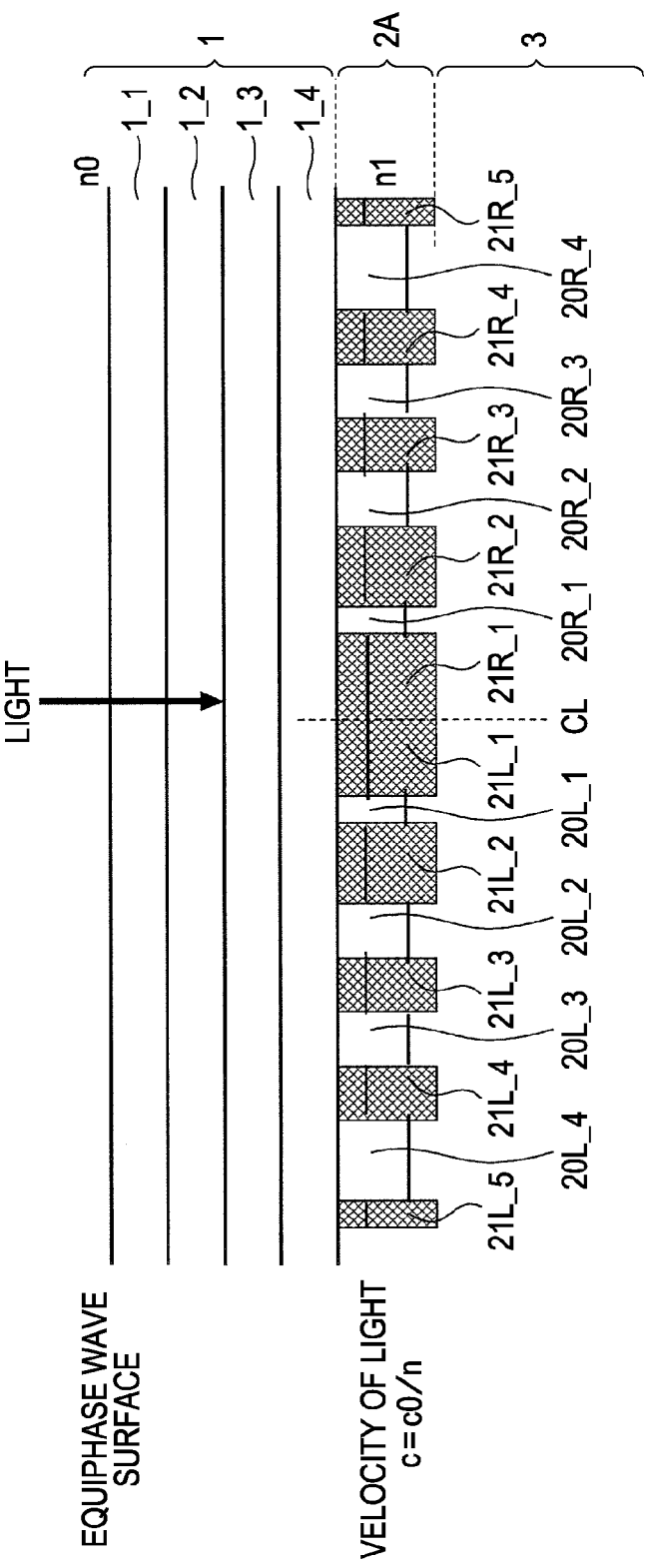

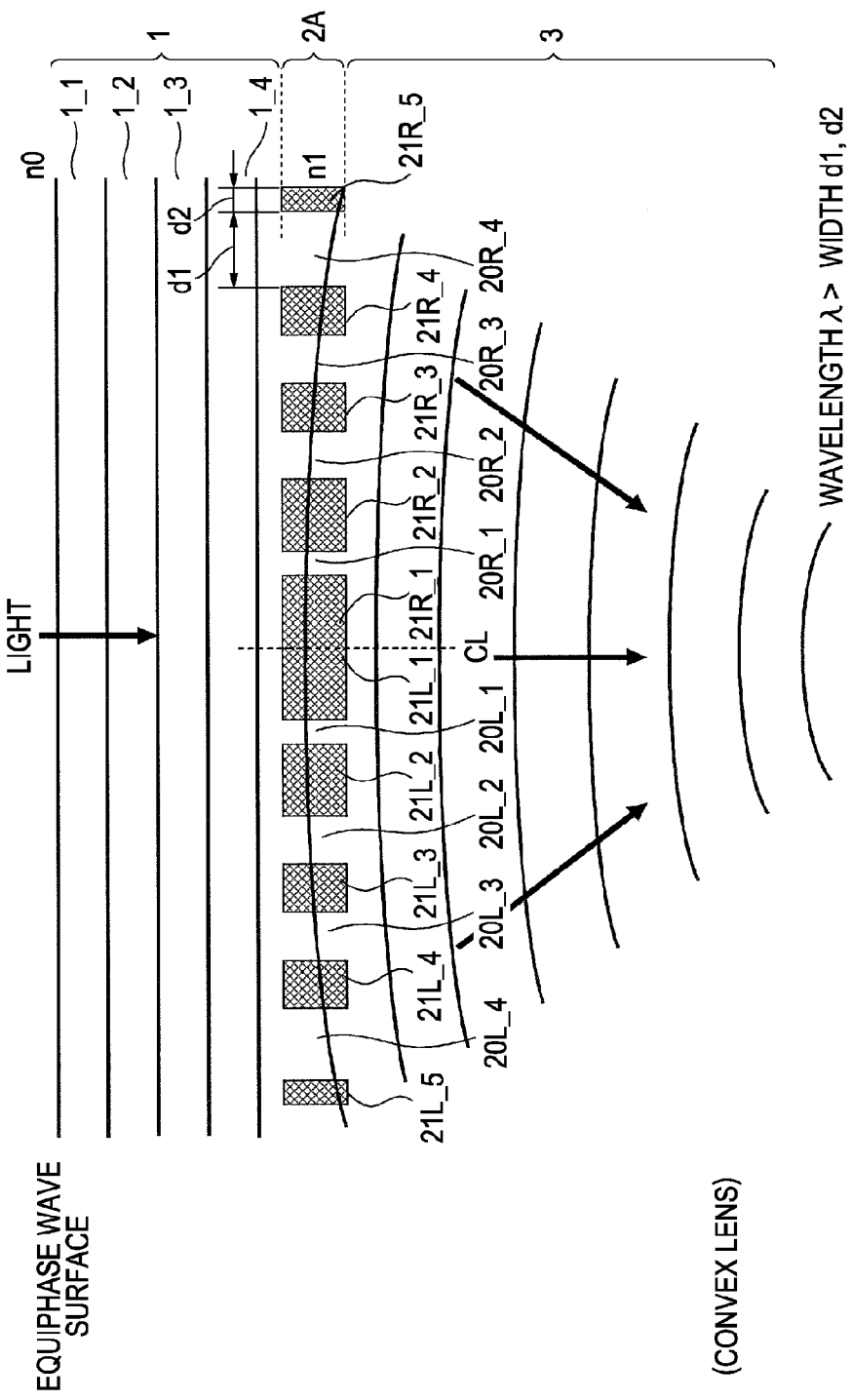

MINIMUM WIDTH 0.1 μm

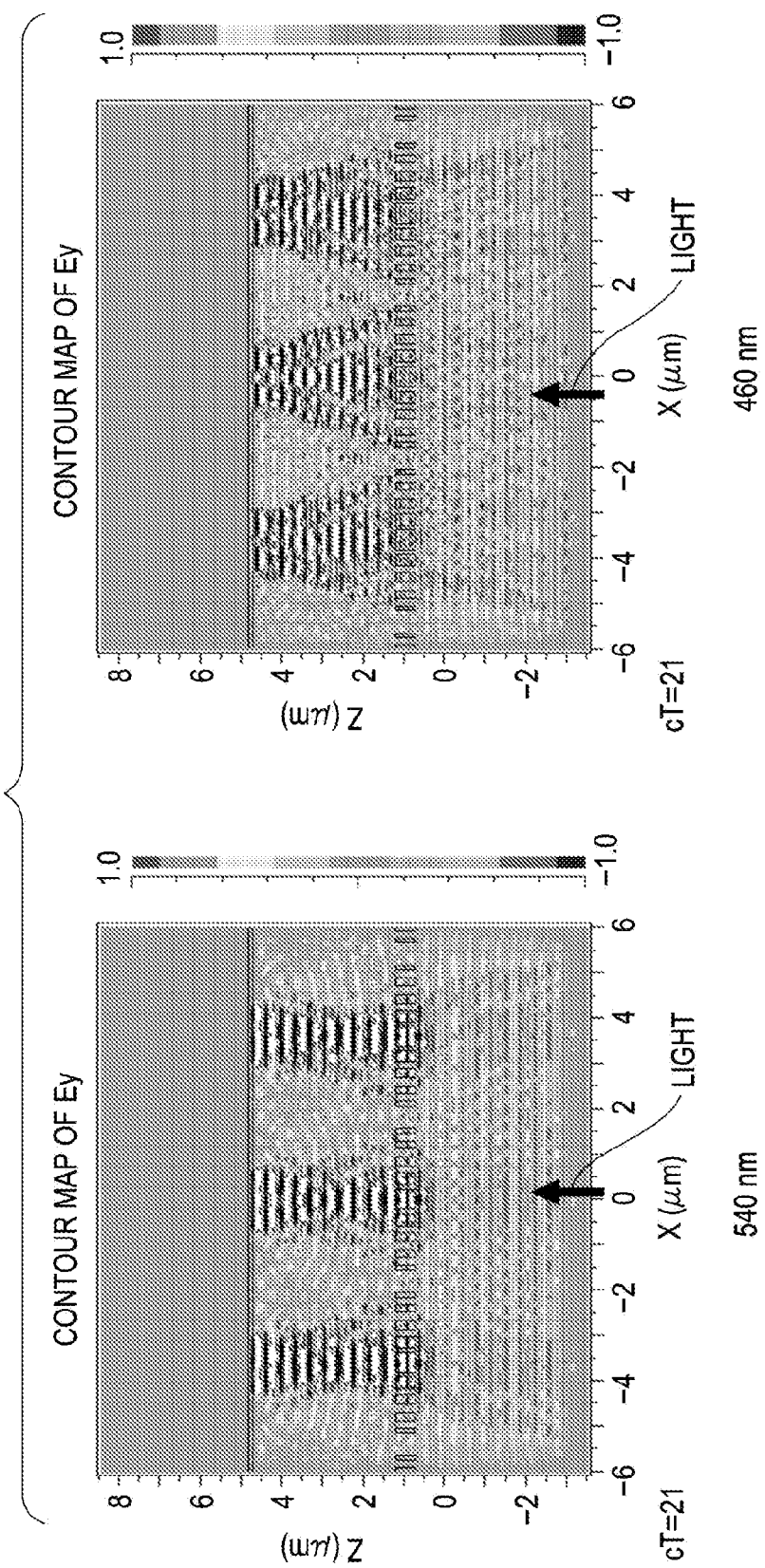

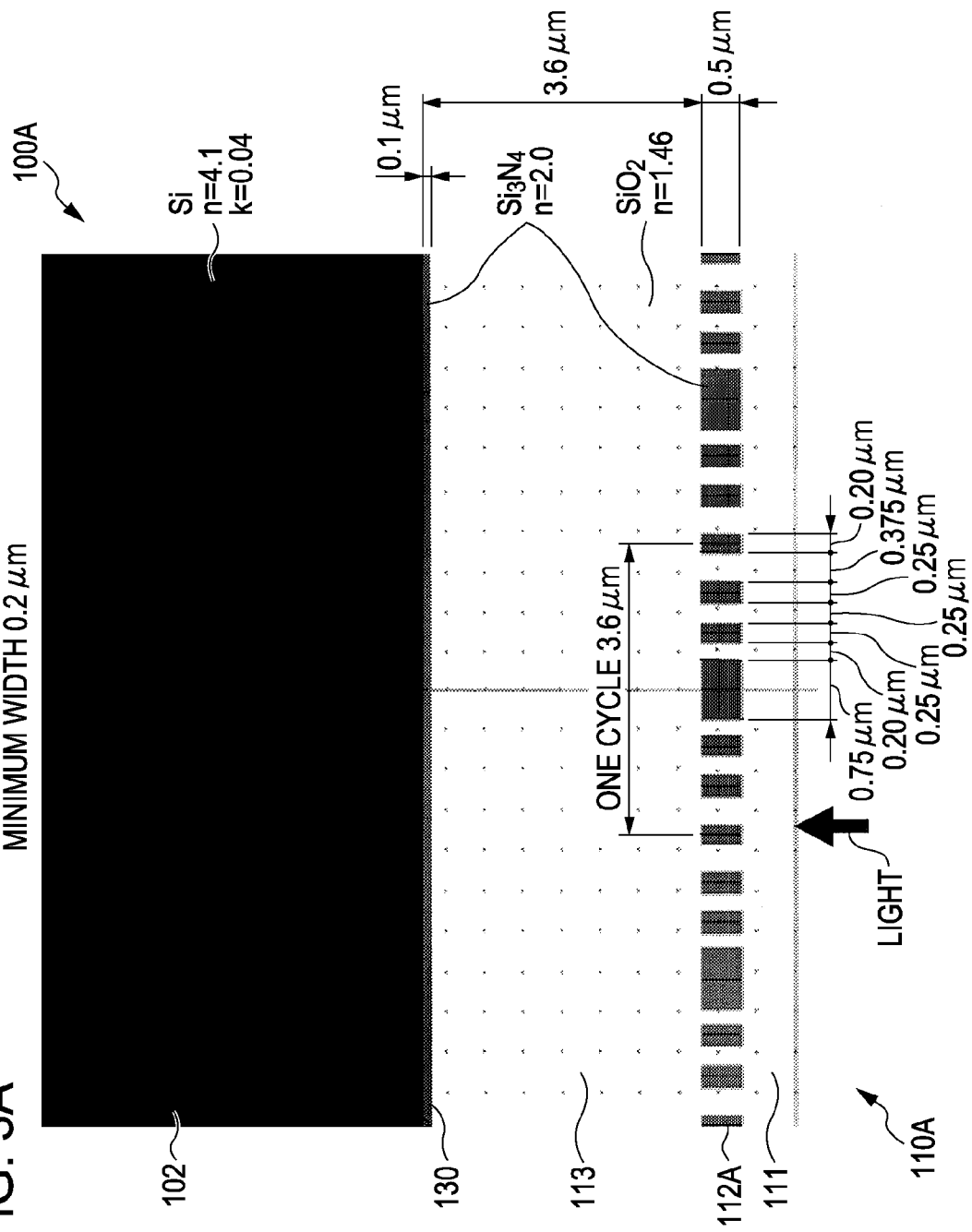

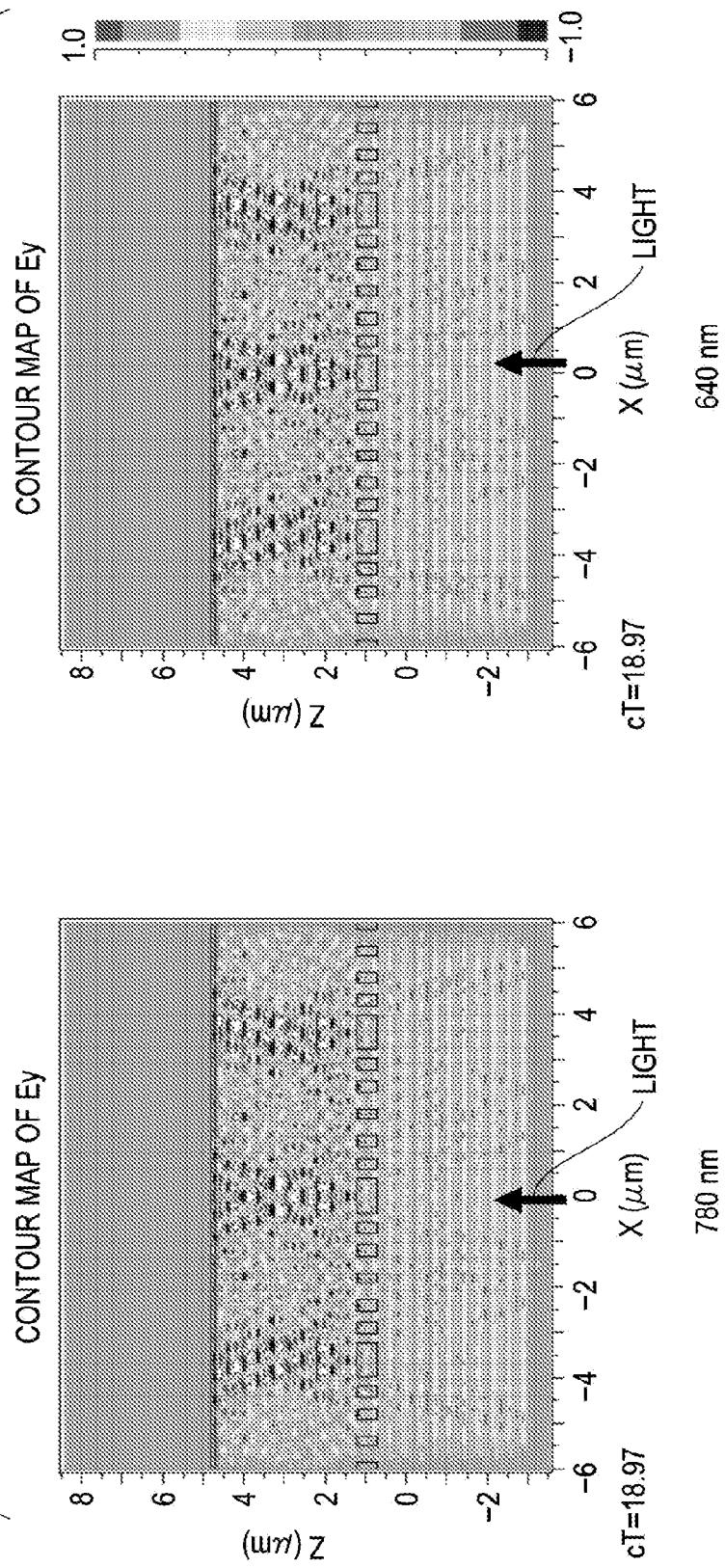

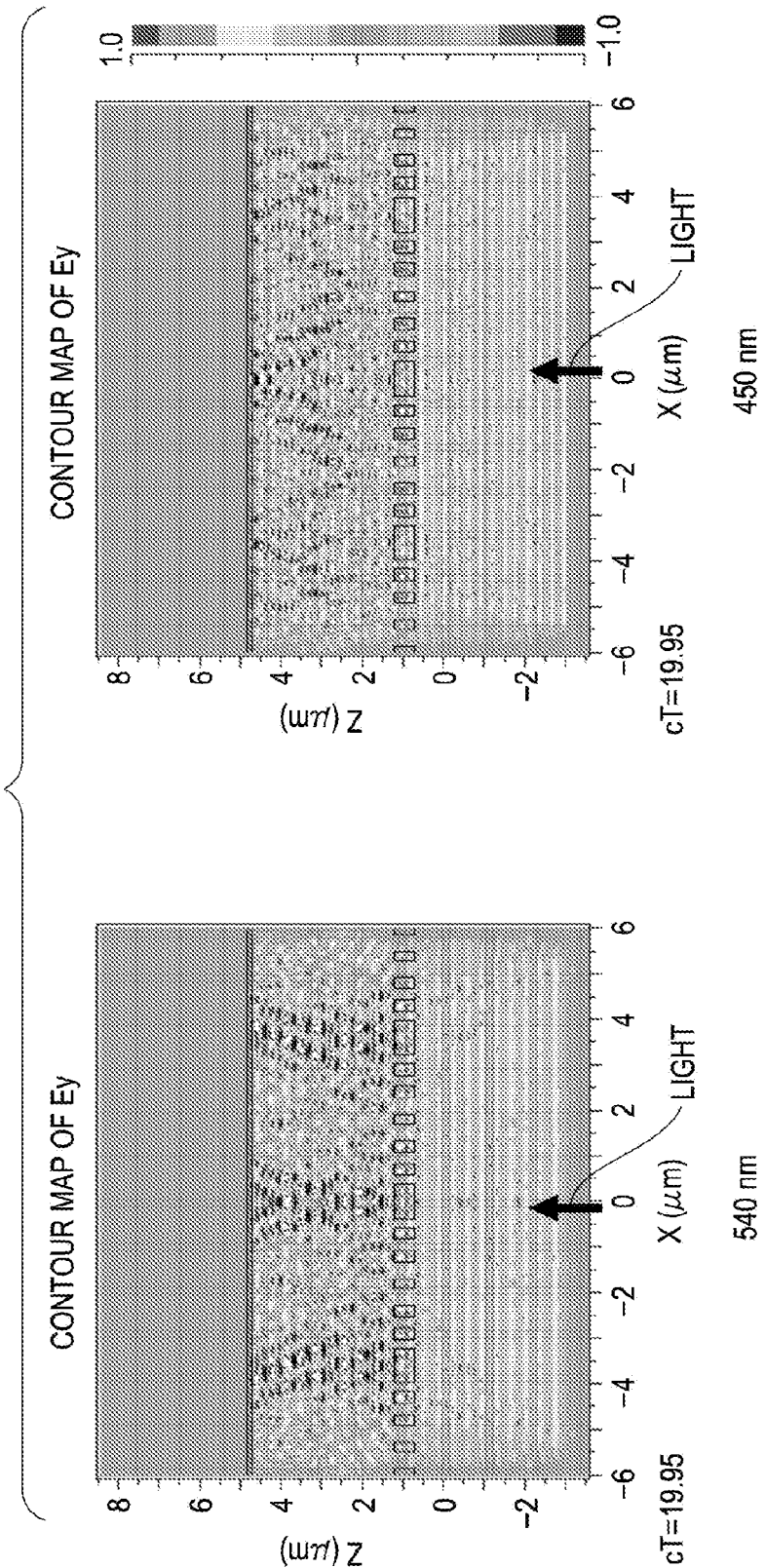

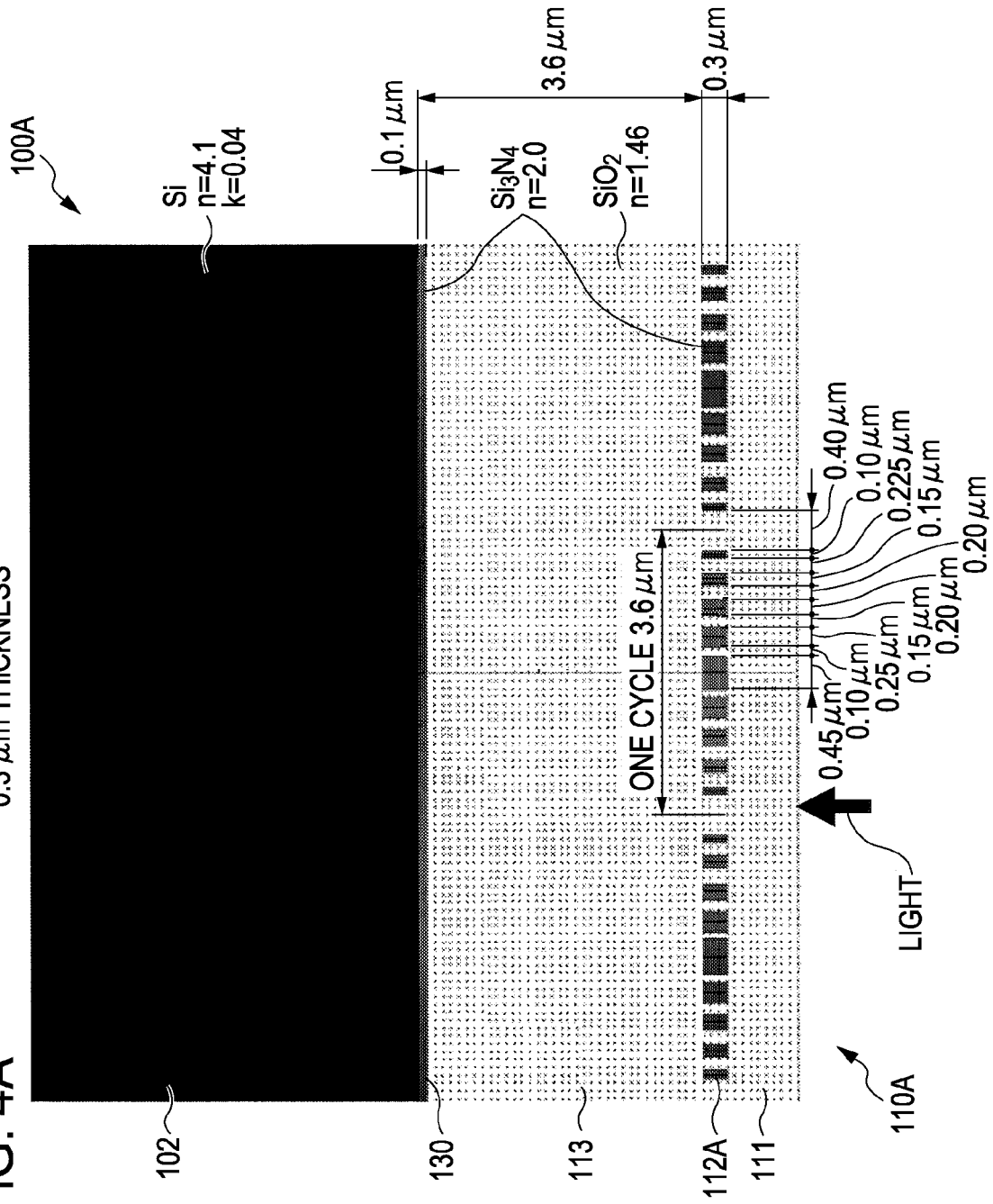

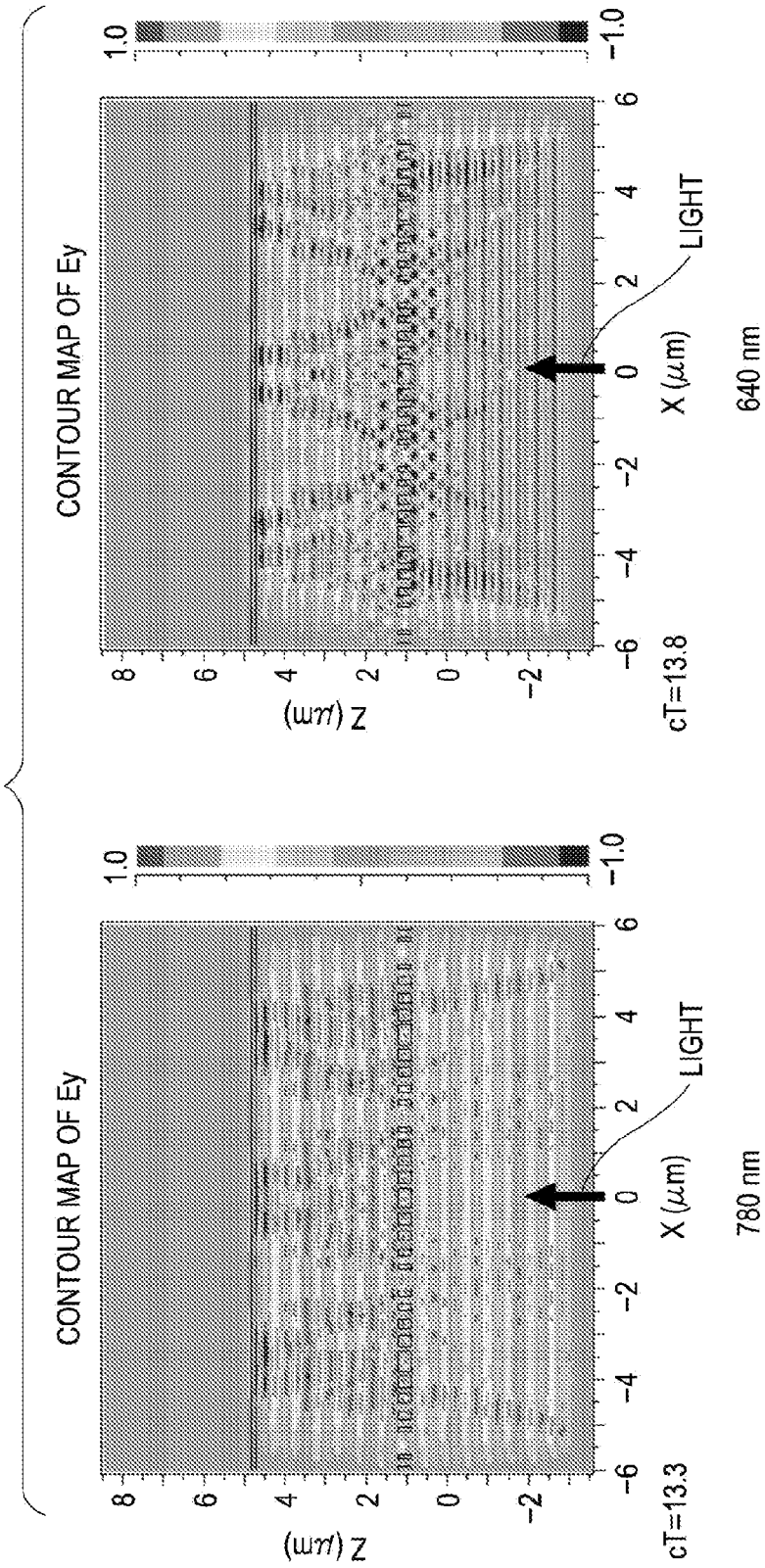

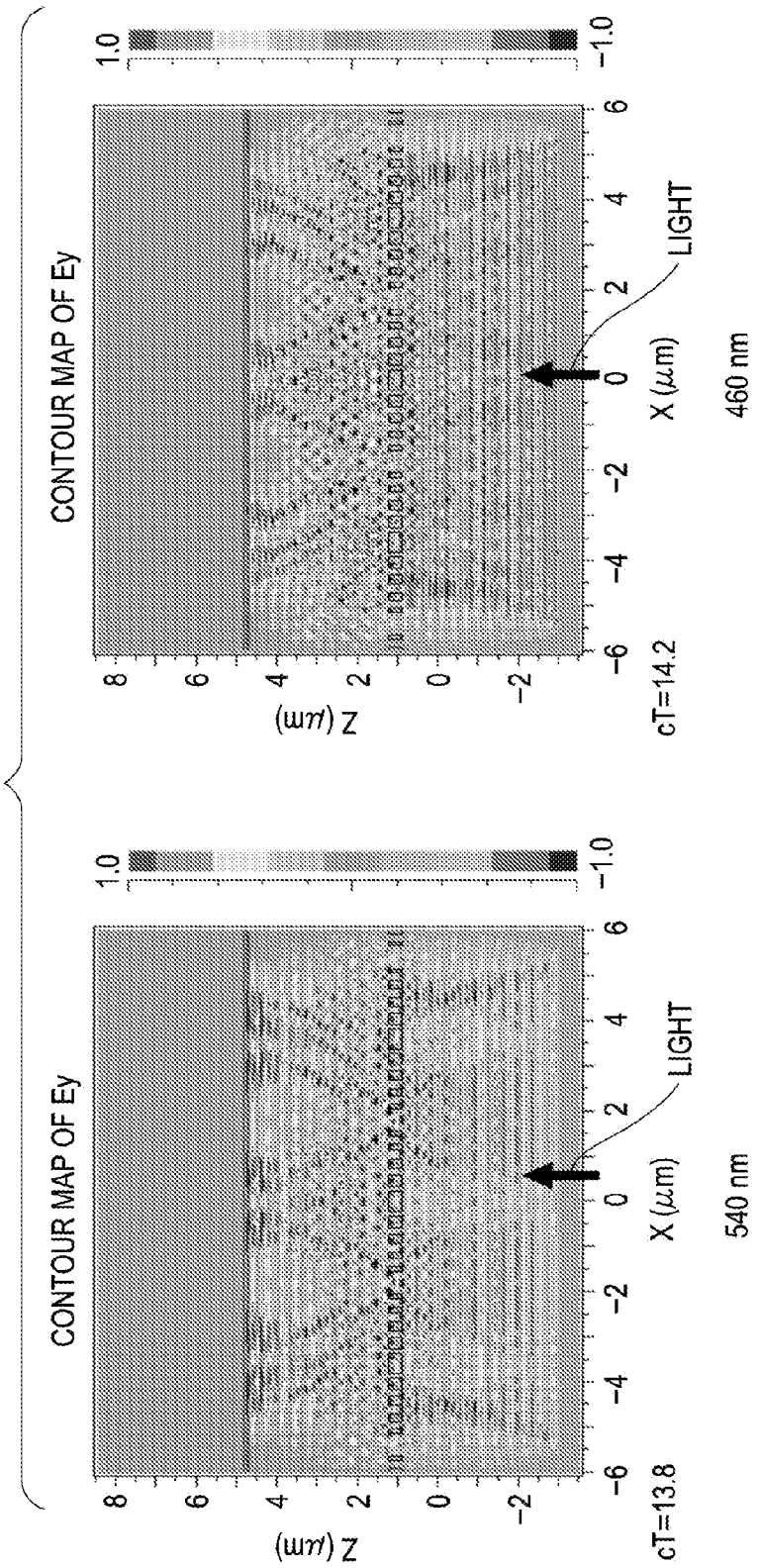

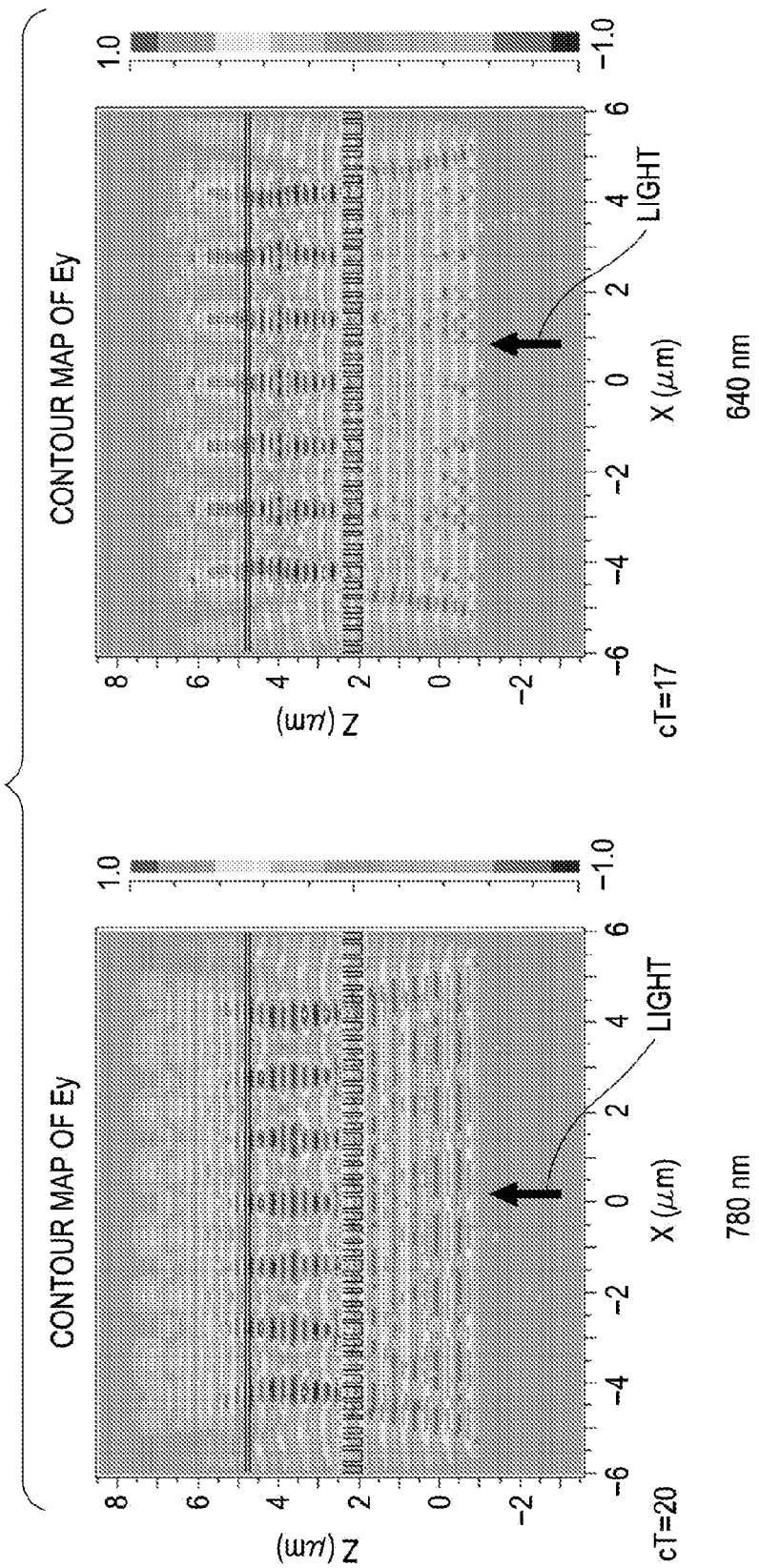

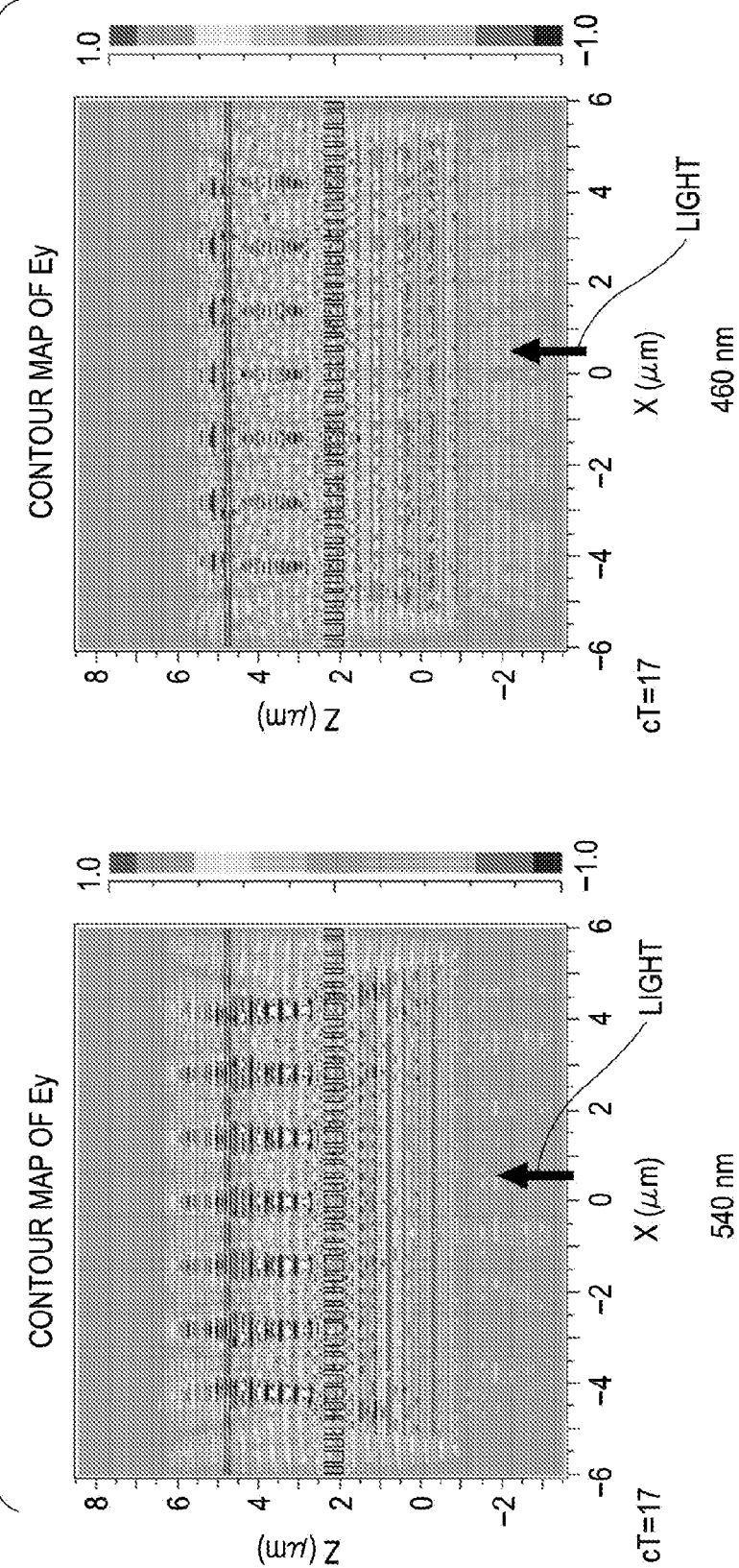

- MANY COLOR MIXTURES

- SENSITIVITY DETERIORATES THAN THEORETICAL SENSITIVITY AS TO LIGHT OF SMALL F VALUE

- CONFIGURATION DEFORMED IN LATERAL DIRECTION CANNOT BE CREATED SINCE SPHERICAL LENS IS FABRICATED BY REFLOW

- SHADING IS CAUSED AT END PORTION OF PIXEL MATRIX UNIT

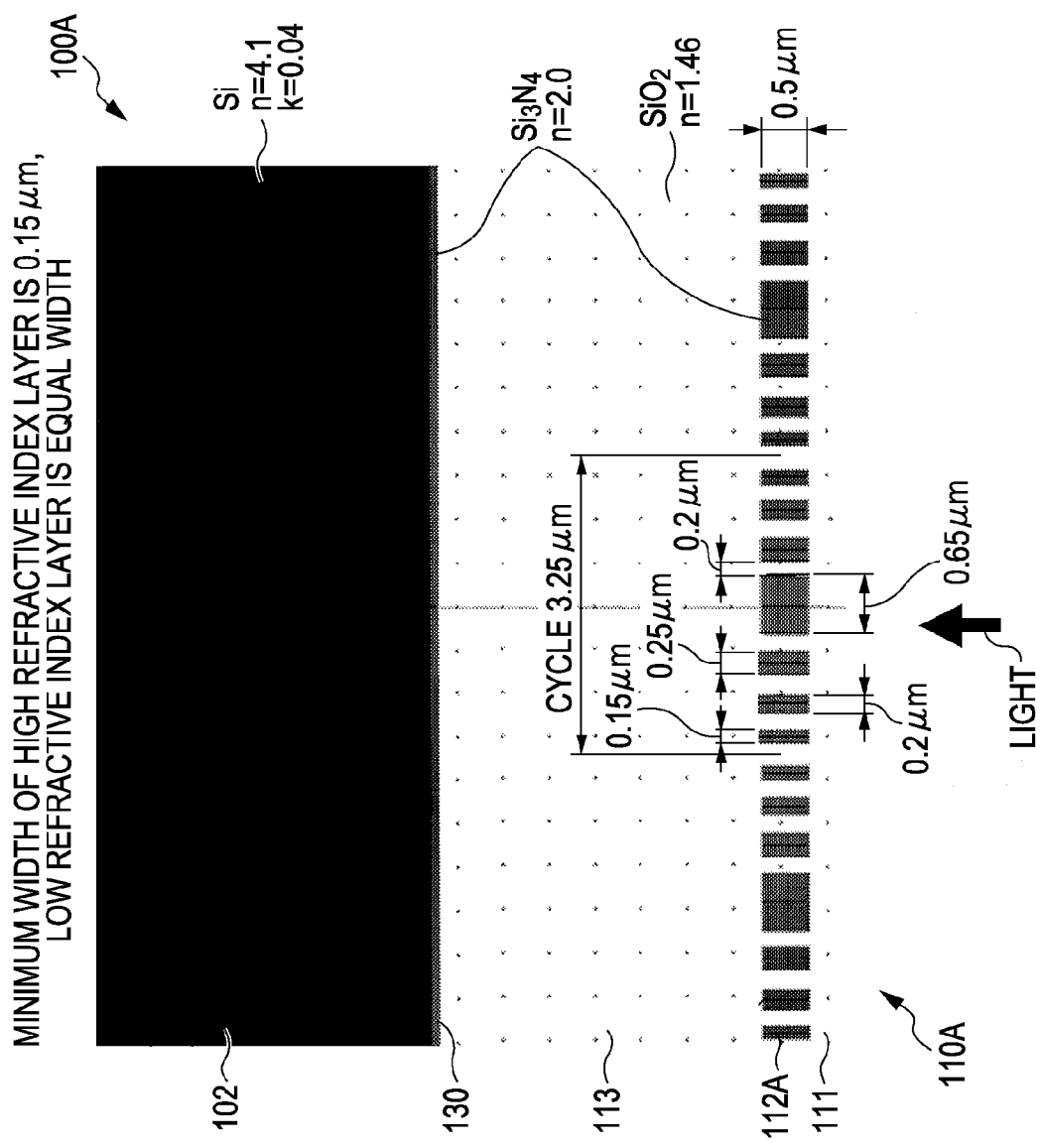

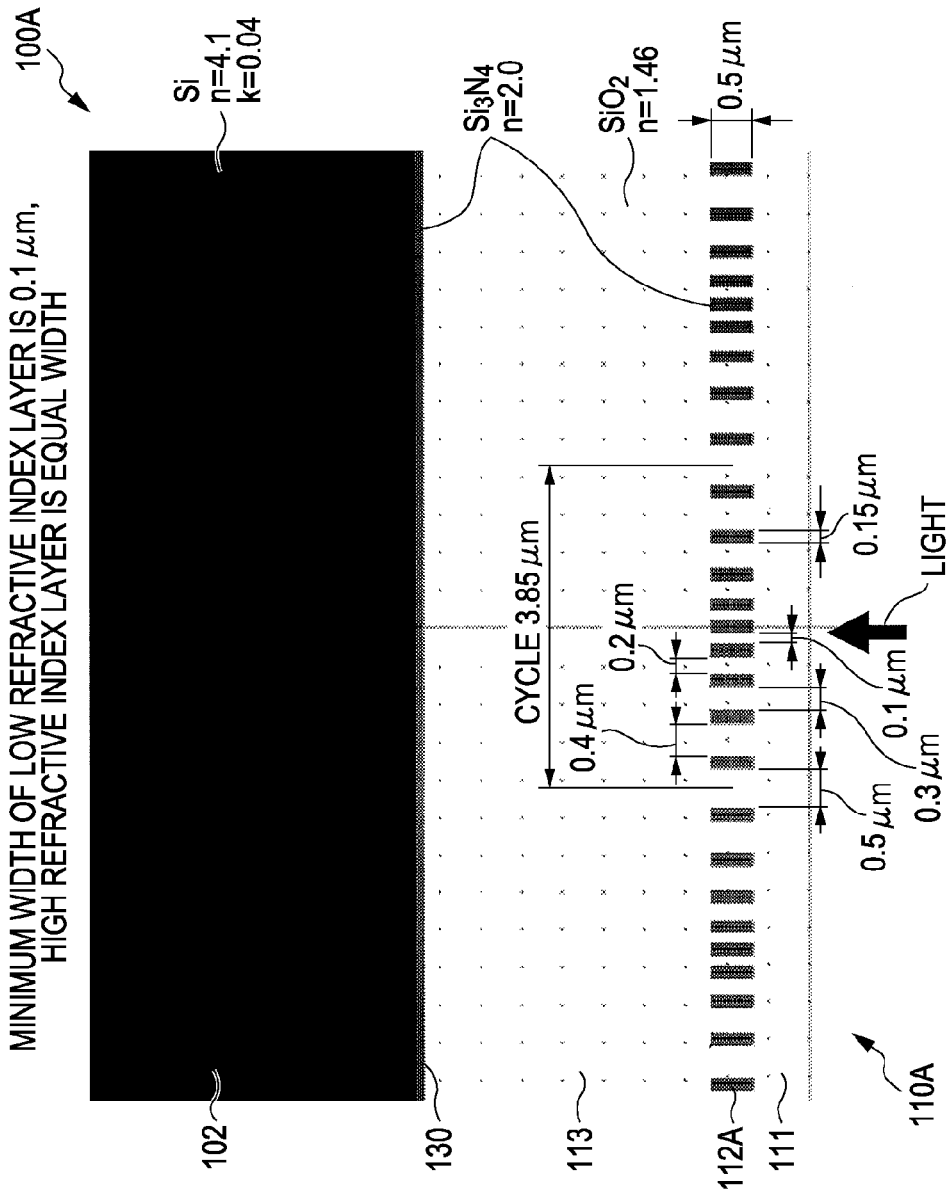

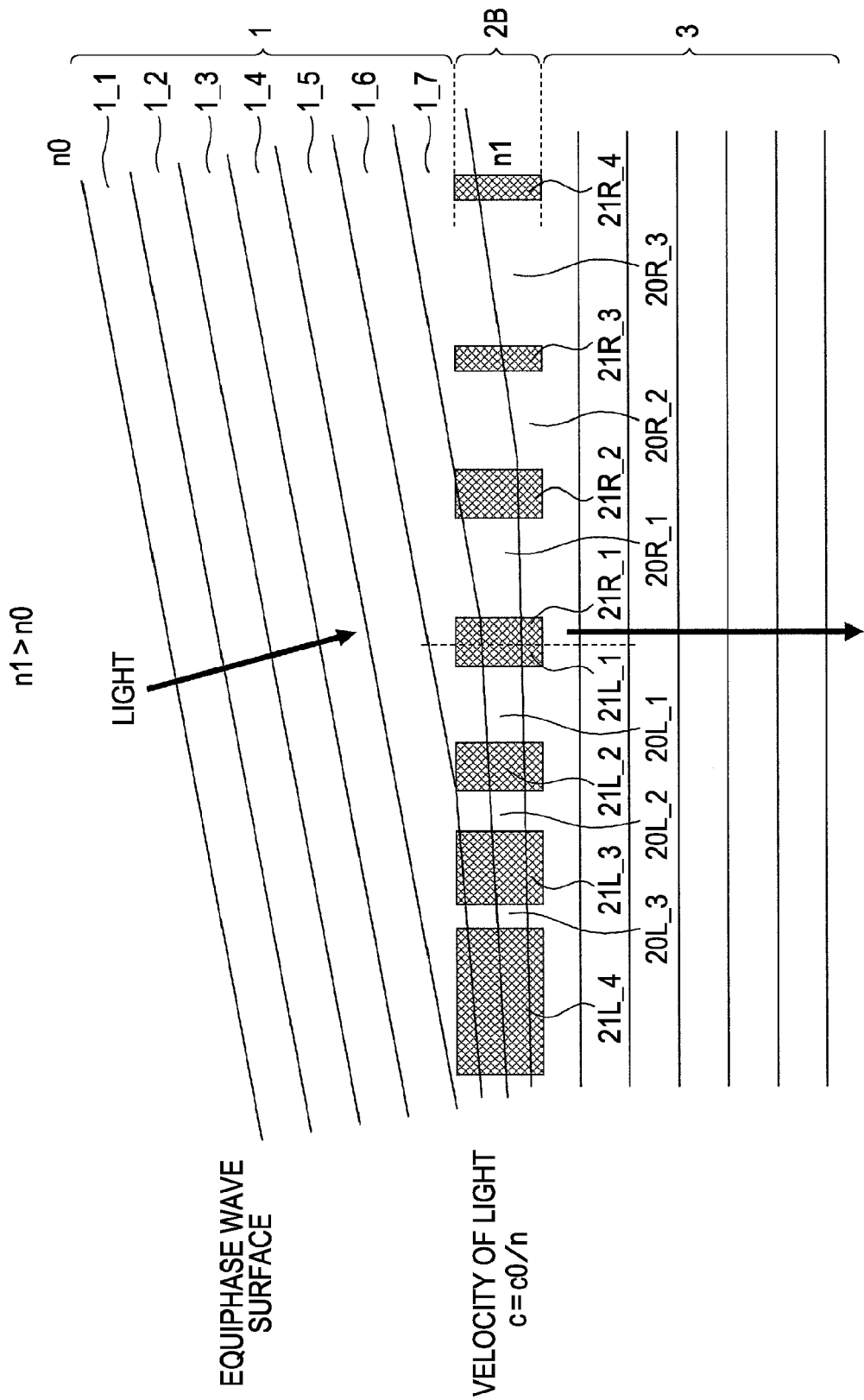

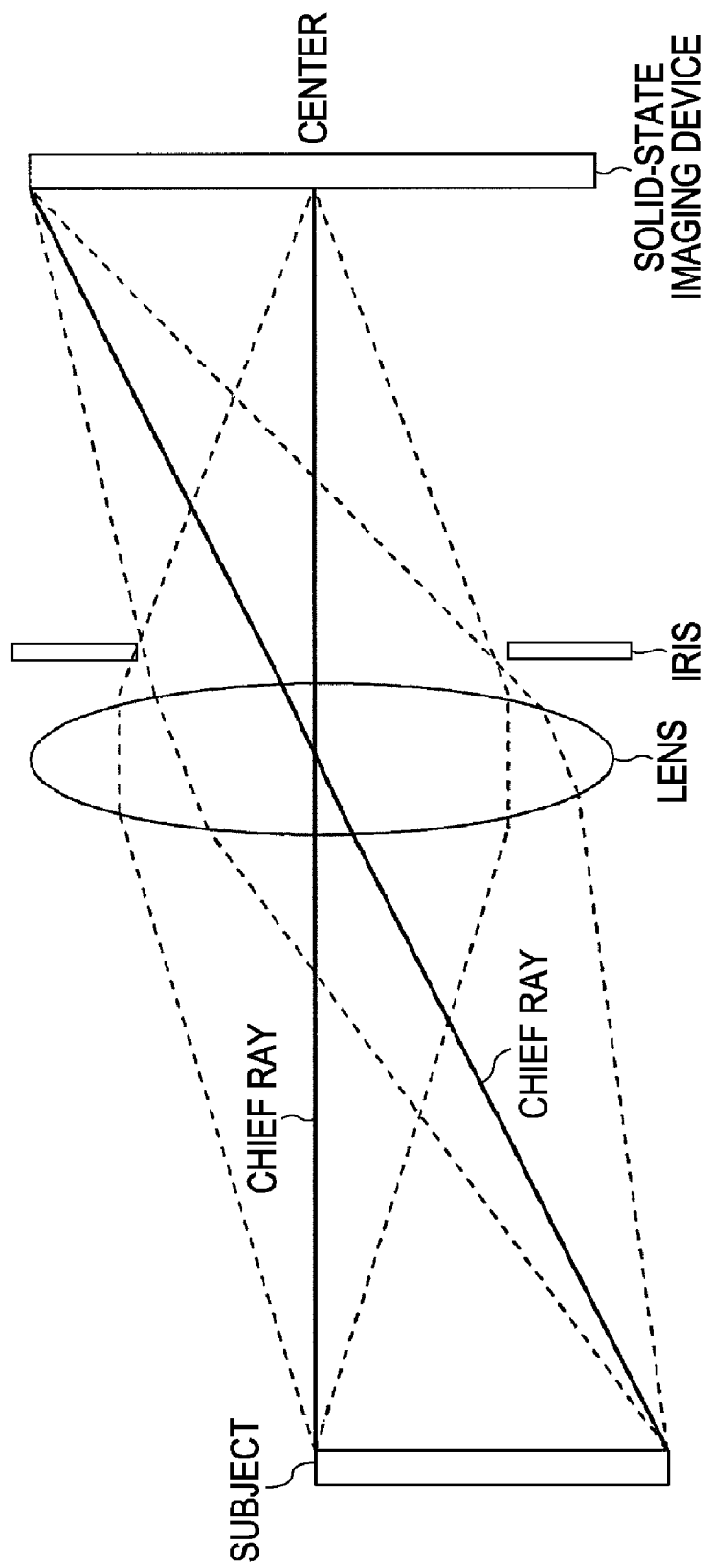

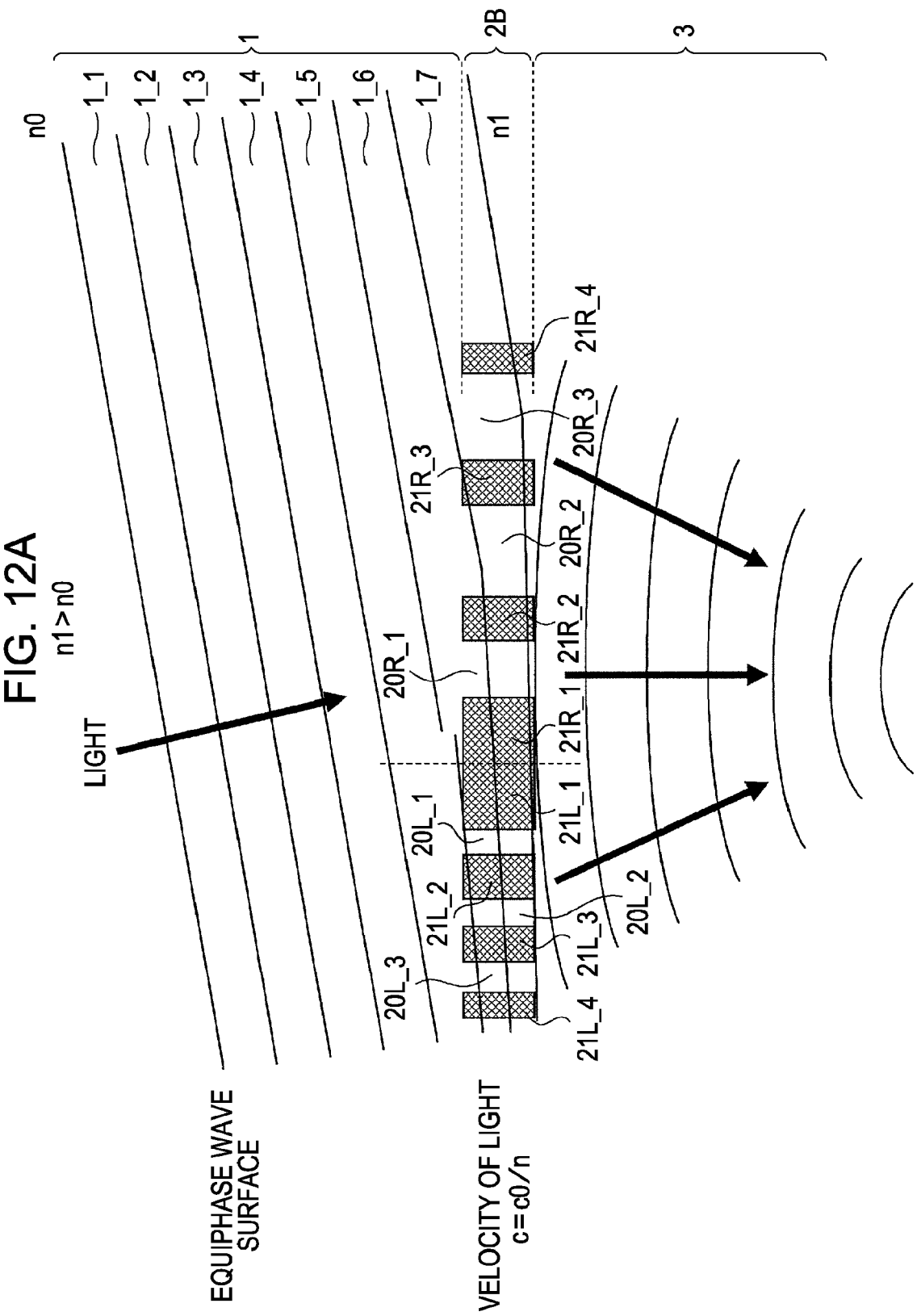

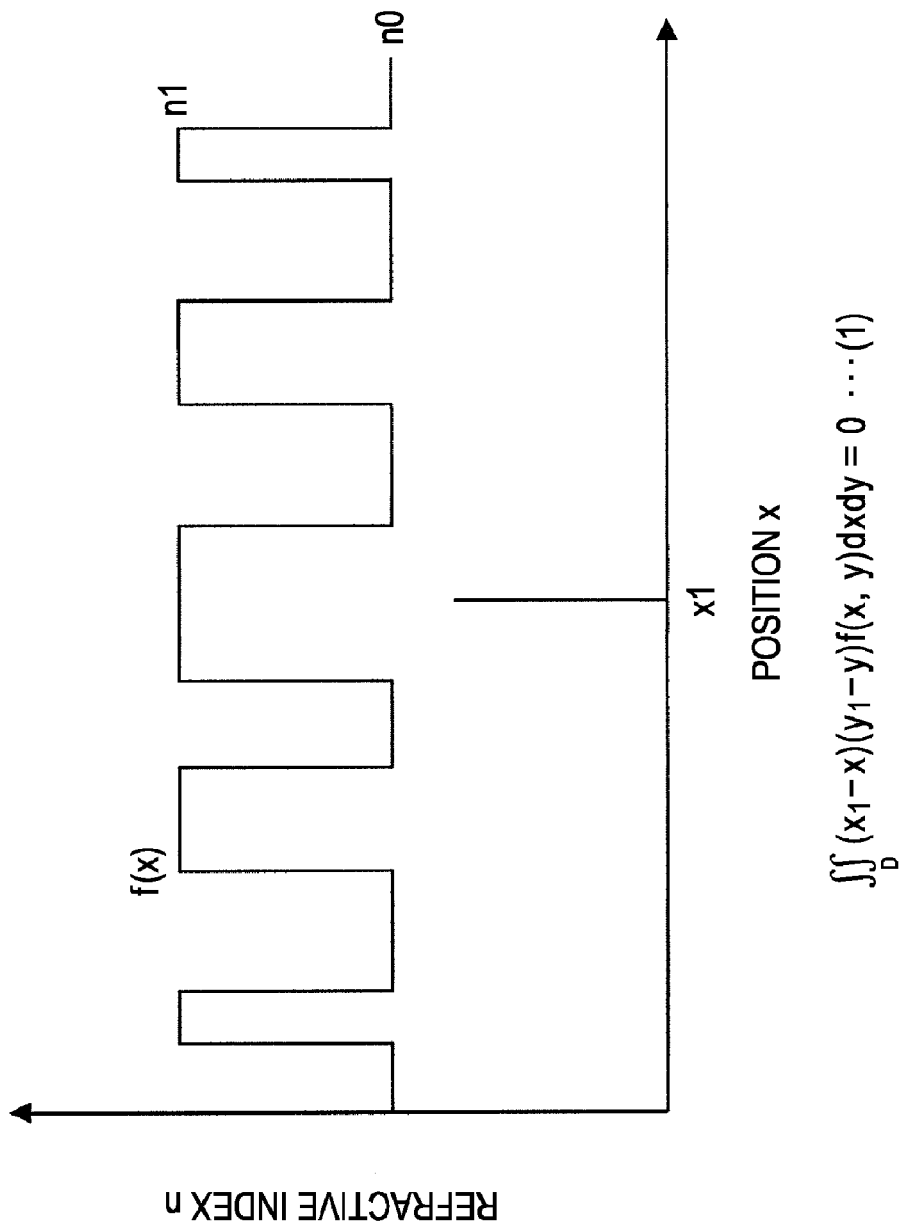

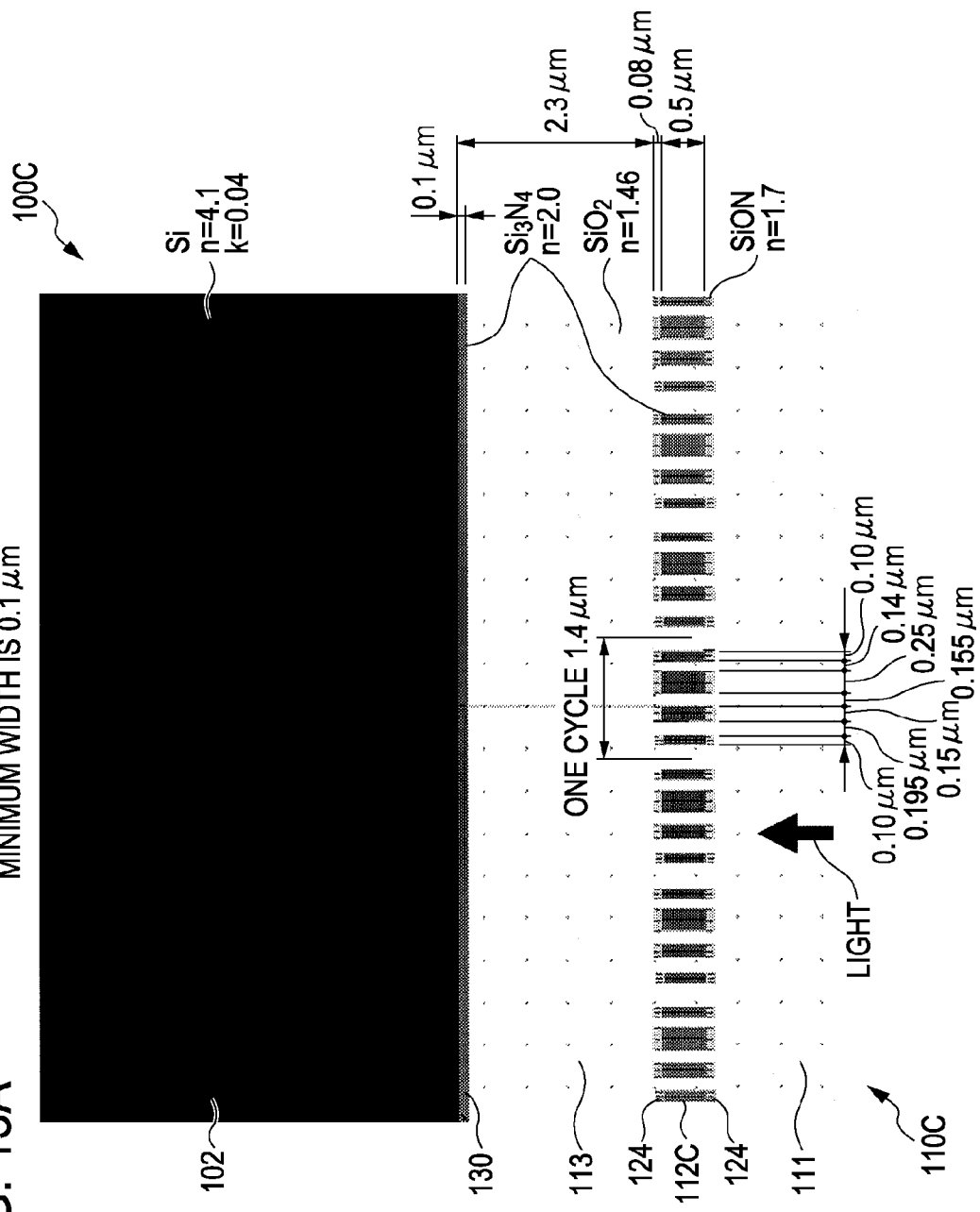

METHOD OF MANUFACTURING AN OPTICAL MEMBER HAVING STACKED HIGH AND LOW REFRACTIVE INDEX LAYERS

RELATED APPLICATION DATA

This application is a continuation of U.S. patent application Ser. No. 12/487,133, filed Jun. 18, 2009, which is a division of U.S. patent application Ser. No. 12/132,042, filed Jun. 3, 2008, the entireties of both of which are incorporated herein by reference to the extent permitted by law. The present application also claims priority to Japanese Patent Application No. JP 2007-148165 filed in the Japanese Patent Office on Jun. 4, 2007, the entirety of which is incorporated by reference herein to the extent permitted by law.

BACKGROUND OF THE INVENTION

The present invention relates to an optical member, and a solid-state imaging device employing this optical member, and a manufacturing method thereof.

With solid-state imaging devices including CCD (Charge Coupled Device) and CMOS (Complementary Metal-oxide Semiconductor) sensors, it is common to provide an optical member such as an on-chip lens (OCL: On Chip Lens, also referred to as a micro lens), inner lens, or the like, and to condense incident light into a light reception portion. Here, as for the optical member, a member having a refracted type lens configuration employing Snell's law is employed.

Note however, with a refracted type lens configuration employing Snell's law, the lens itself is thick, such as around 1 μm or more, so when applying this configuration to the on-chip leans or inner condensing lens of a solid-state imaging device, the device upper layer becomes thick. Thus, undesirable light incidence (referred to as oblique incident light) from adjacent pixels increases, color mixtures due to this oblique incident light increases, and consequently, color reproducibility deteriorates.

Also, existing fabricating processes of on-chip lenses and inner lenses include a great number of processes, such as reflowing resist, and so forth, and are complicated, and are high in costs. In addition, when fabricating such a lens by reflow, only a spherical lens can be fabricated, an asymmetrical lens shape, e.g., deformed in the lateral direction cannot be fabricated.

Further, when reducing the F value of an external image formation system lens, oblique incident light increases, the upper layer becomes thick, so deterioration from ideal sensitivity becomes pronounced, and accordingly, the original sensitivity cannot be obtained (F value light sensitivity deteriorates).

Also, with existing on-chip lenses, condensing efficiency deteriorates depending on an incident angle. That is to say, light entered vertically as to an on-chip lens can be condensed with high efficiency, but condensing efficiency as to oblique incident light decreases. With a solid-state imaging device configured by multiple pixels being arrayed in a two-dimensional manner, in the case of incident light having a spread angle, incident angles differ between a pixel around the center of solid-state imaging device and a pixel on the periphery thereof, and consequently, a phenomenon wherein the condensing efficiency of the pixel on the periphery thereof deteriorates as compared with the pixel around the center thereof, i.e., a phenomenon wherein sensitivity decreases at an end of the device as compared with the center of the device (shading) becomes pronounced.

With regard to deterioration in color reproducibility due to oblique incident light, performing calculation processing for restoring the color reproducibility can be conceived, but may result in a negative effect wherein extra noise is caused, and image quality deteriorates.

Further, when reducing the F value of an external image formation system lens, an F value light sensitivity deterioration phenomenon is caused wherein oblique incident light increases, so the upper layer becomes thick, and deterioration from ideal sensitivity becomes pronounced, and consequently, the original sensitivity cannot be obtained.

On the other hand, as one technique for solving a problem wherein the upper layer becomes thick, and deterioration in sensitivity, an arrangement employing a Fresnel lens has been proposed (e.g., see Japanese Unexamined Patent Application Publication No. 2005-011969 and Japanese Unexamined Patent Application Publication No. 2006-351972).

For example, with the arrangement described in Japanese Unexamined Patent Application Publication No. 2005-011969, an inner condensing lens for further converging light converged on an upper portion lens such as an on-chip lens, and entering this into a photoelectric conversion unit, is configured based on a Fresnel lens. This lens has a feature in that this lens is a refracted type lens, but can be reduced in thickness by being formed as a wave type.

Also, with the arrangement described in Japanese Unexamined Patent Application Publication No. 2006-351972, a condensing element is configured of a combination of multiple zone regions having a concentric configuration which is divided with a line width equal to or smaller than the wavelength of incident light. This has a feature in that the condensing element is configured with a distribution refractive index lens (i.e., Fresnel lens) having a two-step concentric circle configuration as the basis.

Note however, the arrangement described in Japanese Unexamined Patent Application Publication No. 2005-011969 is based on the Fresnel lens concept, and accordingly, this Fresnel lens is a refracted type, so there is limitation in reduction of the thickness thereof as compared with the wavelength order.

Also, in order to fabricate such a wave type requires a process even more complicated than the normal refracted type lens process, further raising costs. Also, only spherical-face lenses can be fabricated, so asymmetry cannot be introduced in designing.

In addition, each arrangement of Japanese Unexamined Patent Application Publication No. 2005-011969 and Japanese Unexamined Patent Application Publication No. 2006-351972 as well, is based on a Fresnel lens, so light obliquely entered in a certain region is not condensed into a point to be condensed originally in some cases (details will be described later). This decreases condensing efficiency, and also causes a color mixture in a case wherein diffused light enters in an adjacent pixel.

SUMMARY OF THE INVENTION

There has been recognized a need to provide a new optical member arrangement. In a case wherein high refractive index layers and low refractive index layers which are relatively thin as compared with an optical length (lens length) are arrayed alternately in the lateral direction of an optical member (an arbitrary direction on a plane perpendicular to the optical axis), when each width of the high refractive index layers and low refractive index layers is sufficiently greater than the wavelength order of incident light, the equiphase wave surfaces of the light passing through the optical member are formed in the same way as the equiphase wave surface of the medium at the incident side, and are not curved.

Note however, when each width of the high refractive index layers and low refractive index layers is equal to or smaller than the wavelength order of incident light, according to continuity of a wave function, a wave surface within a low refractive index layer and a wave surface within a high refractive index layer are linked, and consequently, a phenomenon is caused wherein the overall equiphase wave surfaces are curved.

An optical member according to an embodiment of the present invention is configured based on the above-mentioned observation. That is to say, with an embodiment of an optical member according to the present invention, high refractive index layers having a great refractive index and low refractive index layers having a small refractive index, which are each relatively thin as compared with an optical length, are disposed alternately in the lateral direction as to an optical axis. Here, each width of the high refractive index layers and the low refractive index layers is equal to or smaller than the wavelength order of incident light.

In the event of providing a function as an optical member by arraying the low refractive index layers and high refractive index layers each having a width equal to or smaller than the wavelength order, the curve condition of a equiphase wave surface can be adjusted by adjusting the location relation of each density of the high refractive index layers at the center and end portion of the member.

Thus, if a convex lens function (condensing property) can be provided, a concave lens function (diffusion property) can also be provided. Also, a function for converting oblique incident light into vertical incident light (oblique light correction function) can be provided as well. Consequently, an optical member (optical lens) having a new arrangement can be realized whereby the curve state of an equiphase wave surface (wave surface) can be controlled by adjusting each array width of the low refractive index layers and high refractive index layers.

For example, the high refractive index layers may be each disposed symmetrically so as to be disposed densely at the mechanical center of the member, and disposed non-densely farther away from the center, thereby serving as a convex lens function (condensing property). As viewed from the low refractive index layers, the low refractive index layers are each disposed symmetrically so as to be disposed non-densely at the mechanical center of the member, and disposed densely farther away from the center, thereby serving as a convex lens function (condensing property).

The high refractive index layers are each disposed symmetrically so as to be disposed non-densely at the mechanical center of the member, and disposed densely farther away from the center, thereby serving as a concave lens function (diffusion property). As viewed from the low refractive index layers, the low refractive index layers are each disposed symmetrically so as to be disposed densely at the mechanical center of the member, and disposed non-densely farther away from the center, thereby serving as a concave lens function (diffusion property).

Each width of at least one kind of layer of the high refractive index layers and the low refractive index layers may be disposed asymmetrically in the lateral direction, thereby serving as an oblique light correction function.

Such an optical member can be used as an independent member instead of an existing common optical lens employed for a laser scanning optical system or the like.

Note however, as for a combination with a solid-state imaging device, it is desirable to form the optical member integral with on a semiconductor substrate where a pixel array unit and so forth are formed.

The solid-state imaging device may be configured as a one-chip device, or may be configured as a module having an imaging function wherein an imaging unit and a signal processing unit or optical system are packaged together.

Also, the present invention can be applied to not only a solid-state imaging device but also an imaging device. In this case, as the imaging device, the same advantage as that in the solid-state imaging device can be obtained. Here, the imaging device means, for example, a camera (or camera system) or portable device having an imaging function. Also, the term "imaging" is not restricted to capturing of an image at the time of common camera shooting, but also includes fingerprint detection as a meaning in a broad sense.

According to an embodiment of the present invention, an optical member is configured by arraying high refractive index layers and low refractive index layers, which are equal to or smaller than the wavelength order of incident light, thinner than the lens length, alternately in the lateral direction as to the optical axis, whereby the equiphase wave surfaces can be curved according to the array state of each width of the high refractive index layers and low refractive index layers when the incident light passes through the optical member. Consequently, the optical member exhibits the optical property corresponding to the array state of each width of the high refractive index layers and low refractive index layers (e.g., condensing function, diffusion function, or incident angle conversion function).

Thus, as for the optical member where the high refractive index layers and low refractive index layers are arrayed alternately in the lateral direction, a member shorter and thinner than the optical length can be employed, and a thin member can be employed as compared with a member having a refracted type lens configuration employing the existing Snell's law. Consequently, problems caused in a lens having a relatively thick configuration, such as an existing lens, can be alleviated or eliminated.

For example, the upper layer of an imaging device is thinned, and color mixtures decrease, thereby improving color reproducibility. There is no need to provide measures for color mixtures due to calculation processing, thereby reducing extra noise occurrence. Also, deterioration in F value light sensitivity can be prevented, and oblique incident light can be corrected to vertical incident light, thereby providing measures for shading.

Also, the member is configured by the thin low refractive index layers and thin high refractive index layers being arrayed alternately, thereby providing no step having a great refractive index such as a Fresnel lens, and reducing diffusing light due to refraction or reflection as to oblique incident light. Consequently, condensing efficiency can be improved, and a problem of color mixtures due to oblique incident light can also be solved.

Simply arraying the thin low refractive index layers and thin high refractive index layers alternately in the lateral direction enables manufacturing in accordance with semiconductor processes, and cost can be suppressed low with a simple fabrication process.

The optical property can be controlled by adjusting each array width of the low refractive index layers and high refractive index layers, and accordingly, there is provided an advantage wherein the width of designing can optically spread as compared with a spherical lens.

BRIEF DESCRIPTION OF THE DRAWINGS

FIG. 1A is a diagram (Part 1) illustrating equiphase wave surfaces for describing the basic principle of an optical lens according to a first embodiment;

FIG. 1B is a diagram (Part 2) illustrating equiphase wave surfaces for describing the basic principle of the optical lens according to the first embodiment;

FIG. 2E is a diagram illustrating the simulation result of the first embodiment (application example 1) ($\lambda$=540, 480 nm);

FIG. 3A is a cross-sectional schematic view for describing a second example (application example 2) of the solid-state imaging device to which the optical lens according to the first embodiment is applied;

FIG. 3B is a diagram illustrating the simulation result of the first embodiment (application example 2) ($\lambda$=780, 640 nm);

FIG. 3C is a diagram illustrating the simulation result of the first embodiment (application example 2) ($\lambda$=540, 480 nm);

FIG. 4A is a cross-sectional schematic view for describing a third example (application example 3) of the solid-state imaging device to which the optical lens according to the first embodiment is applied;

FIG. 4B is a diagram illustrating the simulation result of the first embodiment (application example 3) ($\lambda$=780, 640 nm);

FIG. 4C is a diagram illustrating the simulation result of the first embodiment (application example 3) ($\lambda$=540, 480 nm);

FIG. 5C is a diagram illustrating the simulation result of the first embodiment (application example 4) ($\lambda$=780, 640 nm);

FIG. 5D is a diagram illustrating the simulation result of the first embodiment (application example 4) ($\lambda$=540, 480 nm);

FIG. 7A is a cross-sectional schematic view for describing a solid-state imaging device according to modification 1 to which modification 1 of the optical lens according to the first embodiment is applied;

FIG. 8A is a cross-sectional schematic view for describing a solid-state imaging device according to modification 2 to which modification 2 of the optical lens according to the first embodiment is applied;

FIG. 10A is a diagram illustrating equiphase wave surfaces for describing the basic principle of an optical lens according to a second embodiment;

FIG. 10B is a diagram for describing a light reception optical system of a solid-state imaging device;

FIG. 12A is a diagram illustrating equiphase wave surfaces for describing the basic principle of an optical lens according to a third embodiment;

FIG. 12B is a diagram for describing the center of gravity of a lens;

FIG. 13A is a cross-sectional schematic view for describing a first example (application example 1) of the solid-state imaging device to which the optical lens according to the third embodiment is applied;

DESCRIPTION OF THE PRESENTLY PREFERRED EMBODIMENTS

Description will be made below regarding embodiments of the present invention with reference to the drawings.
<First Embodiment: Fundamentals of Convex Lens>

Figure 1D:
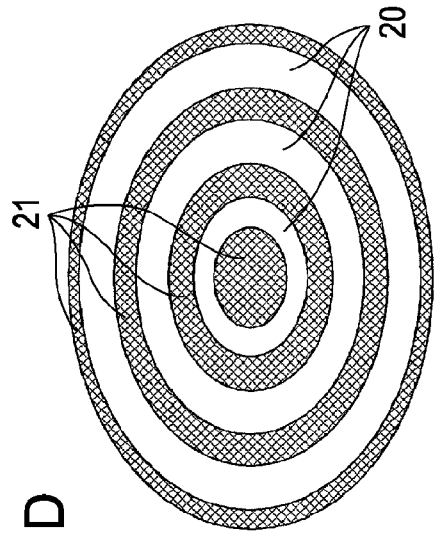
FIGS. 1C through 1F are plan schematic views of the optical lens according to the first embodiment.

FIGS. 1A through 1F are diagrams for describing the basic principle of a first embodiment of an optical lens. Here, FIGS. 1A and 1B are diagrams illustrating equiphase wave surfaces, and FIGS. 1C through 1F are plan schematic views of the optical lens according to the first embodiment.

Each optical lens of the present embodiment including later-described other embodiments includes a lens function basically by arraying rectangular layers having a great refractive index and rectangular layers having a small refractive index alternately in the lateral direction as to the optical axis, and each width thereof being configured so as to be equal to or smaller than the wavelength order.

For example, "the configuration of width equal to or smaller than the wavelength order" can be formed by employing the arrangement of a condensing element having a subwave length periodical structure (SWLL: Subwave Length Lens) formed by using planar process technology represented by optical lithography and electron lithography.

An SWLL is employed as a condensing element for a solid-state imaging device, whereby an on-chip lens can be formed with a common semiconductor process, and the shape of the lens can be control without limitation.

Here, the first embodiment relates to a convex lens having a condensing effect. Accordingly, high refractive index layers are configured symmetrically in a plate shape so as to be disposed densely at the center (mechanical center of the lens: identical to the optical axis in the present example), and disposed non-densely farther away from the center. From the aspect of layers having a small refractive index, low refractive index layers are configured symmetrically so as to be disposed non-densely at the mechanical center of the member, and disposed more densely away from the center. The first embodiment differs from later-described second and third embodiments in that the lens is symmetrical (has a symmetrical configuration).

In order to provide a convex lens function by employing a configuration wherein density increases toward the center and decreases farther away from the center, for example, it is desirable to employ one of a first convex lens proving method wherein the widths of high refractive index layers increase gradually toward the center of a lens, a second convex lens providing method wherein widths of low refractive index layers decrease gradually toward the center of a lens, and a third convex lens providing method wherein the first convex lens providing method and second convex lens providing method are employed together. From the perspective of condensing efficiency, it is most effective to employ the third convex lens providing method.

First, as shown in FIG. 1A, let us say that a plate-shaped single material layer 1 having a refractive index n0 alone exists, and adjacent thereto (specifically, equiphase wave surface 1_4 side) a plate-shaped layer (referred to as an alternate placement layer) 2A is provided wherein rectangular layers (referred to as low refractive index layers) 20 having the refractive index n0, and rectangular layers (referred to as high refractive index layers) 21 having a refractive index n1 (wherein n1>n0), which is higher (greater) than the refractive index n0, are arrayed alternately in the lateral direction. Let us say that a plate-shaped single material layer 3 having the refractive index n0 alone is provided further backward the alternate placement layer 2A. Though details will be described later, the alternate placement layer 2A serves as an optical lens (convex lens) having condensing efficiency.

With the alternate placement layer 2A, the components on the right side of the optical center CL are denoted with "R", and the components on the left side thereof are denoted with "L". When there is no need to distinguish the right side and left side, description will be made by omitting "R" and "L". These are the same as those in later-described other examples.

With the configuration of the basic example of the first embodiment shown in the drawing, five rectangular high refractive index layers 21 having a great refractive index are provided symmetrically as to the center CL, and four low refractive index layers 20 having a small refractive index are provided therebetween. The widths of the high refractive index layers 21R_1 through 21R_5, and 21L_1 through 21L_5 are configured so as to increase gradually toward the center CL, and the widths of the low refractive index layers 20R_1 through 20R_4, and 20L_1 through 20L_4 are configured so as to decrease gradually toward the center CL. That is to say, with the basic example of the first embodiment, the third convex lens providing method wherein the first and second convex lens providing methods are employed together is employed.

As a whole, the alternate placement layer 2A has a configuration wherein the high refractive index layers 21R_k and 21L_k (k=1 through 5 in the present example) having a great refractive index are disposed in a plate shape, disposed densely at the center, and disposed non-densely farther away from the center. When focusing on the high refractive index layers 21, the widths thereof are wide at the center of the lens, and are narrow in the vicinity.

Now, as shown in FIG. 1A, let us say that light enters from the single material layer 1 side having the refractive index n0. At this time, velocity of light c is obtained by c=c0/n1. Here, c0 is velocity of light in vacuo. Accordingly, with each of the high refractive index layers 21 of the plate-shaped alternate placement layer 2A, it can be conceived that velocity of light decreases therein, and consequently, as shown in FIG. 1A, the same equiphase wave surface (wave surface) as the single material layer 1 is formed. Note however, when the lengths (i.e., widths) in the lateral direction of the high refractive index layers 21 having the high refractive index n1 and the low refractive index layers 20 having a small refractive index adjacent thereto are greater than the wave length order.

On the other hand, in a case wherein the lengths (widths) in the lateral direction of the high refractive index layers 21 having the high refractive index n1 and the low refractive index layers 20 having a small refractive index adjacent thereto are equal to or smaller than the wave length order, the same equiphase wave surface (wave surface) as the single material layer 1 is not formed, and the wave surface are curved depending on how the widths of the high refractive index layers 21 and the low refractive index layers 20 adjacent thereto are arrayed.

Specifically, according to the continuity of a wave function, a wave surface within the low refractive index layer 20_j and a wave surface within the high refractive index layer 21_k are linked consecutively, and consequently, all of the equiphase wave surfaces are curved. As shown in FIG. 1A, in a case wherein the high refractive index layer 21_k having a great refractive index is configured in a plate shape so as to be disposed densely at the center, and disposed non-densely farther away from the center, the equiphase wave surfaces become those shown in FIGS. 1C through 1F. The cause of this is that the velocity of light at the places having a great refractive index (high refractive index layers 21) differs from that at the places having a small refractive index (low refractive index layers 20).

As can be understood from the drawing, the wave surface of the light become a recessed surface according to the alternate placement layer 2A, and this passes through the single material layer 3 having the refractive index n0 alone disposed in the backward thereof. Consequently, as shown in the drawing, a function is activated wherein the route of the incident light is converted into the center side at the left and right sides with the lens center as the boundary thereof, whereby condensing property can be provided. A convex lens effect can be received by combining the difference between the velocity of light of the high refractive index layers 21 having a great refractive index and the velocity of light of the low refractive index layers 20 having a small refractive index, and continuity of the wave function.

As can be understood from the above description, the optical lens according to the first embodiment can serve as a convex lens having condensing property by arraying the high refractive index layer 21_k having a great refractive index and the high refractive index layer 20_j having a small refractive index alternately in the lateral direction in a rectangular shape with the widths thereof being configured so as to be equal or smaller than the wavelength order, and at this time, providing a configuration wherein the high refractive index layer 21_k having a great refractive index is disposed densely at the center, and disposed non-densely farther away from the center.

The wave surface is curved depending on how the widths of the high refractive index layers 21 having the high refractive index n1, and the low refractive index layers 20 having a low refractive index are arrayed, so the curve level of the wave surface of light can be controlled by adjusting how to array each of the widths, and consequently, the condensing property of the convex lens can be controlled. That is to say, it can be conceived that the alternate placement layer 2A according to the first embodiment is a condensing lens (i.e., convex lens) employing the wave surface control arrangement.

As can be understood from the configurations shown in FIG. 1B, the lens thickness thereof is the thickness of the alternate placement layer 2A wherein the high refractive index layer 21_k having a great refractive index and the rectangular low refractive index layer 20_j having a small refractive index are arrayed alternately in the lateral direction, whereby an extremely thin convex lens can be obtained. For example, with the refractive type lens configuration employing the existing Snell's law, the lens thickness is equal to or greater than 1 μm, but the thickness of the lens can be reduced to be equal to or smaller than 0.5 μm by employing the optical lens according to the arrangement of the present embodiment.

If the lens thickness can be thinned, in the case of applying this lens to a solid-state imaging device, the upper layer becomes thin, whereby color mixtures decreases, and accordingly, color reproducibility improves. Also, color mixtures decreases, so there is no need to provide calculation processing for restoring color reproducibility, and extra noise occurrence due to the calculation processing also decreases. Also the lens thickness is thin, so even in a case wherein the F value of an external image formation system lens is reduced, oblique incident light does not increase, a problem of deterioration in F value light sensitivity is not caused.

It goes without saying that with a plan configuration as well, the alternate placement layer 2A needs to have a configuration wherein the density is high at the center and becomes low farther away from the center, and only in this case, various plan configurations can be employed. As for each shape of the high refractive index layer 21_k having a great refractive index and the low refractive index layer 20_j having a small refractive index, any arbitrary shape can be employed, such as a circle, ellipse, regular square, rectangle, triangle, or the like. Subsequently, of these, a shape can be regarded as the same is converted into a circular shape, or different shapes are combined and converted into a circular shape such that the widths of each ring are the same vertically and horizontally.

Figure 1F:
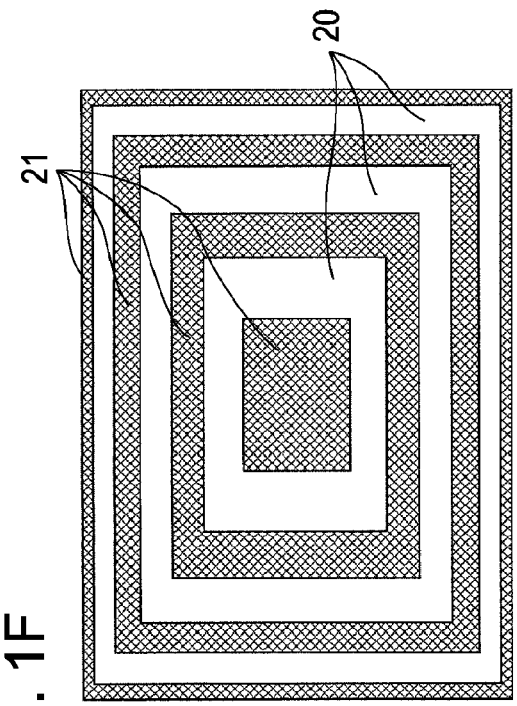
Figure 1C:
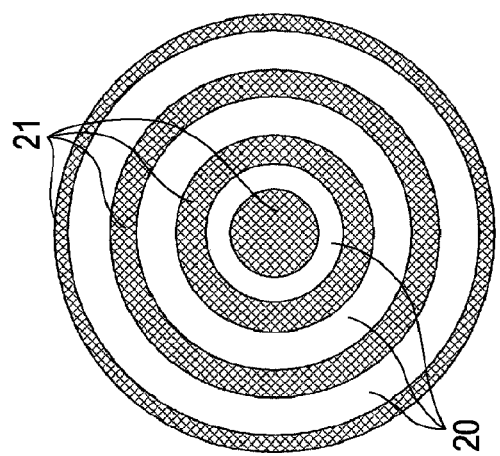
Figure 1E:
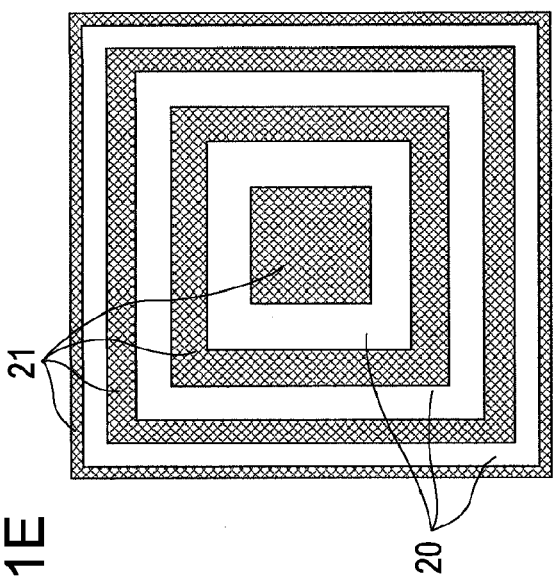

For example, as shown in FIG. 1C, the high refractive index layer 21_k and low refractive index layer 20_j may be each circles or circular ring shapes, each closing on itself. As shown in FIG. 1D, the high refractive index layer 21_k and low refractive index layer 20_j may be each ellipses or elliptic ring shapes, each closing on itself. As shown in FIG. 1E, the high refractive index layer 21_k and low refractive index layer 20_j may be each regular squares or square ring shapes, each closing on itself. As shown in FIG. 1F, the high refractive index layer 21_k and low refractive index layer 20_j may be each rectangles or rectangular ring shapes, each closing on itself.

Though not shown in the drawing, the high refractive index layer 21_k and low refractive index layer 20_j may be each triangles or triangular ring shapes, each closing on itself. Also, though not shown in the drawing, for example, an arrangement may be made wherein different shapes are employed at the center and at the outer circumference, such that circles or circular ring shapes are employed at the center, and rectangular ring shapes are employed at the outer circumference, and these are combined, thereby each closing on itself.

Note however, the condensing effect as a convex lens is influenced by the plan configuration of the alternate placement layer 2A, i.e., the plan configuration of how the high refractive index layers 21 and low refractive index layers 20 are arrayed, so in the case of applying the above-mentioned shapes to a solid-state imaging device, it is desirable that the plan configuration exemplified in FIGS. 1C through 1F, particularly the shape of the high refractive index layer 211 at the center portion is matched to the plan shape of the light reception portion.

<First Embodiment: Application Example 1 of Convex Lens>

Figure 2A:
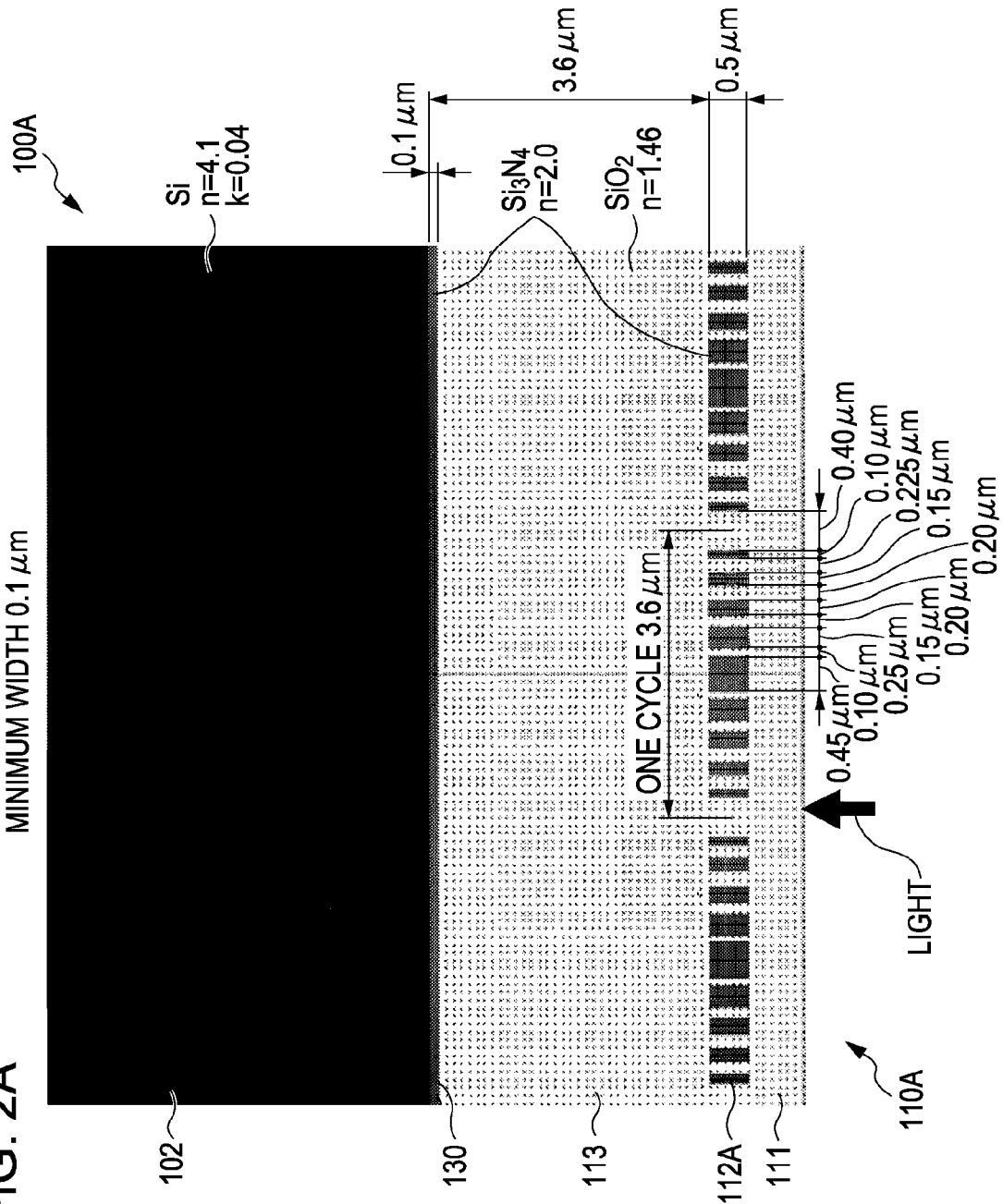
FIG. 2A is a cross-sectional schematic view for describing a first example (application example 1) of a solid-state imaging device to which the optical lens according to the first embodiment is applied.
Figure 2B:
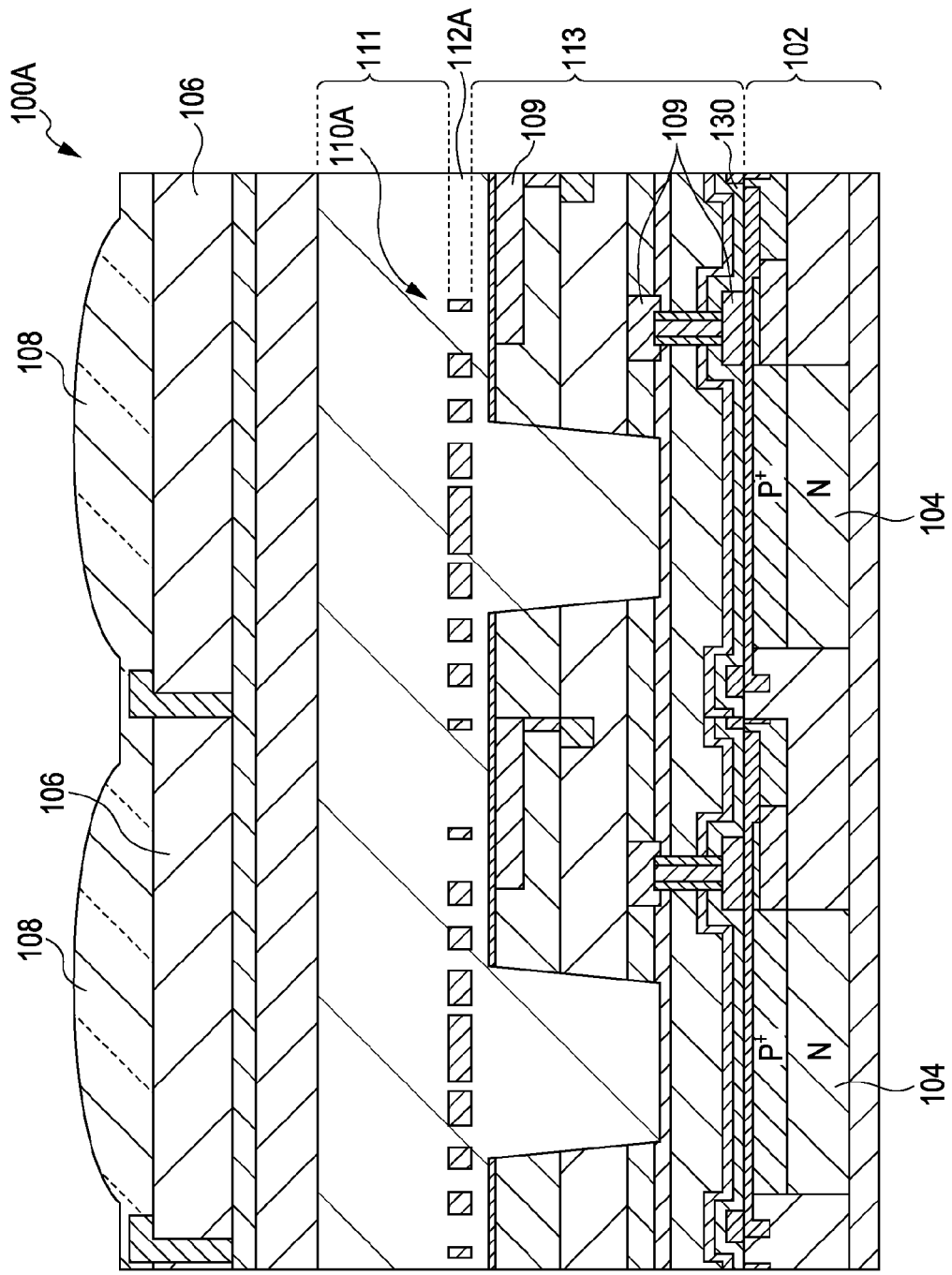
FIG. 2B is a more specific cross-sectional view of the solid-state imaging device according to the first embodiment (application example 1)
Figure 2C:
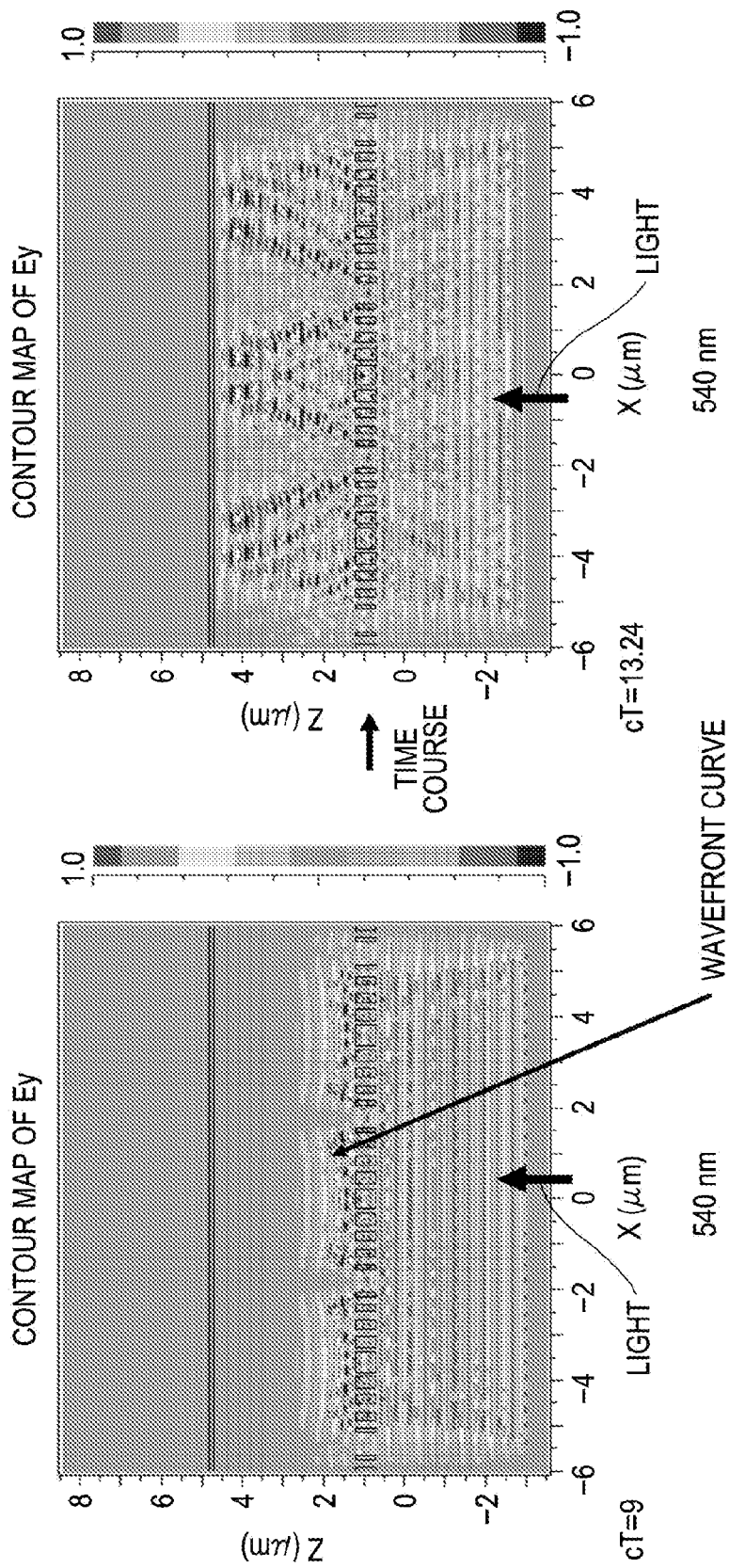
FIG. 2C is a diagram (in the middle of the process) illustrating the simulation result of the first embodiment (application example 1)
Figure 2D:
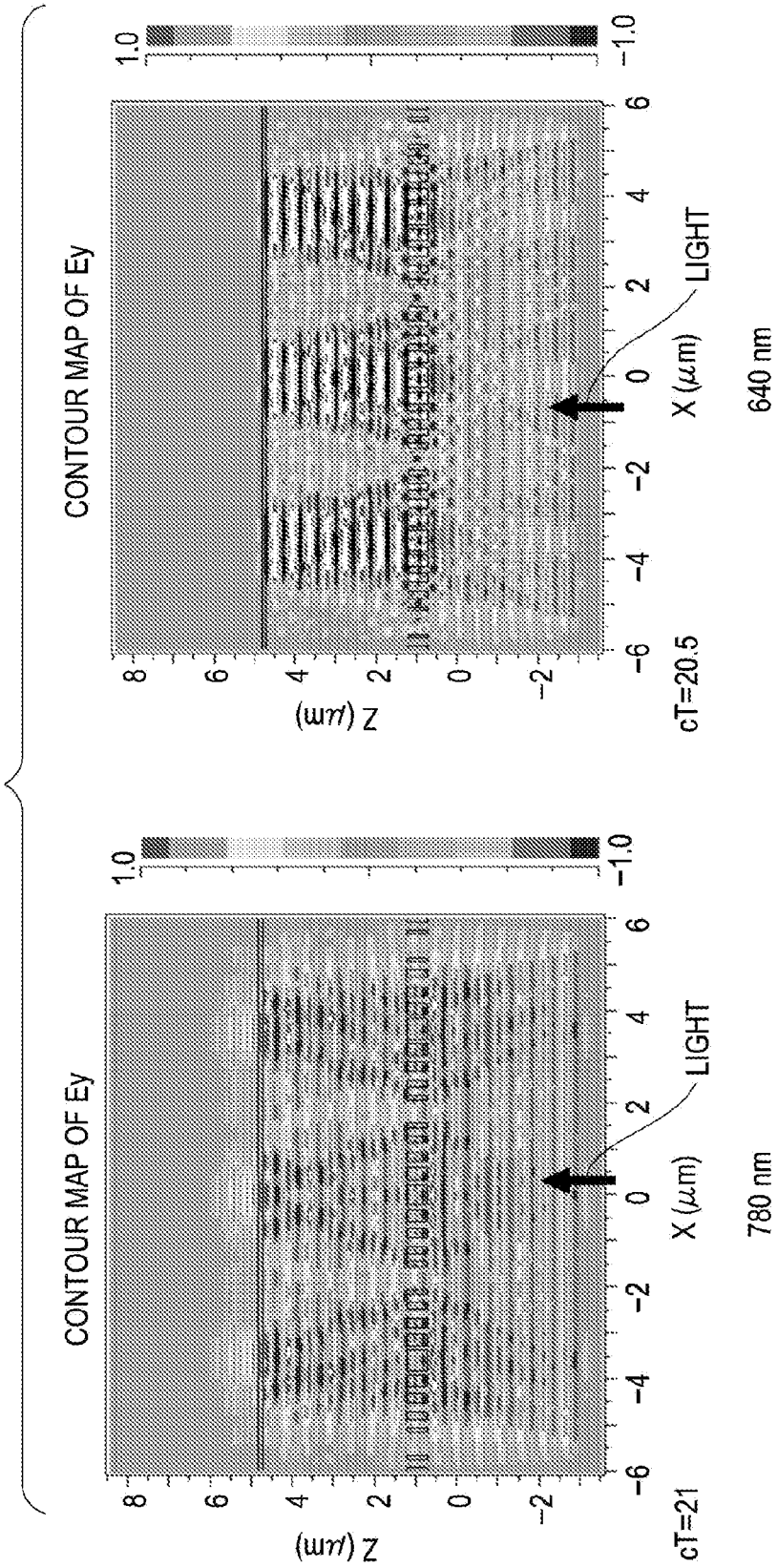
FIG. 2D is a diagram illustrating the simulation result of the first embodiment (application example 1) ($\lambda$=780, 640 nm)

FIGS. 2A through 2E are diagrams for describing a first example (application example 1) of the solid-state imagining device to which the optical lens according to the first embodiment is applied. Here, FIG. 2A is the cross-sectional schematic view of the solid-state imaging device according to application example 1, FIG. 2B is a more specific cross-sectional view of the solid-state imaging device according to the first embodiment (application example 1), and FIGS. 2C through 2E are diagrams illustrating the simulation results of the optical property thereof.

A solid-state imaging device 100A according to the first embodiment (application example 1) includes a thin-film layer 130 (thickness=0.1 μm) made up of silicon nitride Si3N4 (hereafter, referred to as SiN) with a refractive index n1 of 2.0 on a semiconductor substrate (hereafter, also referred to as a silicon substrate) 102 made up of silicon Si with a refractive index n3 of 4.1 and an extinction coefficient (coefficient related to absorption of light) k of 0.04, and on the upper layer thereof includes an optical lens 110A having the configuration (alternate placement layer 112A) described with reference to FIGS. 1A through 1F as the principal portion.

The thin-film layer 130 is provided as an antireflection film as to the silicon substrate 102. Thus, light can be entered in the light reception portion, such as a photodiode, effectively. For example, if we say that the refractive indexes of the silicon Si, silicon nitride SiN, and silicon oxide SiO2 are n_Si, n_SiN, and n_SiO2, respectively, a relation n_Si>n_SiN>n_SiO2 holds. In this case, the thickness d of the thin-film layer 130 has a relation of $d \neq \lambda \times (m/2 + 1/4)/n\_SiN$, so an antireflection film function can be performed effectively. Here, λ is the wavelength of light, and m is an integer equal to or greater than 0.

As shown in FIG. 2B, photoelectric conversion units (light reception portions) 104 made up of PN junction are disposed with a predetermined pixel pitch on the boundary neighborhood (substrate surface) at the optical lens 110A side of the silicon substrate 102. The solid-state imaging device 100A includes a pixel array unit formed by regularly arraying the multiple (e.g., several millions) photoelectric conversion units 104 vertically and horizontally or in an oblique direction.

A color filter 106 and on-chip lens 108 are provided on the upper layer at the light incident face of the optical lens 110A as necessary. The on-chip lens 108 is a lens having a refracted type lens configuration employing Snell's law.

With the example shown in FIG. 2B, an example is illustrated wherein the on-chip lens 108 is employed as an upper layer lens (surface lens), and the alternate placement layer 112A of the optical lens 110A is employed as an inner condensing lens, but the on-chip lens 108 can also be replaced with the alternate placement layer 112A. In this case, the alternate placement layer 112A is not embedded within the device upper layer, but is disposed on the uppermost layer of the device as a lens configuration, and the surface thereof is in contact with the air.

The on-chip lens 108 is a lens having a refracted type lens configuration employing Snell's law, the lens itself is around 1 μm, thick, so the device upper layer becomes thick, and a problem of color mixtures due to oblique incident light can be caused, but this problem can be decreased by replacing the on-chip lens 108 with the alternate placement layer 112A.

The example shown in FIG. 2B illustrates a state of the peripheral portion of the pixel array unit, wherein the center of the on-chip lens 108 and the center of the alternate placement layer 112A equivalent to one cycle worth of the optical lens 110A are shifted and disposed such that the oblique incident light passed through the on-chip lens 108 passes through the center of the alternate placement layer 112A. However, such an arrangement is not necessary at the center portion of the pixel array unit, so the center of the on-chip lens 108 and the center of the alternate placement layer 112A equivalent to one cycle worth of the optical lens 110A are disposed so as to be identical.

Though detailed description will be omitted here, a wiring layer 109 is provided between the alternate placement layer 112A and the surface (thin-film layer 130 side) of the silicon substrate 102. With the wiring layer 109, aluminum wiring for controlling the charge storage operation and signal readout operation of each photoelectric conversion unit 104 is provided so as not to prevent the optical path to the photoelectric conversion units 104.

The optical lens 110A includes a thick layer of silicon oxide SiO2 (referred to as a silicon oxide layer) with the refractive index n1 of 1.46 as a medium, and includes the alternate placement layer 112A having the same configuration as the alternate placement layer 2A described with reference to FIGS. 1A through 1F on the surface neighborhood at the light incident side thereof. The light incident side from the alternate placement layer 112A serves as a single material layer 111 similar to the single material layer 1 described with reference to FIGS. 1A through 1F, and the silicon substrate 102 side from the alternate placement layer 112A serves as a single material layer 113 similar to the single material layer 3 described with reference to FIGS. 1A through 1F.

One cycle (i.e., lens size) of the optical lens 110A is adjusted to a pixel size (=pixel pitch) of 3.6 μm. The distance (thickness: substantial lens length) from the boundary surface between the silicon substrate 102 and thin-film layer 130 to the alternate placement layer 112A is set to 3.6 μm, and the thickness (substantial lens thickness) of the alternate placement layer 112A is set to 0.5 μm. As can be understood from this as well, the alternate placement layer 2A configured by the high refractive index layer $21\_k$ and low refractive index layer $20\_j$ being arrayed alternately is set sufficiently thinner than the optical length (lens length).

With the alternate placement layer 112A, rectangular low refractive index layers 120 of silicon oxide SiO2 with the refractive index n0 of 1.46, and rectangular high refractive index layers 121 of silicon nitride SiN with the refractive index n1 of 2.0 are disposed such that the widths of the high refractive index layers 121 increase gradually toward the center of the lens, and the low refractive index layers 120 decrease gradually toward the center of the lens, thereby configuring the high refractive index layers 121 in a plate shape so as to be disposed densely at the center and disposed non-densely farther away from the center.

With the first embodiment (application example 1), the widths of the low refractive index layer $120\_j$ and high refractive index layer $121\_k$ (both are not shown in the drawing) within the alternate placement layer 112A during one cycle, and the boundary distance (the synthetic width of the adjacent low refractive index layers 120R_5 and 120L_5 in the present example) are set as follows.

high refractive index layer 121R_1+high refractive index layer 121L_1: 0.45 μm high refractive index layer 121R_2, high refractive index layer 121L_2: 0.25 μm high refractive index layer 121R_3, high refractive index layer 121L_3: 0.20 μm high refractive index layer 121R_4, high refractive index layer 121L_4: 0.15 μm high refractive index layer 121R_5, high refractive index layer 121L_5: 0.10 μm low refractive index layer 120R_1, low refractive index layer 120L_1: 0.10 μm low refractive index layer 120R_2, low refractive index layer 120L_2: 0.15 μm low refractive index layer 120R_3, low refractive index layer 120L_3: 0.20 μm low refractive index layer 120R_4, low refractive index layer 120L_4: 0.225 μm low refractive index layer 120R_5+low refractive index layer 120L_5: 0.40 μm As can be understood from the drawing, the alternate placement layer 112A of the optical lens 110A is a condensing element having a SWLL configuration wherein incident light is curved with the periodic structure of the low refractive layers 120 made up of silicon oxide SiO2 having a refractive index of 1.46, and the high refractive layers 121 made up of silicon nitride SiN having a refractive index of 2.0. In the present example, with the alternate placement layer 112A having the periodic structure of silicon nitride SiN and silicon oxide SiO2, both of the low refractive index layers 120 and high refractive index layers 121 are configured such that the minimum line width in the lateral direction is 0.1 μm, and the lens thickness is 0.5 μm.

FIG. 2C illustrates the simulation result regarding green light having a wavelength λ of 540 nm passing through the optical lens 110A shown in FIG. 2A. In the drawing, cT is obtained by multiplying velocity of light c by time T, and represents distance where the light advances in vacuo (increments: μm). Here, this may be regarded as the time which the simulation took.

First, (1) in FIG. 2C shows the simulation result immediately after the light passes through the alternate placement layer 112A of the optical lens 110A shown in FIG. 2A. It can be understood from this result that the wave surfaces of front (silicon substrate 102 side) of the green light passed through the alternate placement layer 112A are recessed surfaces.

In FIG. 2C, (2) shows the simulation result when the light passes through the alternate placement layer 112A, and further generally reaches the surface of the silicon substrate 102 (i.e., photoelectric conversion element). It can be understood from this result that the green light condenses to the center of each optical lens 110A, and there is a convex lens effect regarding the green light (λ=540 nm). Though omitted in the drawing, there is similarly a lens effect regarding near-infrared light (λ=780 nm), red light (λ=640 nm), and blue light (λ=460 nm).

FIGS. 2D and 2E are diagrams illustrating the simulation results regarding the solid-state imaging device 100A according to the first embodiment (application example 1) to which an optical lens having the same configuration as the optical lens 110A according to the first embodiment (application example 1) shown in FIG. 2A, and represent the results of near-infrared light (λ=780 nm), red light (λ=640 nm), green light (λ=540 nm), and blue light (λ=460 nm), respectively. As can be understood from these, light having any wavelength is condensed with the optical lens 110A, thereby providing a convex lens effect.

<First Embodiment: Application Example 2 of Convex Lens>

FIGS. 3A through 3C are diagrams for describing a second example (application example 2) of the solid-state imagining device to which the optical lens according to the first embodiment is applied. Here, FIG. 3A is the cross-sectional schematic view of the solid-state imaging device according to the first embodiment (application example 2), and FIGS. 3B and 3C are diagrams illustrating the simulation results of the optical property thereof.

The solid-state imaging device 100A according to the first embodiment (application example 2) is basically configured in the same way as with the solid-state imaging device 100A according to the first embodiment (application example 1) except that the minimum line width in the lateral direction is set to not 0.1 μm but 0.2 μm. Along with this modification of the minimum line width in the lateral direction, adjustment is made regarding the number, widths, boundary distance of each of the low refractive index layer 120_*j* and high refractive index layer 121_*k* within the alternate placement layer 112A.

Specifically, with the first embodiment (application example 2), the widths of the low refractive index layer 120_*j* and high refractive index layer 121_*k* (both are not shown in the drawing) within the alternate placement layer 112A during one cycle of the optical lens 110A, and the boundary distance (the synthetic width of the adjacent high refractive index layers 121R_4 and 121L_4 in the present example) are set as follows.

high refractive index layer 121R_1+high refractive index layer 121L_1: 0.75 μm high refractive index layer 121R_2, high refractive index layer 121L_2: 0.25 μm high refractive index layer 121R_3, high refractive index layer 121L_3: 0.25 μm high refractive index layer 121R_4+high refractive index layer 121L_4: 0.20 μm low refractive index layer 120R_1, low refractive index layer 120L_1: 0.20 μm low refractive index layer 120R_2, low refractive index layer 120L_2: 0.25 μm low refractive index layer 120R_3, low refractive index layer 120L_3: 0.375 μm FIGS. 3B and 3C are diagrams illustrating the simulation results of the optical property according to the first embodiment (application example 2) shown in FIG. 3A, and represent the results of near-infrared light (λ=780 nm), red light (λ=640 nm), green light (λ=540 nm), and blue light (λ=460 nm), respectively.

As can be understood from these, even in a case wherein the minimum line width in the lateral direction is changed from 0.1 μm to 0.2 μm, the number, widths, boundary distance of each of the low refractive index layer 120_*j* and high refractive index layer 121_*k* within the alternate placement layer 112A are set appropriately, whereby the light having any wavelength can be condensed with the alternate placement layer 112A, and a convex lens effect can be provided.

<First Embodiment: Application Example 3 of Convex Lens>

FIGS. 4A through 4C are diagrams for describing a third example (application example 3) of the solid-state imagining device to which the optical lens according to the first embodiment is applied. Here, FIG. 4A is the cross-sectional schematic view of the solid-state imaging device according to the first embodiment (application example 3), and FIGS. 4B and 4C are diagrams illustrating the simulation results of the optical property thereof.

The solid-state imaging device 100A according to the first embodiment (application example 3) is basically configured in the same way as with the solid-state imaging device 100A according to the first embodiment (application example 1) except that the thickness (substantial lens thickness) of the alternate placement layer 112A is set to not 0.5 μm but a thinner 0.3 μm. Along with this modification of the lens thickness, adjustment is made regarding the number, widths, boundary distance of each of the low refractive index layer 120_*j* and high refractive index layer 121_*k* within the alternate placement layer 112A. With the present example, completely the same adjustment as that in the first embodiment (application example 1) is made.

Specifically, with the first embodiment (application example 3), the widths of the low refractive index layer 120_*j* and high refractive index layer 121_*k* (both are not shown in the drawing) within the alternate placement layer 112A during one cycle, and the boundary distance (the synthetic width of the adjacent low refractive index layers 120R_5 and 120L_5 in the present example) are set as follows. As described above, as to the first embodiment (application example 1), the thickness dimension in the vertical direction is changed from 0.5 μm to 0.3 μm, but the width dimension in the lateral direction is the same.

high refractive index layer 121R_1+high refractive index layer 121L_1: 0.45 μm
high refractive index layer 121R_2, high refractive index layer 121L_2: 0.25 μm
high refractive index layer 121R_3, high refractive index layer 121L_3: 0.20 μm
high refractive index layer 121R_4, high refractive index layer 121L_4: 0.15 μm
high refractive index layer 121R_5, high refractive index layer 121L_5: 0.10 μm
low refractive index layer 120R_1, low refractive index layer 120L_1: 0.10 μm
low refractive index layer 120R_2, low refractive index layer 120L_2: 0.15 μm
low refractive index layer 120R_3, low refractive index layer 120L_3: 0.20 μm
low refractive index layer 120R_4, low refractive index layer 120L_4: 0.225 μm
low refractive index layer 120R_5+low refractive index layer 120L_5: 0.40 μm FIGS. 4B and 4C are diagrams illustrating the simulation results of the optical property according to the first embodiment (application example 3) shown in FIG. 4A, and represent the results of near-infrared light (λ=780 nm), red light (λ=640 nm), green light (λ=540 nm), and blue light (λ=460 nm), respectively.

As can be understood from these, even in a case wherein the thickness (substantial lens thickness) of the alternate placement layer 112A is changed from 0.5 μm to 0.3 μm, the number, widths, boundary distance of each of the low refractive index layer 120_j and high refractive index layer 121_k within the alternate placement layer 112A are set appropriately, whereby the light having any wavelength can be condensed with the alternate placement layer 112A, and a convex lens effect can be provided.

<First Embodiment: Application Example 4 of Convex Lens>

Figure 5A:
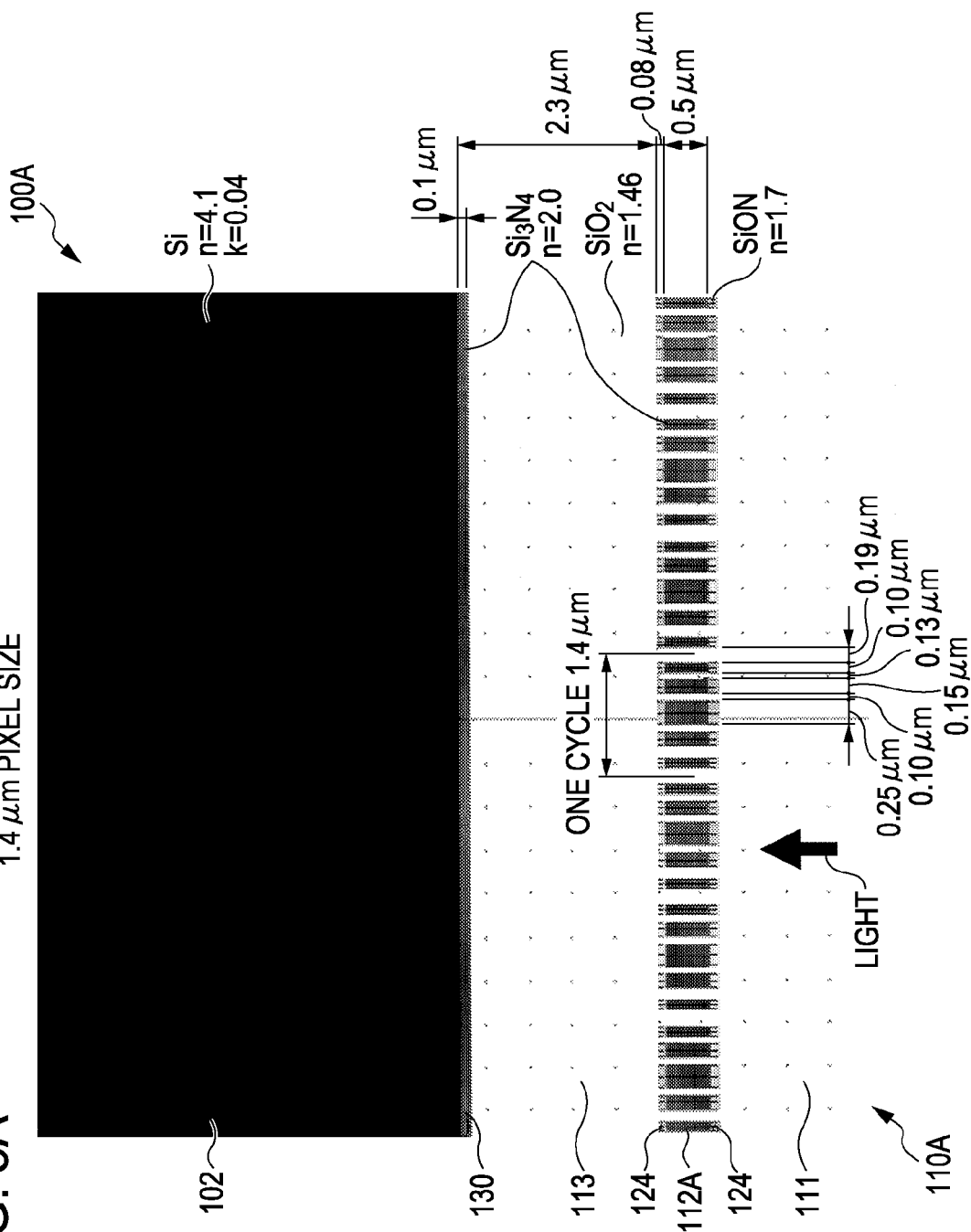
FIG. 5A is a cross-sectional schematic view for describing a fourth example (application example 4) of the solid-state imaging device to which the optical lens according to the first embodiment is applied.
Figure 5B:
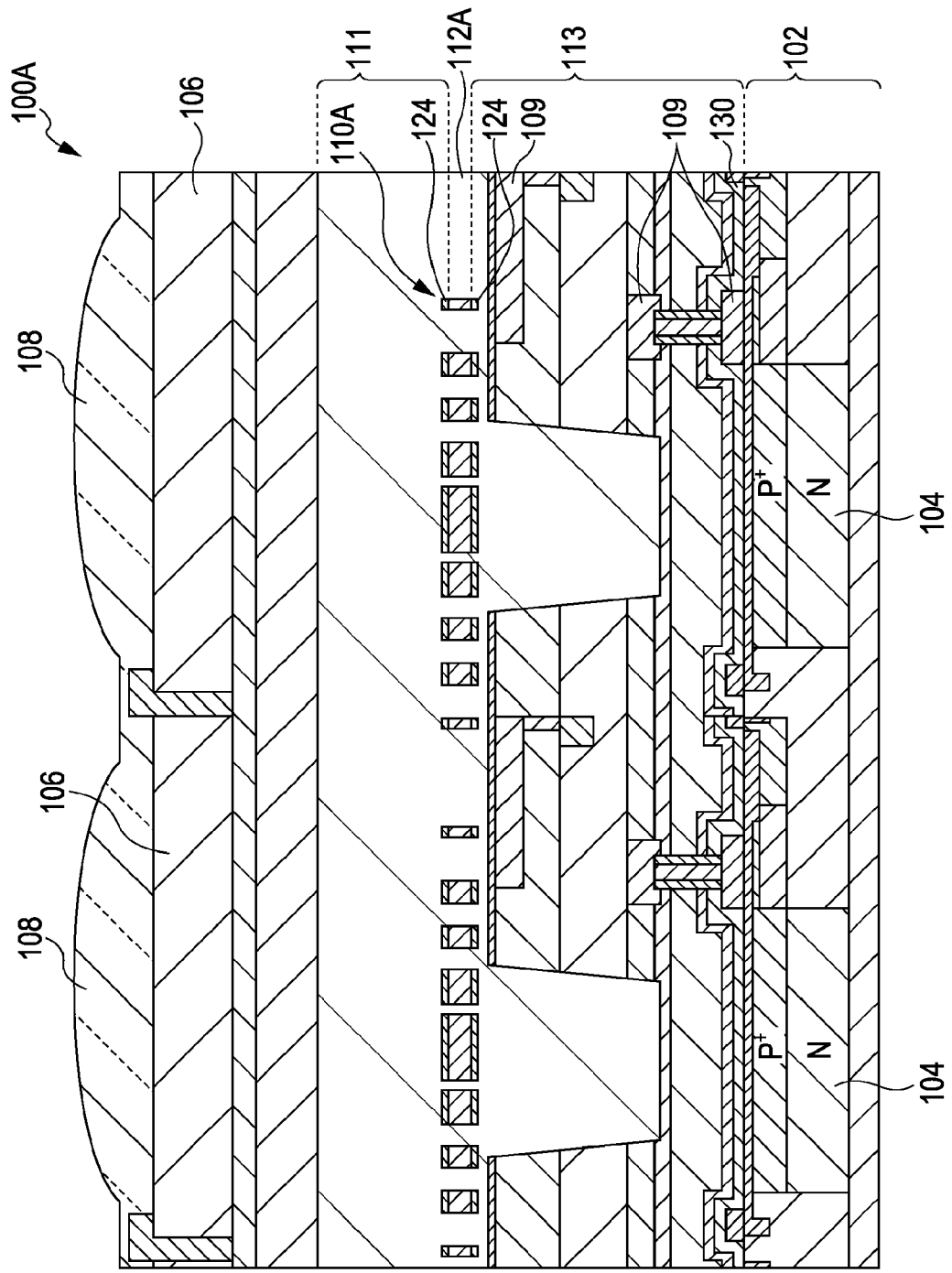
FIG. 5B is a more specific cross-sectional view of the solid-state imaging device according to the first embodiment (application example 4)

FIGS. 5A through 5D are diagrams for describing a fourth example (application example 4) of the solid-state imagining device to which the optical lens according to the first embodiment is applied. Here, FIG. 5A is the cross-sectional schematic view of the solid-state imaging device according to the first embodiment (application example 4), FIG. 5B is a more schematic cross-sectional view, and FIGS. 5C and 5D are diagrams illustrating the simulation results of the optical property thereof.

The solid-state imaging device 100A according to the first embodiment (application example 4) is basically configured in the same way as with the solid-state imaging device 100A according to the first embodiment (application example 1) except that the pixel size or lens size is set to not 3.6 μm but smaller 1.4 μm. Along with this modification of the pixel size or lens size, adjustment is made regarding the distance (thickness: substantial lens length) from the boundary surface between the silicon substrate 102 and thin-film layer 130 to the alternate placement layer 112A, the thickness (substantial lens thickness) of the alternate placement layer 112A, and the number, widths, boundary distance of each of the low refractive index layer 120_j and high refractive index layer 121_k within the alternate placement layer 112A.

Specifically, with the first embodiment (application example 4), first, the thickness (substantial lens thickness) of the alternate placement layer 112A is set to 0.5 μm. One cycle (i.e., lens size) of the optical lens 110A is adjusted to the pixel size (=pixel pitch) of 1.4 μm.

The widths of the low refractive index layer 120_j and high refractive index layer 121_k (both are not shown in the drawing) within the alternate placement layer 112A during one cycle of the optical lens 110A, and the boundary distance (the synthetic width of the adjacent low refractive index layers 120R_3 and 120L_3 in the present example) are set as follows.

high refractive index layer 121R_1+high refractive index layer 121L_1: 0.25 μm
high refractive index layer 121R_2, high refractive index layer 121L_2: 0.15 μm
high refractive index layer 121R_3, high refractive index layer 121L_3: 0.10 μm
low refractive index layer 120R_1, low refractive index layer 120L_1: 0.10 μm
low refractive index layer 120R_2, low refractive index layer 120L_2: 0.13 μm
low refractive index layer 120R_3+low refractive index layer 120L_3: 0.19 μm Also, with the upper and lower sides of each high refractive index layers 121_k made up of silicon nitride SiN of the alternate placement layer 112A making up a principal portion of the optical lens 110A, a thin film (thickness=0.08 μm) made up of SiON with the refractive index n4 of 1.7 is provided thereto as an antireflection film 124 with the same width as each high refractive index layer 121_k. The antireflection films 124 are thin films made up of an intermediate refractive index material (SiON with the refractive index of 1.7 in the present example) between silicon nitride SiN and silicon oxide SiO2, and are for reducing optical loss due to reflection.

The antireflection films 124 are thin films, and do not affect the lens effect itself of the alternate placement layer 112A regardless of the thickness and width thereof, regardless of whether or not they are provided to each high refractive index layer 121_k. It goes without saying that the antireflection films 124 can be provided to not only the first embodiment (application example 4) but also the first embodiment (application examples 1 through 3).

The lens length in the case of providing the antireflection films 124 is distance from the boundary surface between the silicon substrate 102 and thin-film layer 130 to the antireflection films 124, and is set to 2.3 μm in the present example.

FIGS. 5C and 5D are diagrams illustrating the simulation results of the optical property according to the first embodiment (application example 4) shown in FIG. 5A, and represent the results of near-infrared light (λ=780 nm), red light (λ=640 nm), green light (λ=540 nm), and blue light (λ=460 nm), respectively.

As can be understood from these, even in a case wherein the pixel size or lens size is changed from 3.6 μm to 1.4 μm, the lens length, and the number, widths, boundary distance of each of the low refractive index layer 120_j and high refractive index layer 121_k within the alternate placement layer 112A are set appropriately, whereby the light having any wavelength can be condensed with the alternate placement layer 112A, and a convex lens effect can be provided.

FIRST COMPARATIVE EXAMPLE

Figure 6A:
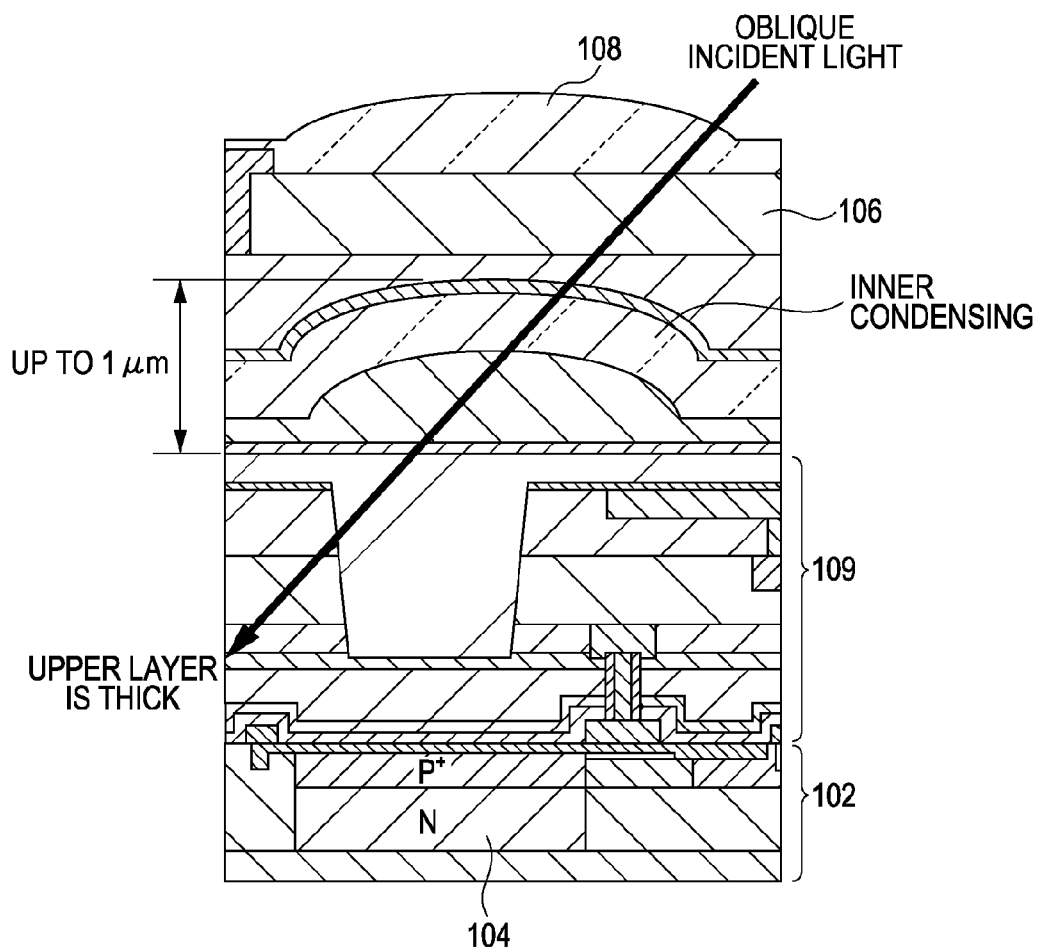
FIG. 6A is a diagram for describing a first comparative example as to a convex lens according to an alternate placement layer of the first embodiment.

FIG. 6A is a diagram for describing a first comparative example as to the convex lens 110A using the alternate placement layer 112A (including the alternate placement layer 2A as a single material) included in the optical lens 110A according to the first embodiment.

The solid-state imaging device 100A according to the first comparative example includes a wiring layer 109 above the silicon substrate 102, an inner condensing lens 105 on the upper layer of the wiring layer 109 thereof, and a color filter 106 and on-chip lens 108 on the upper layer of the inner condensing lens 105 thereof.

Both the inner condensing lens 105 and on-chip lens 108 are lenses having a refractive type lens configuration employing Snell's law. Accordingly, the lens itself is thick such as around 1 μm, and consequently, the device upper layer serving as the light incident side of the silicon substrate 102 becomes thick. Thus, undesirable oblique incident light from the adjacent pixel increases, color mixtures due to this oblique incident light increase, and accordingly, color reproducibility becomes poor.

It can also be conceived to perform calculation processing such as matrix computation to restore color reproducibility, but extra noise occurs, and image quality deteriorates.

When reducing the F value of an external image formation system lens, oblique incident light increases due to eclipse caused by metal wiring of the wiring layer 109, so deterioration from ideal sensitivity becomes pronounced by the upper layer becoming thick, and accordingly, deterioration in F value light sensitivity is caused wherein the original sensitivity cannot be obtained.

A so-called shading phenomenon also becomes pronounced wherein sensitivity is reduced at the end portion as compared with the center of the pixel array unit where the photoelectric conversion units 104 are disposed in a two-dimensional manner. This is because the principal ray obliquely enters, and accordingly, influence of ellipse increases, for example.

It can also be conceived that each lens is made into an asymmetric lens shape deformed in the lateral direction so as to correct oblique incident light to vertical incident light. Note however, from the perspective of a manufacturing process, for example, when fabricating each lens with reflow, the fabrication thereof is influenced by gravity or surface tension, so each lens can be fabricated only in a spherical shape. In other words, a spherical lens is fabricated with reflow, so a lens having a configuration deformed in the lateral direction cannot be fabricated, and accordingly, a lens whereby oblique incident light can be corrected to vertical incident light cannot be fabricated.

On the other hand, with each optical lens 110A according to the first embodiment, the alternate placement layer 112A is configured as a principal portion, whereby a convex lens function having a condensing effect can be realized with an extremely thin lens. Thus, the upper layer of the device can be thinned, and color mixtures decrease, so color reproducibility improves, and also extra noise occurrence due to calculation processing decreases. Also, deterioration in F value light sensitivity is reduced.

Further, the alternate placement layer 112A serving as a principal portion of the optical lens 110A has a configuration wherein the low refractive index layers 120 and high refractive index layers 121 are alternately arrayed with a predetermined width, and can be fabricated with just simple easy-to-use processing technology such as lithography technology, the RIE (Reactive Ion Etching) method, or the like (details will be made later), whereby costs can be suppressed with an easy-to-use fabrication process.

Also, as can be understood from application examples 1 through 4, the convex lens effect employing the alternate placement layer 112A can be modified as necessary by adjusting the widths and number of arrays of each of the rectangular low refractive index layers 120 and high refractive index layers 121, and accordingly, the width of designing can optically spread as compared with a spherical lens.

SECOND COMPARATIVE EXAMPLE

Figure 6B:
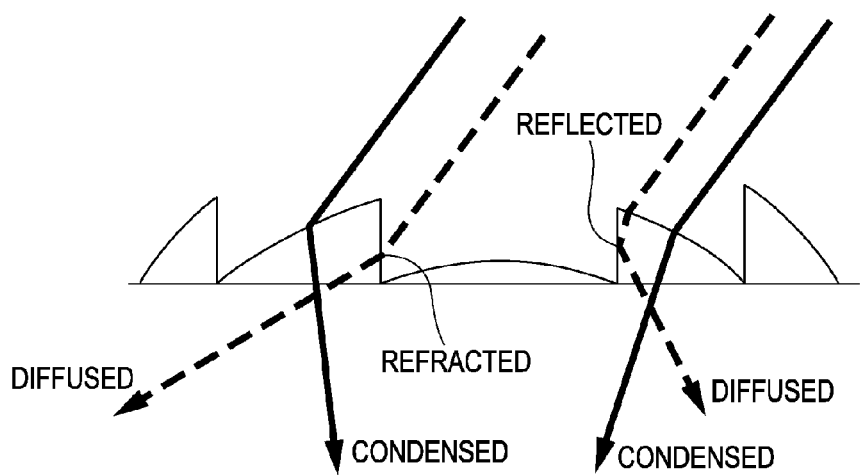
FIG. 6B is a diagram for describing a second comparative example as to the convex lens according to the alternate placement layer of the first embodiment.

FIG. 6B is a diagram for describing a second comparative example as to the convex lens using the alternate placement layer 112A (including the alternate placement layer 2A as a single material) included in the optical lens 110A according to the first embodiment.

The solid-state imaging device 100A according to the second comparative example is described in Japanese Unexamined Patent Application Publication No. 2005-011969. To be brief, an inner condensing lens is configured with a Fresnel lens as the basis, which subjects light subjected to convergence by an upper portion lens such as an on-chip lens to further convergence to enter this in the corresponding photoelectric conversion unit.

Specifically, this lens is a refractive type lens, but is configured in a wave type, whereby the lens can be thinned. Note however, this lens is a refractive type, so there is a limit to make the lens thinner than the wavelength order. Also, fabricating such a refractive type makes the fabricating process complicated than a common refractive type lens process, and requires further cost. Also, the lens can be fabricated only with a spherical surface, so asymmetry cannot be provided thereto.

Additionally, in the case of a Fresnel lens, light obliquely entering in a certain region is not condensed in a point to be condensed originally in some cases. For example, in FIG. 6B, in a case wherein light enters in the surface portion of a lens as shown in the solid line, the light is condensed, but in a case wherein light enters in a stepwise wall as shown in the dotted line, the light is refracted or reflected, and accordingly, the light is not condensed but diffused as shown in the drawing. This causes condensing efficiency to deteriorate, and moreover, in a case wherein diffused light enters in an adjacent pixel, causes a color mixture.

THIRD COMPARATIVE EXAMPLE

Figure 6C:
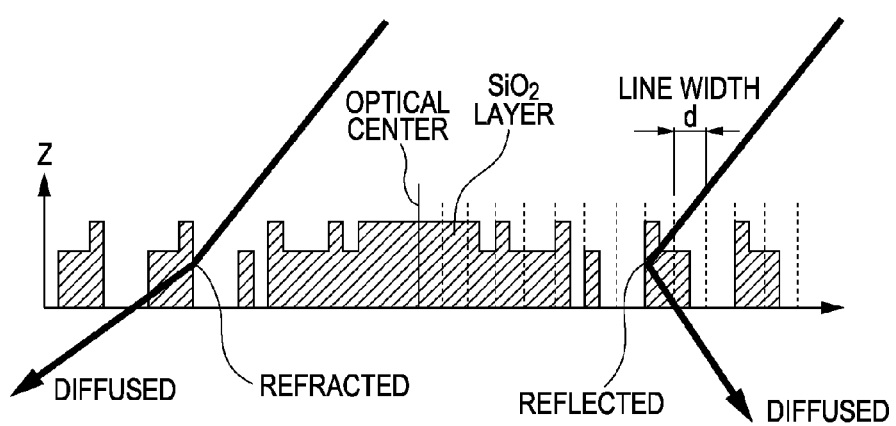
FIG. 6C is a diagram for describing a third comparative example as to the convex lens according to the alternate placement layer of the first embodiment.

FIG. 6C is a diagram for describing a third comparative example as to the convex lens using the alternate placement layer 112A (including the alternate placement layer 2A as a single material) included in the optical lens 110A according to the first embodiment.

The solid-state imaging device 100A according to the third comparative example is described in Japanese Unexamined Patent Application Publication No. 2006-351972. A condensing element (i.e., convex lens) is configured by combining multiple zone regions having a concentric configuration divided by a line width equal to or shorter than the wavelength of incident light. Here, of the multiple zone regions, at least one zone region includes a lower stage light transmission film having a concentric configuration of a first line width and first film thickness, and an upper stage light transmission film having a concentric configuration of a second line width and second film thickness, which is configured above the lower stage light transmission film. To be brief, a condensing element is configured with a distribution refractive index lens having a two-stage concentric configuration (i.e., Fresnel lens) as the basis.

Accordingly, the condensing element (convex lens) according to the third comparative example described in Japanese Unexamined Patent Application Publication No. 2006-351972 is a refractive index lens, but is configured with a Fresnel lens as the basis, and accordingly, the same situation occurs as that in the inner condensing lens according to the second comparative example described in Japanese Unexamined Patent Application Publication No. 2005-011969. This situation is shown in FIG. 6C, wherein when oblique incident light enters in the steps of refractive index around the boundary of each region, the light is reflected or refracted at a wall, and accordingly the light is refracted or reflected, and accordingly, the light is not condensed but diffused as shown in the drawing. This causes condensing efficiency to deteriorate, and moreover, in a case wherein diffused light enters in an adjacent pixel, causes a color mixture.

On the other hand, with the alternate placement layer 2A (alternate placement layer 112A) according to the first embodiment, the widths of the high refractive index layers 121 having a great refractive index and the low refractive index layers 120 having a small refractive index change gradually within the wavelength order, so there is no step of a great refractive index such as a Fresnel lens, and there is little diffusing light caused by reflection or refraction even as to oblique incident light. Accordingly, deterioration in condensing decreases, so light can be condensed effectively.

Also, the manufacturing process of the alternate placement layer 112A (alternate placement layer 2A) according to the first embodiment is easy to use as compared with the processes of the inner condensing lens according to the second comparative example described in Japanese Unexamined Patent Application Publication No. 2005-011969 and the condensing element according to the third comparative example described in Japanese Unexamined Patent Application Publication No. 2006-351972. For example, as can be understood from the configuration shown in FIG. 6C, etching is performed with two stages, so the number of processes increases, and consequently, cost increases. Also, such complicated etching affects on reproducibility and evenness, and manufacturing irregularities are readily caused.

With the alternate placement layer 112A (alternate placement layer 2A) according to the first embodiment, the high refractive index layers 21 (high refractive index layers 121) and low refractive index layers 20 (low refractive index layers 120) are arrayed alternately in the lateral direction, so basically, all that is necessary is deposition of the high refractive index layers 21 (high refractive index layers 121) and one-time etching, and the subsequent deposition of low refractive index layers 20 (low refractive index layers 120) and simple easy-to-use processing technology such as lithography technology, RIE method, or the like, thereby reducing the number of processes, reducing cost, and improving reproducibility and evenness.

As can be understood from the above description, the principle completely differs between the alternate placement layer 2A (alternate placement layer 112A) according to the first embodiment, which can be conceived such that a condensing lens (i.e., convex lens) utilizing a wave surface control arrangement is employed as an inner condensing lens (or surface lens), and the inner condensing lens according to the second comparative example (Japanese Unexamined Patent Application Publication No. 2005-011969) or the condensing element according to the third comparative example (Japanese Unexamined Patent Application Publication No. 2006-351972). With the inner condensing lens according to the second comparative example and the condensing element according to the third comparative example, the advantage provided by the alternate placement layer 2A (alternate placement layer 112A) according to the first embodiment cannot be accepted.

FOURTH COMPARATIVE EXAMPLE

Though not shown in the drawing, with Japanese Unexamined Patent Application Publication No. 2005-252391, a configuration has been disclosed wherein a scatterer having a refractive index is provided on the upper layer within a pixel (referred to as a fourth comparative example). Note however, the arrangement of the fourth comparative example differs from that in the alternate placement layer 2A (alternate placement layer 112A) according to the first embodiment such as a configuration wherein the high refractive index layers 121 having a great refractive index are disposed, in a plate shape, densely at the center and disposed non-densely farther away from the center, and specifically, a configuration wherein the widths of the high refractive index layers 121 having a great refractive index increase toward the center of the lens, i.e., a configuration wherein the center is broad, and the periphery is narrow.

Additionally, the arrangement of the fourth comparative example is not a lens function but a low-pass filter function employing scattering effect or MTF control function. In this point, with the alternate placement layer 2A (alternate placement layer 112A) according to the first embodiment, a feature wherein the velocity of light differs between the high refractive index layers 21 (high refractive index layers 121) having a great refractive index and the low refractive index layers 20 (low refractive index layers 120) having a small refractive index, and continuity of a wave function are combined, thereby accepting a convex lens effect, so the principle and object thereof completely differs from the arrangement of the fourth comparative example.

FIFTH COMPARATIVE EXAMPLE

Though not shown in the drawing, with Japanese Unexamined Patent Application Publication No. 2005-203526, a configuration has been disclosed wherein a refractive index distribution type lens is embedded in a through hole formed corresponding to a pixel on a lens substrate, which has a refractive index changed in the diameter direction of the through hole (referred to as a fifth comparative example). Note however, the arrangement of the fifth comparative example is such that a refractive index distribution is changed gradually in the diameter direction of the through hole, i.e., lateral direction, and the basic configuration concept thereof differs from that in the arrangement of the first embodiment wherein a convex lens effect is accepted using the alternate placement layer 2A (alternate placement layer 112A) which combines a feature wherein the velocity of light differs between the high refractive index layers 21 (high refractive index layers 121) having a great refractive index and the low refractive index layers 20 (low refractive index layers 120) having a small refractive index, and continuity of a wave function.

With the arrangement of the fifth comparative example, description has been made simultaneously wherein a layer having a great refractive index and a layer having a small refractive index are deposited in the lateral direction in order, but in reality, deposition is made not only from the lateral direction but also from underneath, so such a configuration according to the first embodiment is not realized, and accordingly, a multi-layer configuration wherein refractive indexes differ only in the lateral direction cannot be readily fabricated.

On the other hand, with the alternate placement layer 112A (alternate placement layer 2A) according to the first embodiment, the high refractive index layers 21 (high refractive index layers 121) and low refractive index layers 20 (low refractive index layers 120) are arrayed alternately in the lateral direction, so basically, all that is necessary is deposition of the high refractive index layers 21 (high refractive index layers 121) and one-time etching, and a multi-layer configuration in the vertical direction such as the subsequent deposition of low refractive index layers 20 (low refractive index layers 120) and a process such as lithography technology, RIE method, or the like, thereby providing an advantage wherein fabrication can be made with ease to use and a small number of processes.

<First Embodiment: Modification 1 of Convex Lens>

Figure 7B:
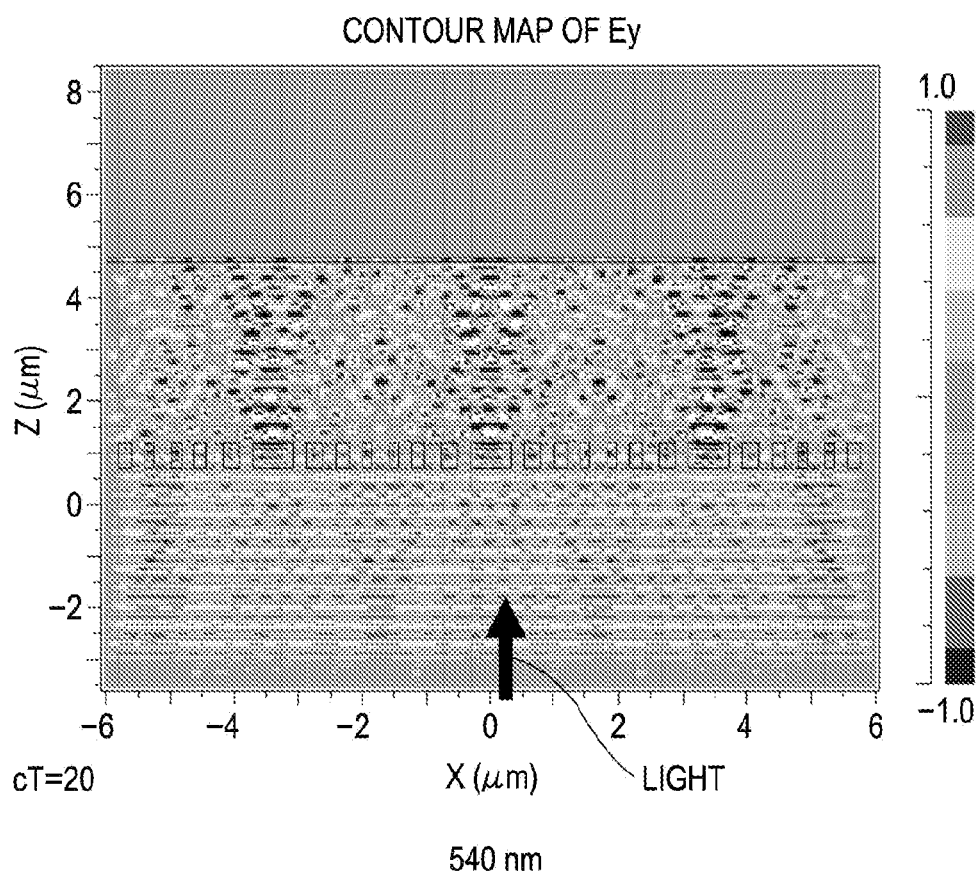
FIG. 7B is a diagram illustrating the simulation result of modification 1 ($\lambda$=540 nm)

FIGS. 7A and 7B are diagrams for describing a first modification (modification 1) of the optical lens according to the first embodiment. Here, FIG. 7A is the cross-sectional schematic view for describing the solid-state imaging device according to modification 1 to which the optical lens according to modification 1 is applied. FIG. 7B is a diagram illustrating the simulation result of the optical property thereof ($\lambda$=540 nm).

With the basic example of the first embodiment, in order to provide a convex lens function by employing a configuration wherein density increases toward the center and density decreases farther away from the center, the third convex lens providing method has been employed wherein the first and second convex lens providing methods are employed together, but with modification 1, only the first convex lens providing method is employed wherein the width of a layer having a great refractive index (high refractive index layer 121_$k$) increases gradually toward the center of the lens. With regard to a layer having a small refractive index (low refractive index layer 120_$j$), all are configured so as to have an equal width.

Let us say that the distance (thickness: substantial lens length) from the boundary surface between the silicon substrate 102 and thin-film layer 130 to the alternate placement layer 112A is 3.6 μm, and the thickness (substantial lens thickness) of the alternate placement layer 112A is 0.5 μm. One cycle (i.e., lens size) of the optical lens 110A is adjusted to a pixel size (pixel pitch) of 3.25 μm. This somewhat differs from the first embodiment (application example 1) wherein the lens size or pixel size is set to 3.6 μm. The pixel size is somewhat changed from that in the previous example, but this is for adjustment in the event that while the high refractive index layers 121 are set to an appropriate dimension (in increments of 0.05 μm), the low refractive index layers 120 are set to be an equal width with an appropriate dimension (in increments of 0.05 μm). An arrangement may be made wherein while the pixel size is set to that in the previous example as much as possible, the low refractive index layers 120 portion is set to be an equal width.

The solid-state imaging device 100A according to the first embodiment (modification 1) is basically configured in the same way as with the solid-state imaging device 100A according to the first embodiment (application example 1) except that the width of the low refractive index layer 120_$j$ is set to be an equal width. Along with this modification of changing the width of the low refractive index layer 120_$j$ to an equal width, adjustment is made regarding the number, widths, and boundary distance of each of the low refractive index layer 120_$j$ and high refractive index layer 121_$k$ within the alternate placement layer 112A.

Specifically, with the first embodiment (modification 1), the widths of the low refractive index layer 120_$j$ and high refractive index layer 121_$k$ (both are not shown in the drawing) within the alternate placement layer 112A during one cycle, and the boundary distance (the synthetic width of the adjacent low refractive index layers 120R_4 and 120L_4 in the present example) are set as follows.

high refractive index layer 121R_1+high refractive index layer 121L_1: 0.65 μm high refractive index layer 121R_2, high refractive index layer 121L_2: 0.25 μm high refractive index layer 121R_3, high refractive index layer 121L_3: 0.20 μm high refractive index layer 121R_4, high refractive index layer 121L_4: 0.15 μm low refractive index layer 120R_1, low refractive index layer 120L_1: 0.20 μm low refractive index layer 120R_2, low refractive index layer 120L_2: 0.20 μm low refractive index layer 120R_3, low refractive index layer 120L_3: 0.20 μm low refractive index layer 120R_4+low refractive index layer 120L_4: 0.20 μm As can be understood from the above settings, the width of the low refractive index layer 120_$j$ having a small refractive index is an equal width of 0.2 μm, and the width of the high refractive index layer 121_$k$ having a great refractive index decreases gradually, such as 0.65 μm, 0.25 μm, 0.2 μm, and 0.15 μm, toward the end from the center.

As can be understood from the drawing, with the first embodiment (modification 1) as well, the alternate placement layer 112A of the optical lens 110A is a condensing element having a SWLL configuration wherein incident light is curved by the periodical structure between the low refractive index layers 120 made up of silicon oxide SiO2 having a refractive index of 1.46 and the high refractive index layers 121 made up of silicon nitride having a refractive index of 2.0. With the present example, the alternate placement layer 112A is configured such that the minimum line width in the lateral direction of the low refractive index layers 120 is 0.20 μm, the minimum line width in the lateral direction of the high refractive index layers 121 is 0.15 μm, and the thickness of the lens is 0.5 μm.

FIG. 7B is a diagram illustrating the simulation result of the optical property of the first embodiment (modification 1) shown in FIG. 7A, which is the result of green light ($\lambda$=540 nm). As can also be understood from this, even with an arrangement wherein while all widths are set to be equal regarding the layers having a small refractive index (low refractive index layer 120_$j$), the widths of the high refractive index layers 121 increase gradually toward the center of the lens, the green light ($\lambda$=540 nm) can be condensed with the alternate placement layer 112A by setting the number, widths, boundary distance of each of the low refractive index layer 120_$j$ and high refractive index layer 121_$k$ within the alternate placement layer 112A appropriately, thereby providing a convex lens effect.

Though not shown in the drawing, with regard to near-infrared light ($\lambda$=780 nm), red light ($\lambda$=640 nm), and blue light ($\lambda$=460 nm) as well, the same convex lens effect is provided.

Thus, the first embodiment (modification 1) is employed, which has a configuration wherein the low refractive index layer 120_$j$ having a small refractive index has an equal width, and the width of the high refractive index layer 121_$k$ increases gradually toward the center of the lens, whereby a configuration can be realized wherein the high refractive index layer 121_$k$ having a great refractive index is disposed, in a plate shape, densely at the center and disposed non-densely farther away from the center, and accordingly, it can be found that a condensing property exists like the first embodiment (basic example and application examples 1 through 4 thereof).

With the configuration of the first embodiment (modification 1), there is provided an advantage wherein fabrication of a lens is facilitated. That is to say, in a case wherein, with a process for embedding the low refractive index layers 120, there is difficulty such that embedding widths cannot be narrowed due to insufficient lithography resolution, or embedding becomes poor due to occurrence of a void when narrowing the embedding widths, fabrication can be made by setting the widths of the low refractive index layers 120 to equal widths that can be embedded using lithography as with modification 1. Particularly, this becomes an effective tool when this width that can be embedded is just at the wavelength order, where if the width is expanded further, continuity of equiphase wave surfaces (wave surfaces) is lost. <First Embodiment: Modification 2 of Convex Lens>

Figure 8B:
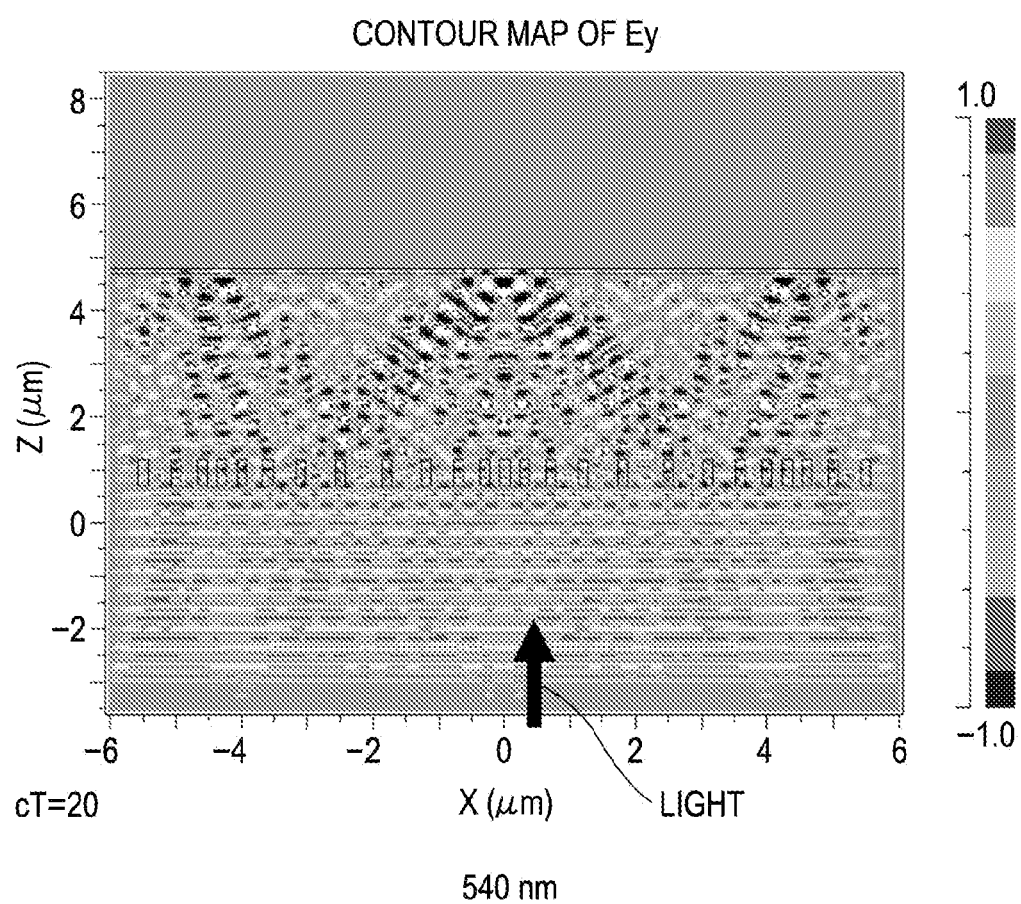
FIG. 8B is a diagram illustrating the simulation result of modification 2 ($\lambda$=540 nm)

FIGS. 8A and 8B are diagrams for describing a second modification (modification 2) of the optical lens according to the first embodiment. Here, FIG. 8A is the cross-sectional schematic view for describing the solid-state imaging device according to modification 2 to which the optical lens according to modification 2 is applied. FIG. 8B is a diagram illustrating the simulation result of the optical property thereof ($\lambda$=540 nm).

With the basic example of the first embodiment, in order to provide a convex lens function by employing a configuration wherein density increases toward the center and density decreases farther away from the center, the third convex lens providing method has been employed wherein the first and second convex lens providing methods are employed together, but with modification 2, only the second convex lens providing method is employed wherein the width of a layer having a small refractive index (low refractive index layer 120_$j$) decreases gradually toward the center of the lens. With regard to a layer having a great refractive index (high refractive index layer 121_$k$), all are configured so as to have an equal width.

Let us say that the distance (thickness: substantial lens length) from the boundary surface between the silicon substrate 102 and thin-film layer 130 to the alternate placement layer 112A is 3.6 μm, and the thickness (substantial lens thickness) of the alternate placement layer 112A is 0.5 μm. One cycle (i.e., lens size) of the optical lens 110A is adjusted to a pixel size (pixel pitch) of 3.85 μm. This somewhat differs from the first embodiment (application example 1) wherein the lens size or pixel size is set to 3.6 μm. The pixel size is somewhat changed from that in the previous example, but this is for adjustment in the event that while the low refractive index layers 120 are set to an appropriate dimension (in increments of 0.05 μm), the high refractive index layers 121 are set to be an equal width with an appropriate dimension (in increments of 0.05 μm). An arrangement may be made wherein while the pixel size is set to that in the previous example as much as possible, the high refractive index layers 121 portion is set to be an equal width.

The solid-state imaging device 100A according to the first embodiment (modification 2) is basically configured in the same way as with the solid-state imaging device 100A according to the first embodiment (application example 1) except that the width of the high refractive index layer 121_$k$ is set to be an equal width. Along with this modification of changing the width of the high refractive index layer 121_$k$ to an equal width, adjustment is made regarding the number, widths, and boundary distance of each of the low refractive index layer 120_$j$ and high refractive index layer 121_$k$ within the alternate placement layer 112A.

Specifically, with the first embodiment (modification 2), the widths of the low refractive index layer 120_$j$ and high refractive index layer 121_$k$ (both are not shown in the drawing) within the alternate placement layer 112A during one cycle, and the boundary distance (the synthetic width of the adjacent low refractive index layers 120R_5 and 120L_5 in the present example) are set as follows.

high refractive index layer 121R_1+high refractive index layer 121L_1: 0.15 μm
high refractive index layer 121R_2, high refractive index layer 121L_2: 0.15 μm
high refractive index layer 121R_3, high refractive index layer 121L_3: 0.15 μm
high refractive index layer 121R_4, high refractive index layer 121L_4: 0.15 μm
high refractive index layer 121R_5, high refractive index layer 121L_5: 0.15 μm
low refractive index layer 120R_1, low refractive index layer 120L_1: 0.10 μm
low refractive index layer 120R_2, low refractive index layer 120L_2: 0.20 μm
low refractive index layer 120R_3, low refractive index layer 120L_3: 0.30 μm
low refractive index layer 120R_4, low refractive index layer 120L_4: 0.40 μm
low refractive index layer 120R_5+low refractive index layer 120L_5: 0.50 μm As can be understood from the above settings, the width of the high refractive index layer 121_$k$ having a great refractive index is an equal width of 0.15 μm, and the width of the low refractive index layer 120_$j$ having a small refractive index increases gradually, such as 0.10 μm, 0.20 μm, 0.30 μm, 0.40 μm, and 0.50 μm, toward the end from the center.

As can be understood from the drawing, with the first embodiment (modification 2) as well, the alternate placement layer 112A of the optical lens 110A is a condensing element having a SWLL configuration wherein incident light is curved by the periodical structure between the low refractive index layers 120 made up of silicon oxide SiO2 having a refractive index of 1.46 and the high refractive index layers 121 made up of silicon nitride having a refractive index of 2.0. With the present example, the alternate placement layer 112A is configured such that the minimum line width in the lateral direction of the high refractive index layers 121 is 0.10 μm, the minimum line width in the lateral direction of the high refractive index layers 121 is 0.15 μm, and the thickness of the lens is 0.5 μm.

FIG. 8B is a diagram illustrating the simulation result of the optical property of the first embodiment (modification 2) shown in FIG. 8A, which is the result of green light ($\lambda$=540 nm). As can also be understood from this, even with an arrangement wherein while all widths are set to be equal regarding the layers having a great refractive index (high refractive index layer 121_$k$), the widths of the low refractive index layers 120 decrease gradually toward the center of the lens, the green light ($\lambda$=540 nm) can be condensed with the alternate placement layer 112A by setting the number, widths, boundary distance of each of the low refractive index layer 120_$j$ and high refractive index layer 121_$k$ within the alternate placement layer 112A appropriately, thereby providing a convex lens effect.

Though not shown in the drawing, with regard to near-infrared light ($\lambda$=780 nm), red light ($\lambda$=640 nm), and blue light ($\lambda$=460 nm) as well, the same convex lens effect is provided.

Thus, the first embodiment (modification 2) is employed, which has a configuration wherein the high refractive index layer 121_k having a great refractive index has an equal width, and the width of the low refractive index layer 120_j decreases gradually toward the center of the lens, whereby a configuration can be realized wherein the high refractive index layer 121_k having a great refractive index is disposed, in a plate shape, densely at the center and disposed non-densely farther away from the center, and accordingly, it can be found that a condensing property exists like the first embodiment (basic example and application examples 1 through 4 thereof).

With the configuration of the first embodiment (modification 2), there is provided an advantage wherein fabrication of a lens is facilitated. That is to say, in a case wherein, with a process for etching the high refractive index layers 121 using lithography, it is difficult to perform narrow width lithography or etching process such that widths cannot be narrowed due to insufficient lithography resolution, or width controllability deteriorates due to occurrence of side etching at the time of the etching process, fabrication can be made by setting the widths of the high refractive index layers 121 to equal widths that can be subjected to etching using lithography as with modification 2. Particularly, this becomes an effective tool when this width that can be subjected to etching using lithography is just at the wavelength order, where if the width is expanded further, continuity of equiphase wave surfaces (wave surfaces) is lost.

<Second Embodiment: Convex Lens+Oblique Incident Light Correction (Separate Type)>

Figure 9:
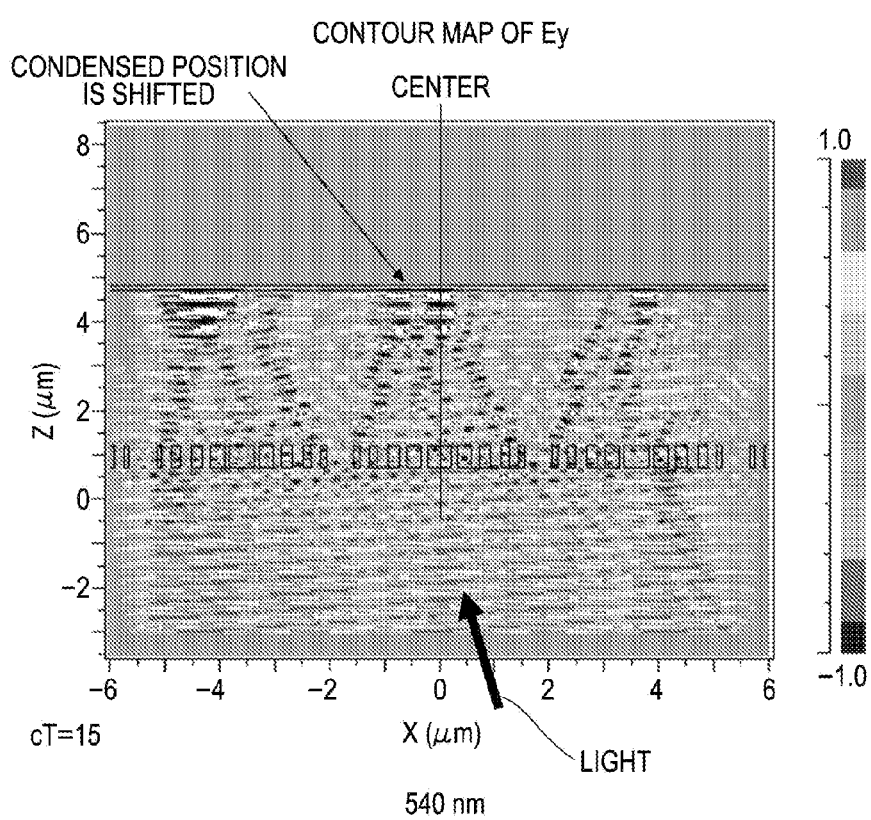
FIG. 9 is a diagram illustrating the simulation result when oblique incident light is entered with the configuration of the first embodiment (e.g., application example 1 in FIG. 2A)
Figure 10C:
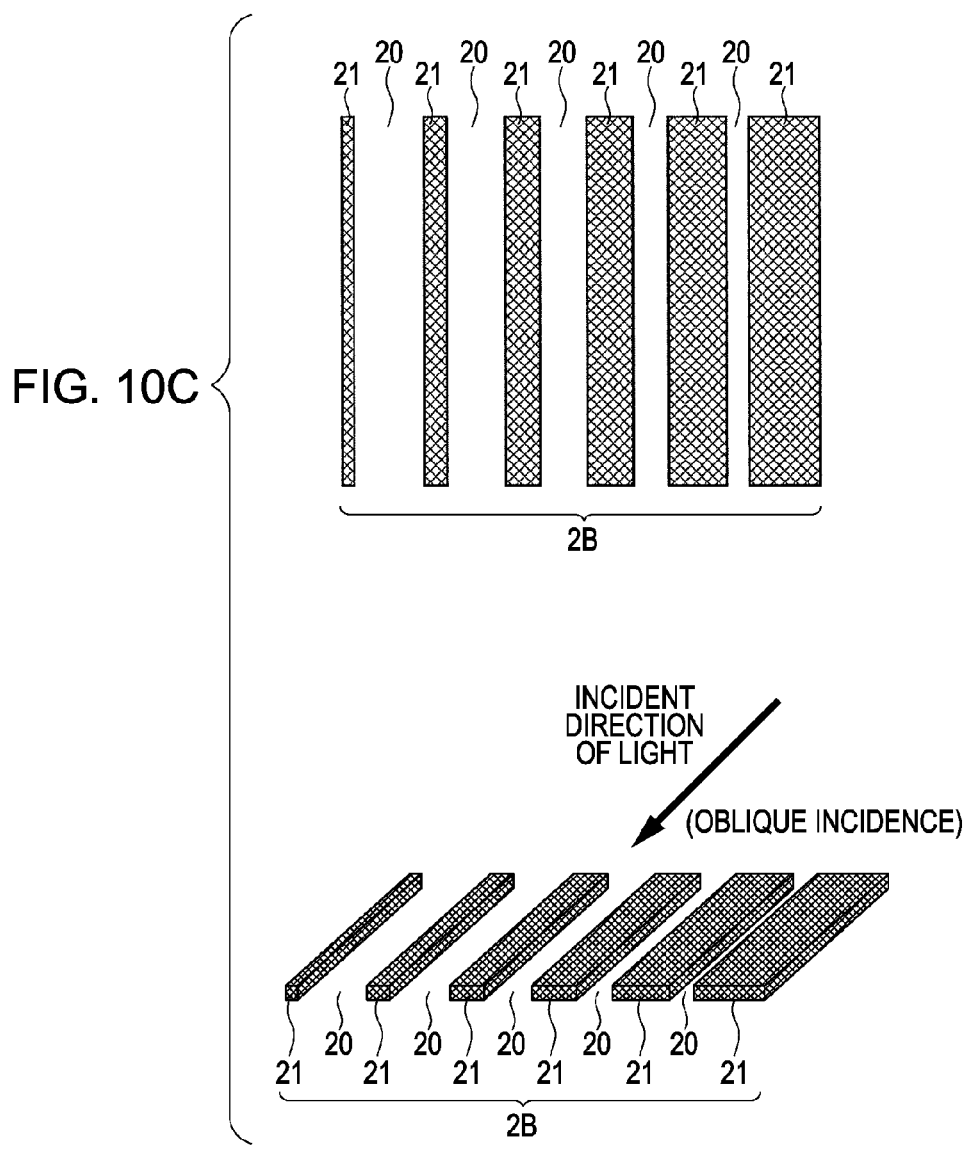
FIG. 10C is a plan schematic view equivalent to a single optical lens according to the second embodiment.
Figure 10D:
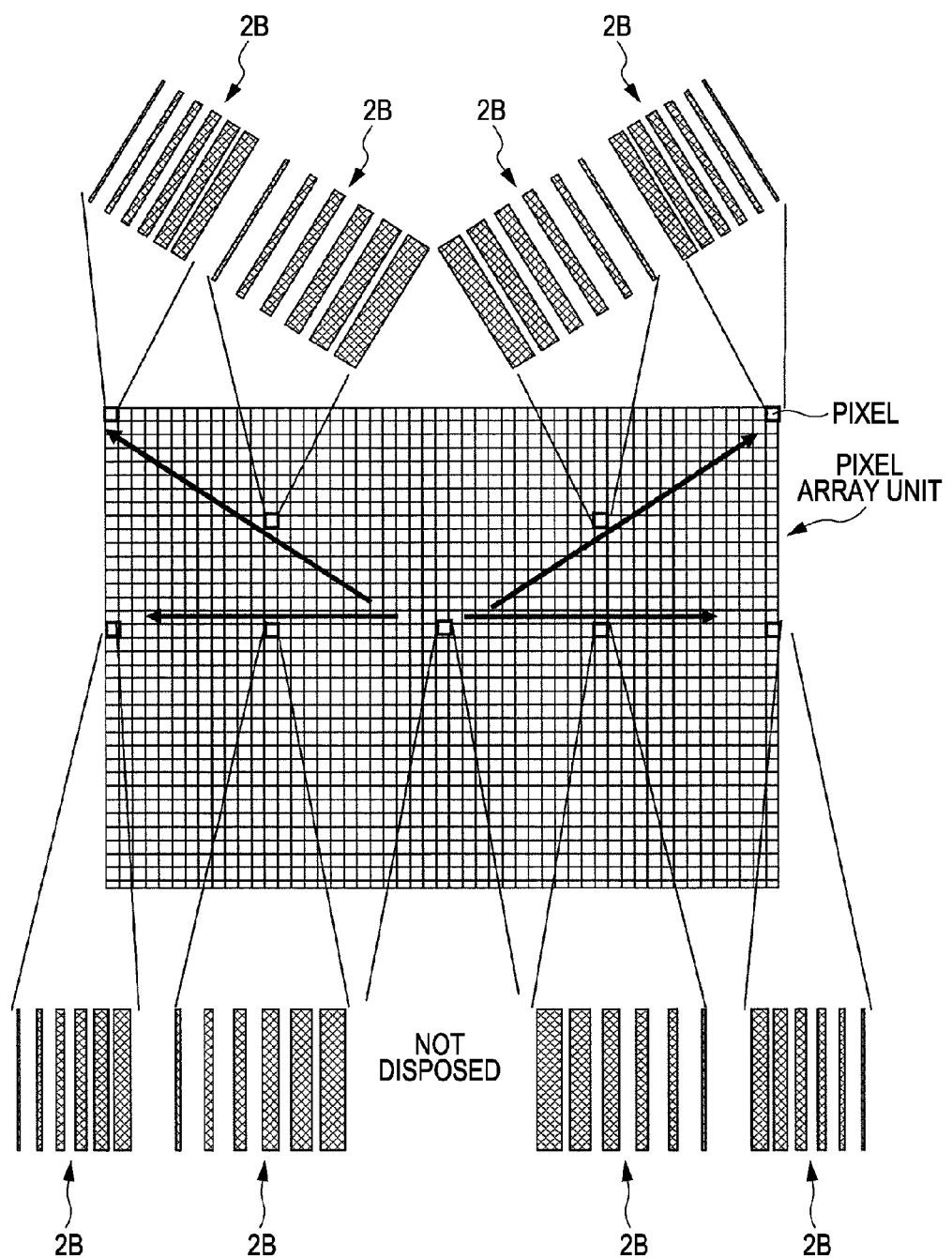
FIG. 10D is a plan schematic view in a case wherein the optical lens according to the second embodiment is applied onto the pixel array unit of the solid-state imaging device.

FIGS. 9 through 10D are diagrams for describing the basic principle of an optical lens according to a second embodiment. Here, FIG. 9 is a diagram illustrating the simulation result when oblique incident light enters with the configuration of the first embodiment (e.g., application example 1 in FIG. 2A). FIG. 10A is a diagram illustrating an equiphase wave surface for describing the basic principle of the optical lens according to the second embodiment. FIG. 10B is a diagram for describing the light reception optical system of the solid-state imaging device 100A. FIG. 10C is a plan schematic view of a single optical lens according to the second embodiment. FIG. 10D is a plan schematic view in a case wherein the optical lens according to the second embodiment is applied onto the pixel array unit of the solid-state imaging device. Note that, in FIG. 10D, with regard to a lens shape according to the alternate placement layer of each pixel, representative positions alone are illustrated by being extracted and enlarged from the entire pixel array unit.

The lens configuration according to the second embodiment has a feature in that a correction mechanism as to incidence of oblique incident light is provided. A different point as to a later-described third embodiment is that an optical member having an oblique incident light correction function is added to the alternate placement layer 112A having the convex lens function as a separate member (disposed in another layer).

With the configuration of the first embodiment (e.g., application example 1 in FIG. 2A), when oblique incident light enters, as shown in FIG. 9, it can be found that a condensed position is somewhat shifted in the lateral direction as the lens center. This is common to a phenomenon caused even with a normal spherical lens. Accordingly, with the configuration of the optical lens according to the first embodiment, there is a possibility that a color mixture problem caused by undesirable oblique incident light entering from an adjacent pixel, or a shading problem wherein deterioration in sensitivity at an end portion of the pixel array unit is caused at an image sensor.

With the configuration of the optical lens according to the second embodiment, in order to reduce a problem caused by incidence of oblique incident light, there is provided a correction function for converting oblique incident light into vertical incident light. The arrangement of the correction function thereof has, as shown in FIG. 10A, a feature in that with the lens center as a boundary, at one side (left side in the illustrated example) many high refractive index layers 21 having a great refractive index exist by ratio, and at the opposite side (right side in the illustrated example) a few high refractive index layers 21 exist by ratio. It goes without saying that the present embodiment differs from the above-mentioned first embodiment in that the left and right of the lens are asymmetric.

In order to provide a correction function as to incidence of oblique incident light by employing a configuration wherein with the lens center as a boundary, at one side (left side in the illustrated example) many high refractive index layers 21 having a great refractive index exist by ratio, and at the opposite side (right side in the illustrated example) a few high refractive index layers 21 exist by ratio, for example, when focusing on the high refractive index layers 21, a first oblique incident light correction method can be employed assuming that the widths of the high refractive index layers 21 having a great refractive index increase gradually in one direction (at the left side in the illustrated example) at one cycle of the optical lens (i.e., lens size). Conversely, when focusing on the low refractive index layers 20, a second oblique incident light correction method can also be employed assuming that the widths of the low refractive index layers 20 having a small refractive index increase gradually in one direction (at the right side in the illustrated example) at one cycle of the optical lens (i.e., lens size). Further, a third oblique incident light correction method can also be employed wherein the first and second oblique incident light correction methods are employed together. From the perspective of correction efficiency, it is most effective to employ the third oblique incident light correction method.

The optical lens according to the second embodiment has a function for converting oblique incident light into vertical incident light (referred to as an incident angle conversion function), so differs from a later-described third embodiment in that the center of gravity of asymmetry becomes the end portion of the optical lens (the center of the high refractive index layer 21L_4 at the left end in FIG. 10A). Note that description will be made at the third embodiment regarding the definition of "center of gravity".

In other words in view of the configuration description of a later-described third embodiment, the first oblique incident light correction method is a method assuming a configuration wherein the widths of the high refractive index layers 21 having a great refractive index increase gradually toward the optical center of gravity position (the other end side of the lens in the present example) from one end side of the member (lens: alternate placement layer 2B). Similarly, in other words in view of the configuration description of a later-described third embodiment, the second oblique incident light correction method is a method assuming a configuration wherein the widths of the low refractive index layers 20 having a small refractive index decreases gradually toward the optical center of gravity position (the other end side of the lens in the present example) from one end side of the member (lens: alternate placement layer 2B). As can also be understood from this description, with regard to the fundamental policy of the incident angle conversion function, there is no difference between the second and third embodiments.

First, as shown in FIG. 10A, let us say that there are provided several (six of 1_1 through 1_6 in the drawing) plate-shaped single material layers 1 having a refractive index n0 alone exist at the light output side, and adjacent thereto (specifically, layer 1_6) a plate-shaped layer (referred to as an alternate placement layer) 2B where rectangular layers (referred to as low refractive index layers) 20 having the refractive index n0 and rectangular layers (referred to as high refractive index layers) 21 having a refractive index n1 higher (greater) than the refractive index n0 (n1>n0) are arrayed alternately in the lateral direction. Though not shown in the drawing, it may be conceived that a plate-shaped single material layer having the refractive index n0 alone is provided at the light incident side of the alternate placement layer 2B. Though details will be described later, the alternate placement layer 2B serves as an optical lens function for converting oblique incident light into vertical incident light.

With the arrangement of the basic example of the second embodiment shown in the drawing, as a configuration is employed wherein at the left side as to the center CL many high refractive index layers 21 having a great refractive index exist by ratio, and at the right side a few high refractive index layers 21 exist by ratio, the widths of the high refractive index layers 21L_1 through 21L_4 at the left side are configured so as to decrease gradually toward the center CL, and the widths of the high refractive index layers 21R_1 through 21R_4 at the right side are configured so as to increase gradually toward the center CL, and the widths of the high refractive index layers 21 having a great refractive index are configured so as to increase gradually in one direction from right to left.

Additionally, the widths of the low refractive index layers 20L_1 through 20L_3 at the left side are configured so as to increase gradually toward the center CL, and the widths of the low refractive index layers 20R_1 through 20R_3 at the right side are configured so as to decrease gradually toward the center CL, and the widths of the low refractive index layers 20 having a small refractive index are configured so as to decrease gradually in one direction from right to left.

That is to say, with the basic example of the second embodiment, the above-mentioned third oblique incident light correction method is employed wherein the above-mentioned first and second oblique incident light correction methods are employed together. Thus, as shown in the drawing, oblique incident light can be converted into vertical incident light.

With the comparison as to the alternate placement layer 2A according to the first embodiment shown in FIG. 1B, with the lens center of the alternate placement layer 2A as a boundary, employing only one configuration (right side alone in the example shown in the drawing) of the left and right configurations is equivalent to the alternate placement player 2B according to the second embodiment. With the alternate placement layer 2A according to the first embodiment, a function for converting the route of incident light into the center side is activated at the left and right with the lens center as a boundary, and it can be conceived that employing only one side of the function thereof is equivalent to the alternate placement layer 2B according to the second embodiment.

Such an alternate placement layer 2B is applied to the solid-state imaging device 100A by being disposed at the light incident side or light emission side or both thereof of the alternate placement layer 2A, whereby a function can be realized wherein a condensed point of the convex lens function is moved to the center of a pixel or above the photoelectric conversion unit 104 in a sure manner.

With the lens configuration according to the second embodiment, the alternate placement layer 2B having such an incident angle conversion function for converting oblique incident light into vertical incident light is layered on the alternate placement layer 2A according to the first embodiment which serves as an optical lens function having a condensing effect. At this time, there may be employed a configuration wherein the alternate placement layer 2B is disposed at the light incident side, i.e., a configuration wherein the alternate placement layer 2B having the incident angle conversion function is layered above the alternate placement layer 2A having the convex lens function.

Alternatively, there may be employed a configuration wherein the alternate placement layer 2A is disposed at the light incident side, i.e., a configuration wherein the alternate placement layer 2B having the incident angle conversion function is layered below the alternate placement layer 2A having the convex lens function. Further, there may be employed a configuration the alternate placement layer 2B is disposed both at the light incident side and at the light emission side, i.e., a configuration wherein the alternate placement layer 2B having the incident angle conversion function is layered both above and below of the alternate placement layer 2A having the convex lens function.

If oblique incident light can be converted into vertical incident light, there can be solved a color mixture problem wherein light enters from an adjacent pixel, and a shading problem wherein deterioration in sensitivity becomes pronounced at the end portion of the pixel array unit.

For example, in the event that this effect is applied to the solid-state imaging device 100A, as shown in FIG. 10B, the principal ray from an image formation lens assumes oblique incidence when the incident position is closer to the end portion of the pixel array unit, so this effect becomes more effective by weakening an oblique correction function at the center of the pixel array unit, and enhancing the correction function toward the end portion of the pixel array unit. For example, the closer the incident position is to the end portion of the pixel array unit, the higher the asymmetry of rate of the high refractive index layers 21 having a great refractive index is.

As can be clearly understood from the configuration shown in FIG. 10A, the lens thickness thereof is the thickness of the alternate placement layer 2B where the rectangular high refractive index layer 21_k having a great refractive index and the rectangular low refractive index layer 20_j having a small refractive index are arrayed alternately in the lateral direction, whereby an extremely thin incident angle conversion lens (oblique light correction lens) can be provided. For example, the thickness of the lens can be reduced to 0.5 μm or less.

With a plan configuration also, the alternate placement layer 2B needs to have a configuration wherein, with the lens center as a boundary, at one side many high refractive index layers 21 having a great refractive index exist by ratio, and at the opposite side a few high refractive index layers 21 exist by ratio, and as long as this is satisfied, various types of plan configuration can be employed.

For example, as shown in FIG. 10C, there may be employed a configuration wherein the linear low refractive index layers 20 and linear high refractive index layers 21 are arrayed by being shifted to one side with a predetermined width. Also, though not shown in the drawing, there may be employed curved low refractive index layers 20 and curved high refractive index layers 21.

In the event that the alternate placement layer 2B is applied to the pixel array unit of the solid-state imaging device 100A in combination with the alternate placement layer 2A serving as a convex lens, incidence of oblique incident light causes no problem at the center of the pixel array unit, so there is no need to provide the alternate placement layer 2B at the center thereof. On the other hand, incidence of oblique incident light causes a problem the closer the incident position is to the end portion of the pixel array unit. Therefore, as shown in FIG. 10D, for example, the alternate placement layer 2B having a configuration wherein the linear low refractive index layers 20 and linear high refractive index layers 21 are arrayed by being shifted to one side with a predetermined width such as shown in FIG. 10C is disposed such that the optical axis faces the center of the pixel array unit.

At this time, an arrangement needs to be made wherein the incident angle conversion function is enhanced the closer the incident position is to the end portion of the pixel array unit, and the change level of rate of the low refractive index layers 20 and high refractive index layers 21 is enhanced the closer the incident position is to the end portion of the pixel array unit. That is to say, it is desirable to provide a configuration wherein there is no asymmetry at the center of the pixel array unit, and asymmetry is enhanced the closer the incident position is to the end portion of the pixel array unit.

Here, the example is shown in a case wherein the photoelectric conversion elements (light reception portions) are arrayed in a two-dimensional manner, but this can also be applied to a case wherein the photoelectric conversion elements (light reception portions) are arrayed in a one-dimensional manner.

Thus, oblique incidence of the principal ray is corrected the closer the incident position is to the end portion of the pixel array unit, whereby the condensed point of each convex lens according to the alternate placement layer 2A can be brought to the center of a pixel. Such a lens shape is provided within the solid-state imaging device 100B (i.e., formed integral with the solid-state imaging device 100B), whereby deterioration in sensitivity (shading) caused at the end portion of the pixel array unit can be reduced without proving a pupil correction mechanism, and color mixtures can be reduced, and accordingly, color reproducibility can be improved.

<Second Embodiment: Application Example of Incident Angle Conversion Function>

Figure 11A:
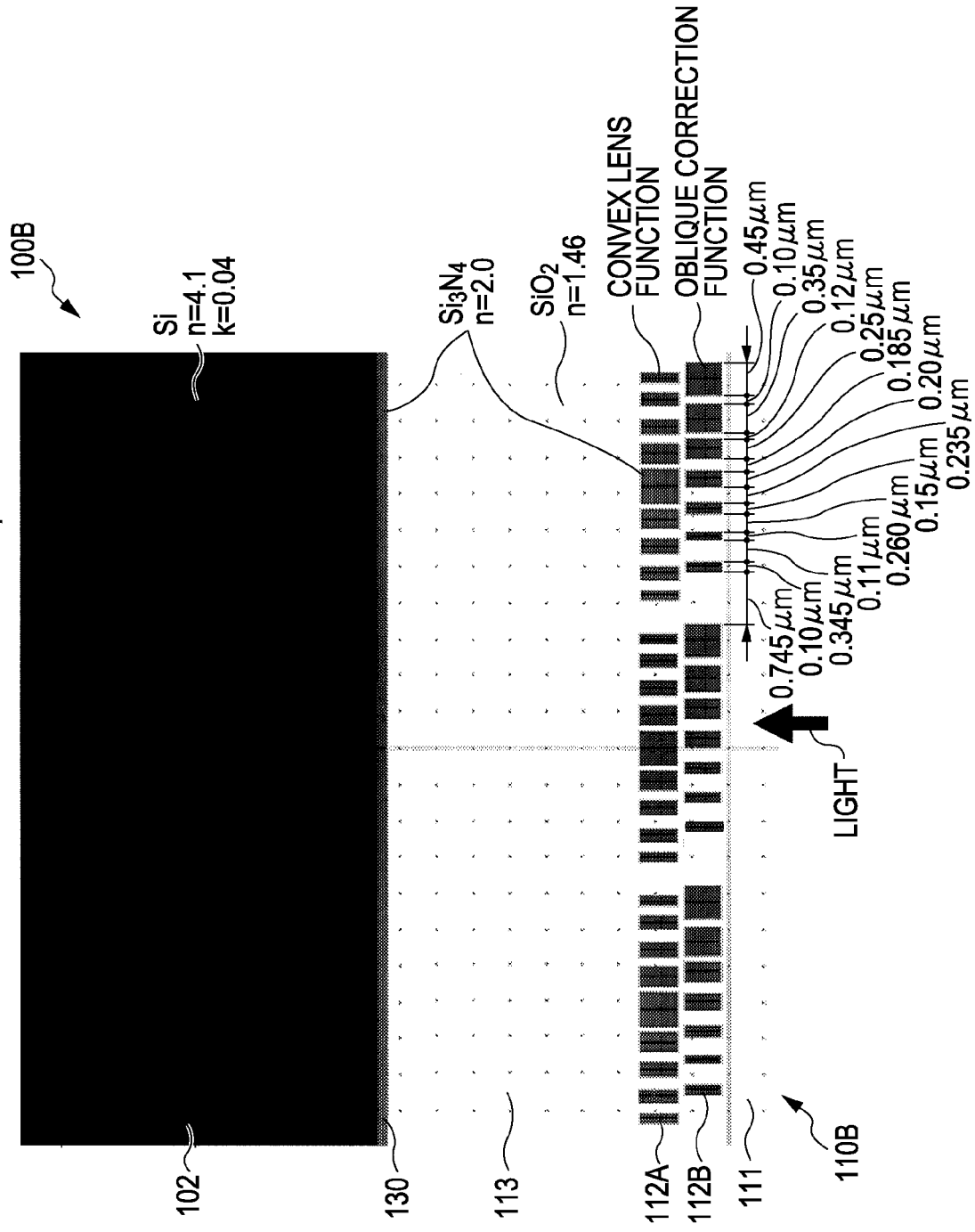
FIG. 11A is a cross-sectional schematic view for describing the solid-state imaging device to which the optical lens according to the second embodiment is applied.
Figure 11B:
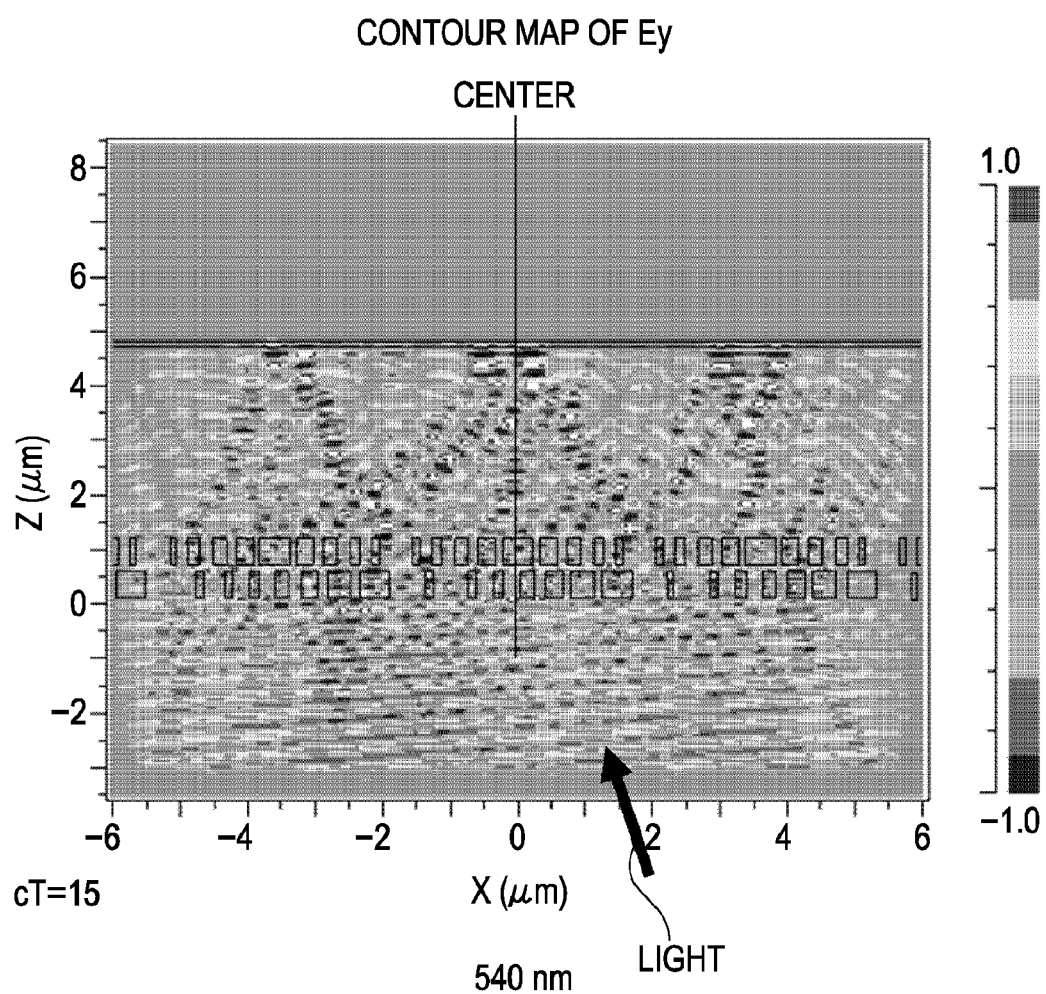
FIG. 11B is a diagram illustrating the simulation result of the solid-state imaging device according to the second embodiment ($\lambda$=540)

FIGS. 11A and 11B are diagrams for describing a solid-state imaging device to which the optical lens according to the second embodiment is applied. Here, FIG. 11A is a cross-sectional schematic view of a solid-state imaging device to which the alternate placement layer 2B having the incident angle conversion function is applied, and FIG. 11B is a diagram illustrating the simulation result of the optical property thereof.

As shown in FIG. 11A, the solid-state imaging device 100B according to the second embodiment is provided with the solid-state imaging device 100A according to comparative example 1 of the alternate placement layer 2A according to the first embodiment shown in FIG. 2A as the base, and further includes an optical lens 110B where an alternate placement layer 112B having the incident angle conversion function (oblique correction function) is disposed at the light incident side (under space) of the alternate placement layer 112A having the convex lens function. Thus, the optical lens 110B according to the second embodiment is configured so as to include the convex lens function by the alternate placement layer 112A and the oblique correction function by the alternate placement layer 112B separately.

The placement relation between the alternate placement layer 112A and alternate placement layer 112B shown in FIG. 11A is illustrated in a case wherein light enters from the lower right side of space. Note that the center of an incident angle conversion lens (oblique light correction lens) according to the alternate placement layer 112B is somewhat shifted to the right side of space as to the center of a convex lens according to the alternate placement layer 112A.

With the second embodiment (application example), of the optical lens 110B, the widths of the low refractive index layer $120\_j$ and high refractive index layer $121\_k$ (both are not shown in the drawing) within the alternate placement layer 112B during one cycle (pixel size=3.6 μm) are set as follows.

high refractive index layer 121R_4: 0.45 μm
high refractive index layer 121R_3: 0.35 μm
high refractive index layer 121R_2: 0.25 μm
high refractive index layer 121R_1+high refractive index layer 121L_1: 0.20 μm
high refractive index layer 121L_2: 0.15 μm
high refractive index layer 121L_3: 0.11 μm
high refractive index layer 121L_4: 0.10 μm
low refractive index layer 120R_3: 0.10 μm
low refractive index layer 120R_2: 0.12 μm
low refractive index layer 120R_1: 0.185 μm
low refractive index layer 120L_1: 0.235 μm
low refractive index layer 120L_2: 0.260 μm
low refractive index layer 120L_3: 0.345 μm
low refractive index layer 120L_4: 0.745 μm FIG. 11B is a diagram illustrating the simulation result of the optical property of the second embodiment (application example) shown in FIG. 11A, which is the result of the oblique incident light of green light ($\lambda$=540 nm) being entered in the solid-state imaging device 100B. As can also be understood from this, the alternate placement layer 112B, which has a configuration wherein, with the lens center as a boundary, at one side many high refractive index layers 121 having a great refractive index exist by ratio, and at the opposite side a few high refractive index layers 121 exist by ratio, is disposed so as to be superimposed on the alternate placement layer 112A, whereby the oblique incident light of green light can be condensed generally at the center of the convex lens according to the alternate placement layer 112A. This means that an oblique correction function according to the incident angle conversion function works effectively.

Though omitted in the drawing, with regard to near-infrared light ($\lambda$=780 nm), red light ($\lambda$=640 nm), and blue light ($\lambda$=460 nm) as well, there is similarly an oblique correction function effect wherein oblique incident light is condensed generally at the center of the convex lens according to the alternate placement layer 2A.

The convex lens function according to the alternate placement layer 112A and the incident angle conversion function (oblique correction function) according to the alternate placement layer 112B are included in the solid-state imaging device 100B, whereby oblique incident light can be converted into vertical incident light, shading and color mixtures can be reduced, and high image quality can be achieved.

<Third Embodiment: Convex Lens+Oblique Incident Light Correction (Integrated Type)>

Figure 12D:
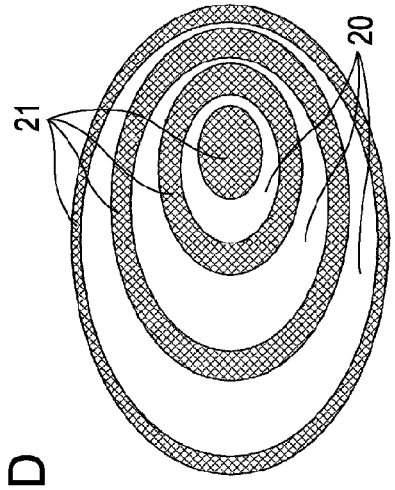
FIGS. 12C through 12F are plan schematic views (Part 1) of a solid-state imaging device to which the optical lens according to the third embodiment is applied.

FIGS. 12A through 12H are diagrams for describing the basic principle of an optical lens according to a third embodiment. Here, FIG. 12A is a diagram illustrating an equiphase wave surface for describing the basic principle of the optical lens according to the third embodiment. FIG. 12B is a diagram for describing the center of gravity of a lens, and FIGS. 12C through 12H are plan schematic views of the optical lens according to the third embodiment.

The lens configuration according to the third embodiment has a feature in that a correction mechanism as to incidence of oblique incident light is provided, and is common to the second embodiment in this point. A different point as to the above-mentioned embodiment is that there is employed an alternate placement layer combining both of the convex lens function and oblique incident light correction function.

As shown in FIG. 12A, the basic concept of an alternate placement layer 2C according to the third embodiment is to apply the arrangement of the alternate placement layer 2B according to the second embodiment having an asymmetric configuration wherein, with the lens center as a boundary, at one side many high refractive index layers having a high refractive index exist by ratio, and at the opposite side few high refractive index layers exist by ratio, with the alternate placement layer 2A having a symmetric configuration wherein the layers having a great refractive index are disposed, in a plate shape, densely at the center and disposed non-densely farther away from the center as the base.

That is to say, the alternate placement layer 2C according to the third embodiment has a feature in that the convex lens function and incident angle conversion function (oblique incident light correction function) are included simultaneously by including a configuration wherein the layers having a great refractive index of which the widths are equal to or smaller than the wavelength order are disposed, in a plate shape, densely at the center and disposed non-densely farther away from the center, and including an asymmetric configuration in the lateral direction as to the lens center.

A configuration is included wherein the widths of the high refractive index layers 21 having a great refractive index increase gradually toward asymmetric center of gravity, as viewed from either side of center of gravity. Also, a configuration is included wherein widths of the low refractive index layers 20 having a small refractive index decrease gradually toward asymmetric center of gravity. A difference as to the first embodiment is in that at one side of the left and right sides the array of the low refractive index layers 20 and high refractive index layers 21 are disposed non-densely, and at the other side are disposed densely as to the center of gravity of the lens.

In order to apply an asymmetric configuration to the alternate placement layer 2A having a symmetric configuration, for example, a first asymmetrization method can be employed assuming a configuration wherein the widths of the high refractive index layers 21 having a great refractive index increase gradually toward the optical center of gravity position from one end portion side of a member (lens: alternate placement layer 2C), i.e., a configuration wherein the widths of the high refractive index layers 21 having a great refractive index increase gradually toward asymmetric center of gravity.

Alternatively, a second asymmetrization method can be employed assuming a configuration wherein the widths of the low refractive index layers 20 having a small refractive index decrease gradually toward the optical center of gravity position from one end portion side of the member (lens: alternate placement layer 2C), i.e., a configuration wherein the widths of the low refractive index layers 20 having a small refractive index decrease gradually toward asymmetric center of gravity. Alternatively, a third asymmetrization method can be employed wherein the first and second asymmetrization methods are employed together. From the perspective of efficiency of asymmetrization, it is most effective to employ the third asymmetrization method.

Now, description will be made regarding "center of gravity" with reference to FIG. 12B. Within a pixel matrix or certain area face, let us say that the refractive index of the high refractive index layers 21 having a great refractive index is n1, and the refractive index of the low refractive index layers 20 having a small refractive index is n0. In a case wherein, with the (x, y) coordinates within a plane, the following Expression (1) holds, the position (x1, y1) thereof is defined as optical center of gravity.

$$\int\int_D (x_1 - x)(y_1 - y)f(x, y)dxdy = 0 \qquad (1)$$

This means that integration of the primary moment of a surrounding refractive index is 0 at the center of gravity position. FIG. 12B illustrates a conceptual diagram of a center of gravity position in the case of one dimension, but in reality, the center of gravity position is two dimensions, so becomes (x, y) coordinates, and simultaneously, a position satisfying a condition wherein integration of (x, y) becomes 0 is center of gravity in two dimensions.

In the case of the first embodiment, a symmetric configuration is included wherein the high refractive index layers 21 having a great refractive index are disposed densely at the center and disposed non-densely farther away from the center, so center of gravity is identical to the mechanical center of the lens. In the case of the second embodiment, it can be conceived that only one side of the left and right of the first embodiment having a symmetric configuration is used, and accordingly, the end portion of the optical lens is center of gravity, i.e., asymmetric center of gravity.

On the other hand, in the case of the third embodiment, the second embodiment is applied to the first embodiment having a symmetric configuration such that the rate of the high refractive index layers 21 having a great refractive index is asymmetrical at the left and right thereof, so center of gravity is shifted as to the mechanical center of the lens, and becomes asymmetric center of gravity. This is also apparent from the plan schematic views shown in FIGS. 12C through 12H.

That is to say, it goes without saying that with a plan configuration as well, the alternate placement layer 2C according to the third embodiment there employs a configuration wherein the second embodiment is applied to the first embodiment. For example, in the case of employing a circular configuration similar to the alternate placement layer 2A according to the first embodiment, as for the shape of each of the high refractive index layer 21_k having a great refractive index and low refractive index layer 20_j having a small refractive index, an arbitrary shape can be employed, such as a circle, ellipse, regular square, rectangle, triangle, or the like. Subsequently, of these shapes, a circular shape should be formed of shapes as can be regarded as the same or different shapes such that the width of each ring differs gradually between the left and right sides at not the lens center but the center of gravity as a boundary.

Figure 12F:
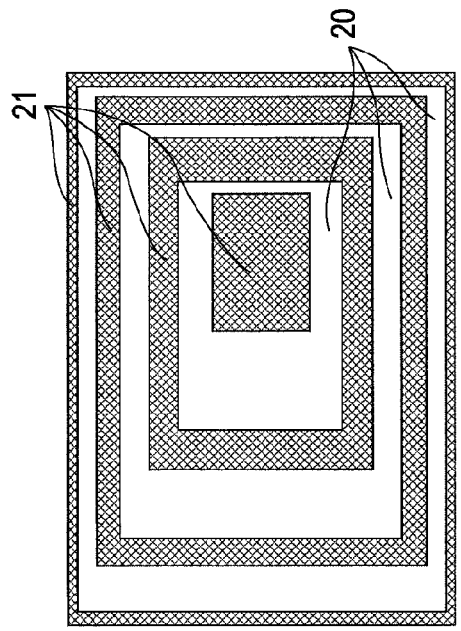
Figure 12C:
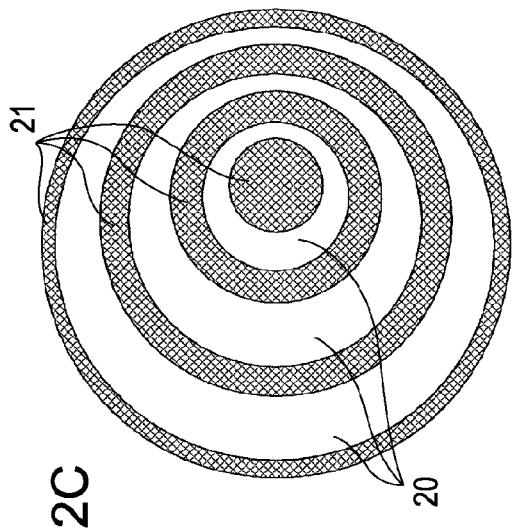

For example, FIG. 12C corresponds to FIG. 1C, wherein an asymmetric circle or circular ring shape is employed such that each of the high refractive index layer 21_k and low refractive index layer 20_j has a circle or circular ring shape, and as for the width of each ring, with the lens center as a boundary, at the left side the low refractive index layers 20 decreases gradually toward the lens center, and the high refractive index layers 21 increases gradually toward center of gravity, and at the right side the low refractive index layers 20 decreases gradually toward center of gravity, and the high refractive index layers 21 increases gradually toward the lens center, and each width and change level thereof differ at both sides.

Figure 12E:
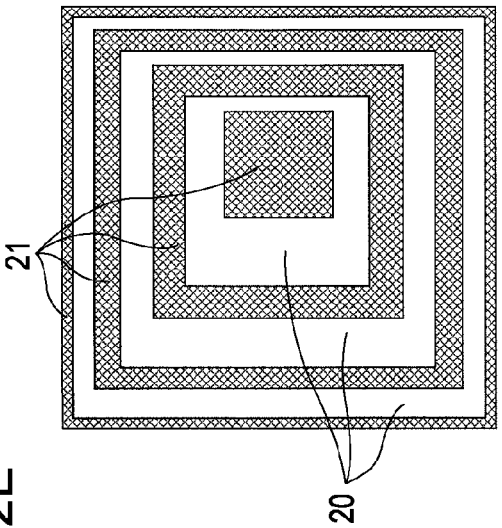

FIG. 12D corresponds to FIG. 1D, wherein an asymmetric ellipse or elliptical circular shape is employed. FIG. 12E corresponds to FIG. 1E, wherein an asymmetric regular square or square circular shape is employed. FIG. 12F corresponds to FIG. 1F, wherein an asymmetric rectangle or rectangular circular shape is employed.

It goes without saying that the total condensing effects of the respective lenses are affected with the plan configuration of the alternate placement layer 2A, i.e., the plan configuration regarding how the high refractive index layers 21 and low refractive index layers 20 are arrayed, so in the case of applying this to a solid-state imaging device, it is desirable to adjust the shape of the plan configuration exemplified in FIGS. 12C through 12F, particularly the shape of the high refractive index layer 21_1 of center of gravity to the plan shape of the light reception portion.

Figure 12H:
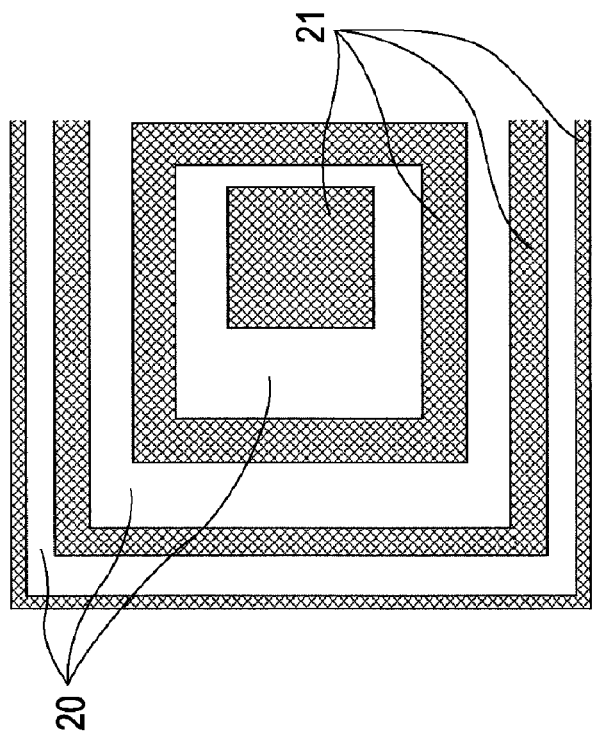
FIGS. 12G through 12H are plan schematic views (Part 2) of the solid-state imaging device to which the optical lens according to the third embodiment is applied.
Figure 12G:
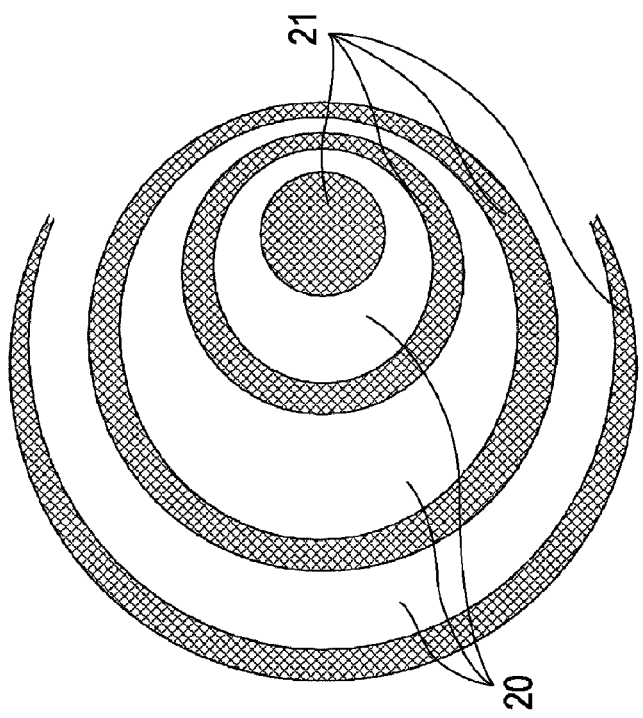

Also, the function for converting oblique incident light into vertical light exists at either side as to center of gravity, so a configuration employing any one side as to center of gravity can also be employed. For example, as shown in FIG. 12G, there may be employed a configuration wherein as to the plan layout shown in FIG. 12C, a part of the circular low refractive index layer 20_j having a small refractive index or circular high refractive index layer 21_k having a great refractive index is missing, so a circular shape cannot be formed. Alternatively, as shown in FIG. 12H, there may be employed a configuration wherein as to the plan layout shown in FIG. 12E, a part of the rectangular low refractive index layer 20_j having a small refractive index or rectangular high refractive index layer 21_k having a great refractive index is missing, so a circular shape cannot be formed.

In the case of applying to the pixel array unit of the solid-state imaging device 100C, there is no problem due to incidence of oblique incident light at the center of the pixel array unit, so at the center thereof there is no need to provide an oblique light correction effect. On the other hand, incidence of oblique incident light causes a problem the closer the incident position is to the end portion of the pixel array unit. Therefore, there is a need to provide an arrangement such that the incident angle conversion function is enhanced the closer the incident position is to the end portion of the pixel array unit, and the change level of rate of the low refractive index layers 20 and high refractive index layers 21 is enhanced the closer the incident position is to the end portion of the pixel array unit.

That is to say, it is desirable to employ a configuration wherein there is no asymmetry at the center of the pixel array unit, and asymmetry is enhanced the closer the incident position is to the end portion of the pixel array unit. The other side of the coin is that it is desirable to employ a configuration wherein the position of an asymmetric center of gravity position is shifted in the center direction of the pixel array unit from the center of a pixel (photoelectric conversion unit, light reception portion) the closer the incident position is to the end portion of the pixel array unit.

Here, the example is shown in a case wherein the photoelectric conversion elements (light reception portions) are arrayed in a two-dimensional manner, but this can also be applied to a case wherein the photoelectric conversion elements (light reception portions) are arrayed in a one-dimensional manner.

Thus, similar to the second embodiment, oblique incidence of the principal ray is corrected the closer the incident position is to the end portion of the pixel array unit, whereby the condensed point of each convex lens according to the alternate placement layer 2A can be brought to the center of a pixel. Such a lens shape is provided within the solid-state imaging device 100C (i.e., formed integral with the solid-state imaging device 100C), whereby deterioration in sensitivity (shading) caused at the end portion of the pixel array unit can be reduced, color mixtures can be reduced, and accordingly, color reproducibility can be improved. Additionally, the convex lens effect and oblique light correction effect are realized by the single alternate placement layer 2C, whereby the configuration can be reduced in size.

<Third Embodiment: Application Example 1 of Convex Lens Function+Incident Angle Conversion Function>

Figure 13B:
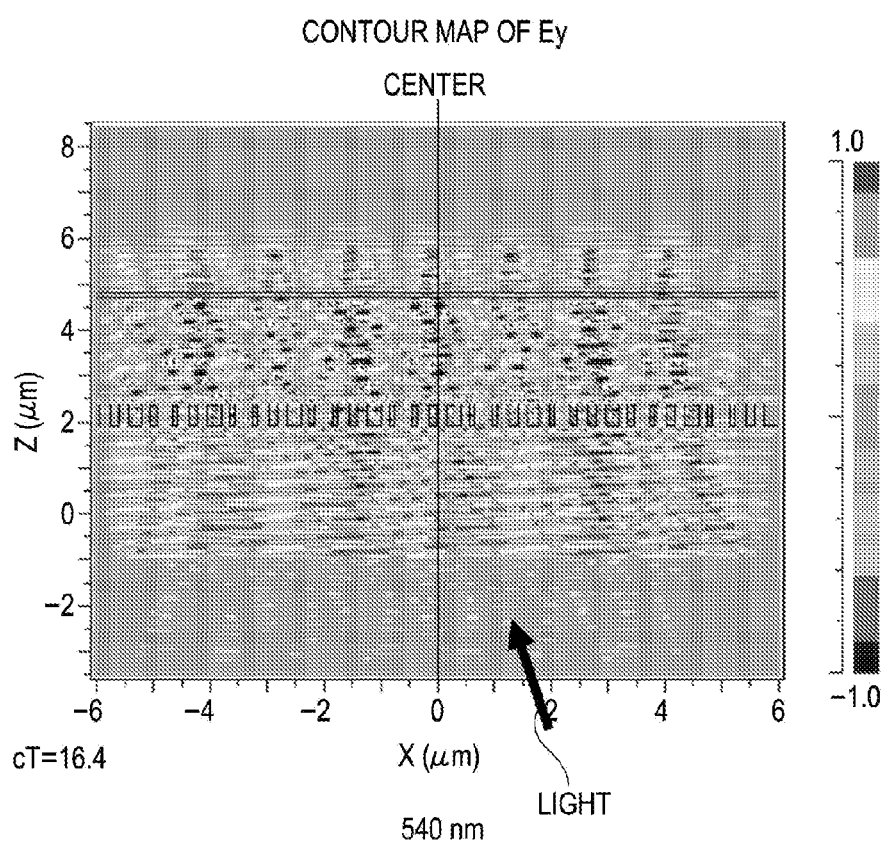
FIG. 13B is a diagram illustrating the simulation result of the third embodiment (application example 1) ($\lambda$=540 nm)

FIGS. 13A and 13B are diagrams for describing a first example (application example 1) of a solid-state imaging device to which the optical lens according to the third embodiment is applied. Here, FIG. 13A is the cross-sectional schematic view of the solid-state imaging device according to the third embodiment (application example 1), and FIG. 13B is a diagram illustrating the simulation result of the optical property thereof.

As shown in FIG. 13A, the solid-state imaging device 100C according to the third embodiment (application example 1) is provided with the solid-state imaging device 100A according to comparative example 4 of the alternate placement layer 2A according to the first embodiment shown in FIG. 5A as the base, wherein the pixel size and lens size are 1.4 μm.

With the third embodiment (application example), of the optical lens 110C, the widths of the low refractive index layer 120_j and high refractive index layer 121_k (both are not shown in the drawing) within the alternate placement layer 112C during one cycle are set as follows.

high refractive index layer 121R_1+high refractive index layer 121L_1: 0.25 μm
   high refractive index layer 121R_2: 0.10 μm
   high refractive index layer 121L_2: 0.15 μm
   high refractive index layer 121L_3: 0.10 μm
   low refractive index layer 120R_1: 0.14 μm
   low refractive index layer 120L_1: 0.155 μm
   low refractive index layer 120L_2: 0.195 μm Also, with the upper and lower sides of each high refractive index layers 121_k made up of silicon nitride SiN of the alternate placement layer 112C making up a principal portion of the optical lens 110C, a thin film (thickness=0.08 μm) made up of SiON with the refractive index n4 of 1.7 is provided thereto as an antireflection film 124 with the same width as each high refractive index layer 121_k. This point is similar to the application example 4 of the first embodiment.

FIG. 13B is a diagram illustrating the simulation result of the optical property of the third embodiment (application example 1) shown in FIG. 13A, which is the result of oblique incident light of green light (λ=540 nm) entering in the solid-state imaging device 100C. As can also be understood from this, even in the case of employing a single alternate placement layer 112C including both of the arrangement of the alternate placement layer 112A according to the first embodiment having the convex lens function and the arrangement of the alternate placement layer 112B according to the second embodiment having the oblique incident angle conversion function (light correction function), the oblique incident light of green light can be condensed generally at the center of the convex lens according to the alternate placement layer 112C. This means that an oblique correction function according to the incident angle conversion function works effectively.

Though omitted in the drawing, with regard to near-infrared light (λ=780 nm), red light (λ=640 nm), and blue light (λ=460 nm) as well, there is similarly an oblique correction function effect wherein oblique incident light is condensed generally at the center of the convex lens according to the alternate placement layer 2C.

The alternate placement layer 112C including both of the convex lens function and incident angle conversion function (oblique correction function) is included in the solid-state imaging device 100C, whereby oblique incident light can be converted into vertical incident light, shading and color mixtures can be reduced, and high image quality can be achieved.

Currently, normal lenses for image sensors are fabricated with reflow, but the shape of the lens always becomes a spherical shape due to surface tension, and accordingly, a lens with asymmetry cannot be fabricated. Accordingly, such effects cannot be obtained.

<Third Embodiment: Application Example 2 (CMOS Response)>

Figure 14A:
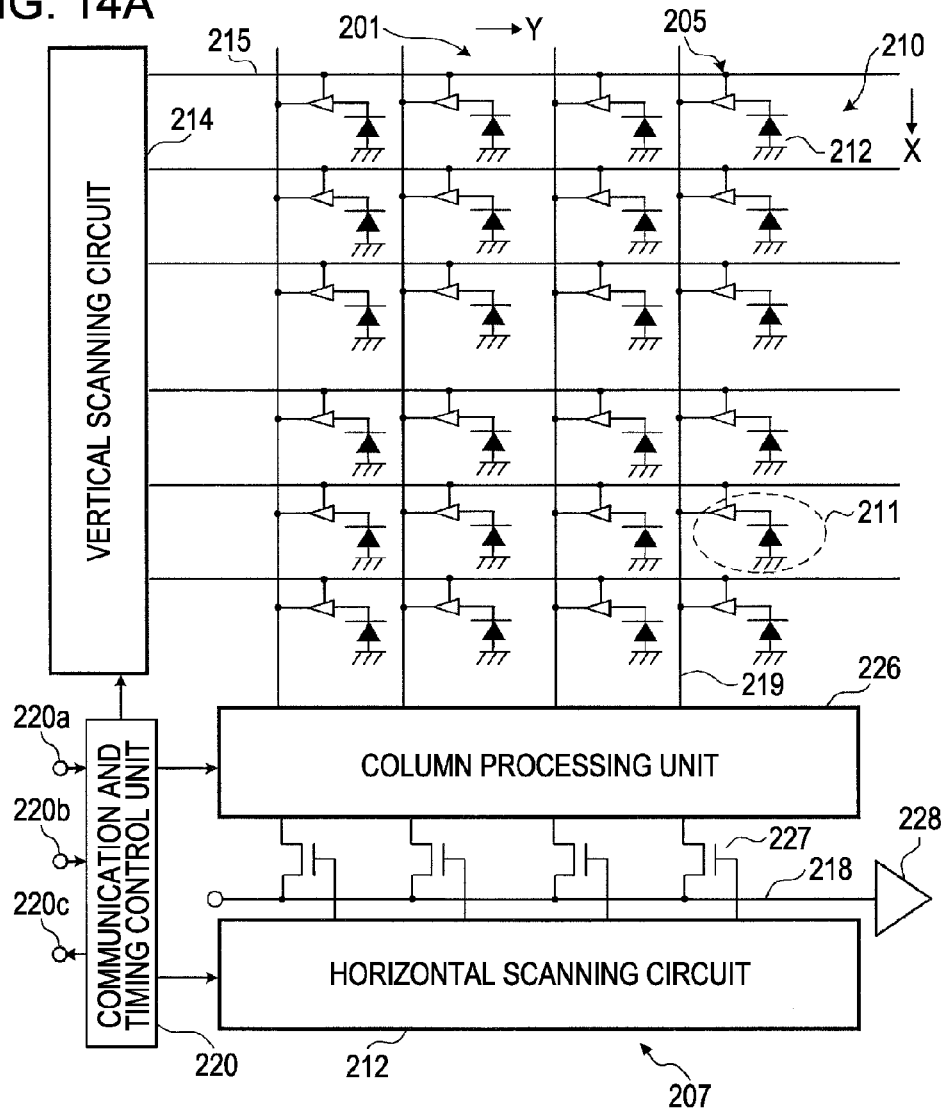
FIGS. 14A and 14B are circuit diagrams for describing a second example (application example 2: CMOS response) of the solid-state imaging device to which the optical lens according to the third embodiment is applied.
Figure 14B:
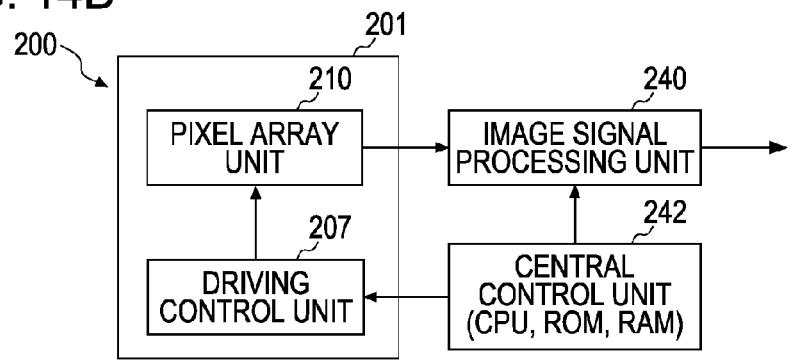
Figure 14C:
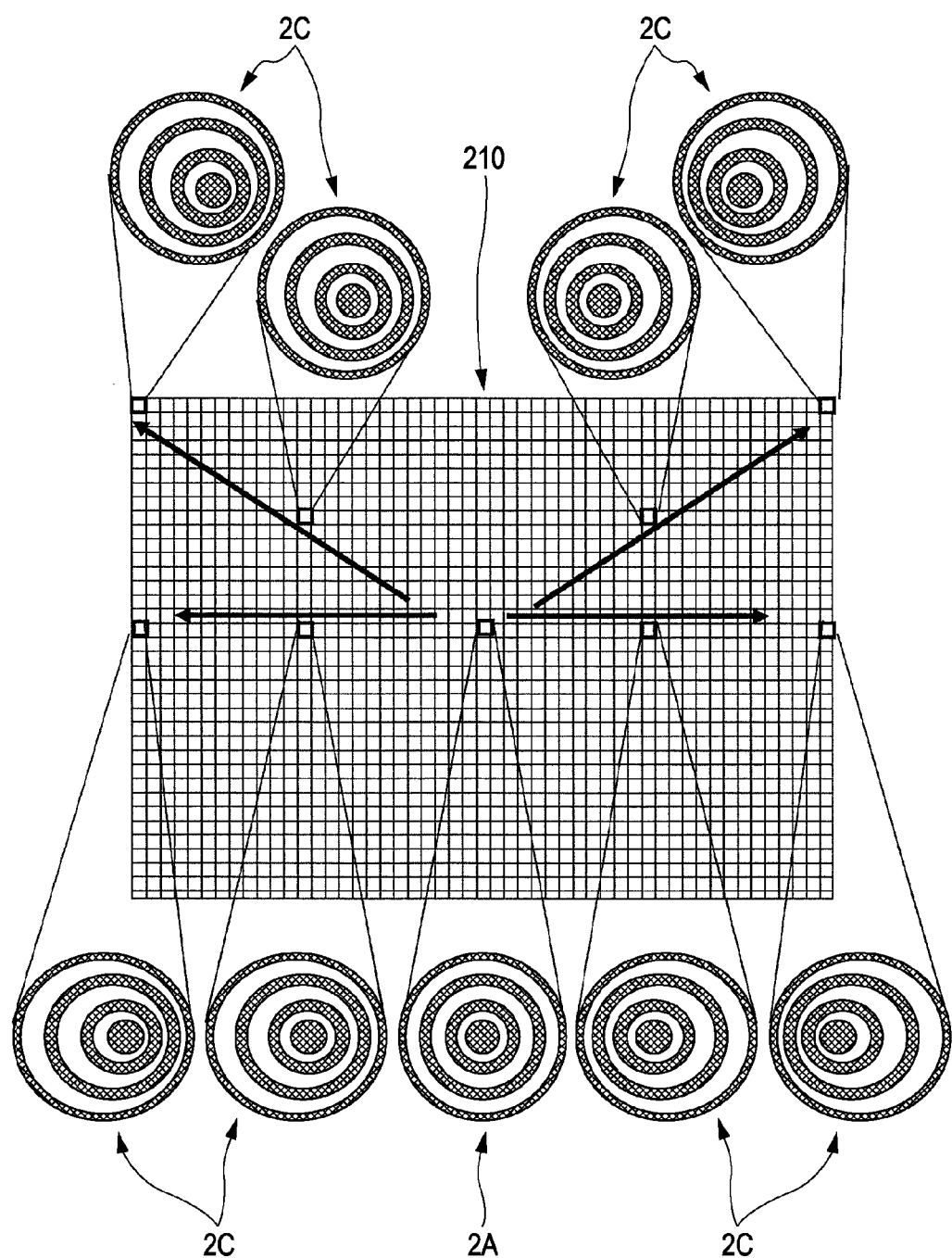
FIG. 14C is a plan schematic view of an alternate placement layer applied onto the pixel array unit of the solid-state imaging device according to the third embodiment (application example 2)

FIGS. 14A through 14C are diagrams for describing a second example (application example 2) of a solid-state imaging device to which the optical lens according to the third embodiment is applied. Here, FIGS. 14A and 14B are circuit diagrams of the solid-state imaging device according to the third embodiment (application example 2). FIG. 14C is a plan schematic view of an alternate placement layer applied to the pixel array unit in the solid-state imaging device according to the third embodiment (application example 2). Note that, in FIG. 14C, with regard to a lens shape according to the alternate placement layer of each pixel, representative positions alone are illustrated by being extracted and enlarged from the entire pixel array unit.

The solid-state imaging device according to the third embodiment (application example 2) is a solid-state imaging device applied to a CMOS sensor, and hereafter, will be referred to a CMOS solid-state imaging device 201. In this case, a configuration is provided wherein a single cell amplifier is provided as to each pixel (particularly, photoelectric conversion element) within the pixel array unit. A pixel signal is amplified at the corresponding cell amplifier, and is then output through a noise canceling circuit or the like.

As shown in FIG. 14A, the CMOS solid-state imaging device 201 is a so-called typical column type, which includes a pixel array unit 210 where multiple pixels 211 including a light reception element (an example of a charge generating unit) for outputting a signal corresponding to the amount of incident light are arrayed in a matrix manner, wherein the signal output from each pixel 211 is a voltage signal, and a CDS (Correlated Double Sampling) processing function unit, a digital conversion unit (ADC: Analog Digital Converter), and so forth are provided in column parallel.

Specifically, as shown in the drawing, the CMOS solid-state imaging device 201 includes the pixel array unit 210 where the multiple pixels 211 are arrayed in a matrix manner, a driving control unit 207 provided on the outside of the pixel array unit 210, a column processing unit 226, and an output circuit 228.

The driving control unit 207 has a control circuit function for reading out the signals of the pixel array unit 210 sequentially. For example, as the driving control unit 207, there are provided a horizontal scanning circuit (column scanning circuit) 212 for controlling column addresses and column scanning, a vertical scanning circuit (row scanning circuit) 214 for controlling row addresses and row scanning, a communication and timing control unit 220 having functions, such as an interface function as to an external device, and a function for generating an internal clock.

The horizontal scanning circuit 212 has a function of a readout scanning unit for reading out a count value from the column processing unit 226. These respective components of the driving control unit 207 are formed integral with semiconductor regions such as single-crystal silicon using the same technology as semiconductor integrated circuit manufacturing technology along with the pixel array unit 210, and are configured as solid-state imaging devices (imaging devices) serving as an example of a semiconductor system.

In FIG. 14A, a part of rows and columns is omitted from the drawing for convenience, but in reality, several tens to several thousands of pixels 211 are disposed at each row and each column. This pixel 211 is configured of a photoelectric conversion element 212 also referred to as a light reception element (charge generating unit), and intrapixel amplifier (cell amplifier; pixel signal generating unit) 205 having a semiconductor device (e.g., transistor) for amplification. As for the intrapixel amplifier 205, for example, an amplifier having a floating diffusion amplifier configuration is employed.

The pixels 211 are connected to the vertical scanning unit 214 via a row control line 215 for selecting a row, and the column processing unit 226 via a vertical signal line 219, respectively. Here, the row control line 215 indicates overall wiring entering the pixels from the vertical scanning circuit 214.

The horizontal scanning circuit 212 and vertical scanning circuit 214 are configured so as to include a shift register or decoder for example, and start address selection operation (scanning) in response to a control signal provided from the communication and timing control unit 220. Therefore, various pulse signals (e.g., reset pulse RST, transfer pulse TRF, DRN control pulse DRN, and so forth) for driving the pixels 211 are included in the row control line 215.

Though not shown in the drawing, the communication and timing control unit 220 includes a timing generator TG (an example of a readout address control device) function block for supplying a clock necessary for operation of each component, and a predetermined timing pulse signal, and a communication interface function block for receiving a master clock CLK0 via a terminal 220a, receiving data DATA for instructing an operation mode or the like via a terminal 220b, and further outputting data including the information of the CMOS solid-state imaging device 201 via a terminal 220c.

The pixels are arrayed in a two-dimensional matrix manner, so it is desirable to perform vertical scanning reading by accessing and capturing an analog pixel signal output in the column direction via the vertical signal line 219 generated by the intrapixel amplifier (pixel signal generating unit) 205 in increments of row (in column parallel), and then to perform horizontal scanning reading by accessing in the row direction which is a vertical column array direction to read out a pixel signal (e.g., digitized pixel data) to the output side, thereby realizing speeding up of the pixel signal and pixel data. It goes without saying that not only scanning reading but also random access can be performed by directly addressing a desired pixel 211 to read out only the information of the necessary pixel 211.

The communication and timing control unit 220 supplies a clock CLK1 having the same frequency as the master clock CLK0 input via the terminal 220a, a clock obtained by dividing the clock CLK1 by two, or a low-speed clock by further dividing the clock CLK1 to each component within the device, such as the horizontal scanning circuit 212, vertical scanning circuit 214, column processing unit 226, and so forth.

The vertical scanning circuit 214 selects a row of the pixel array unit 210, and supplies a necessary pulse to the row thereof. The vertical scanning circuit 214 includes, for example, a vertical decoder for stipulating a readout row in the vertical direction (selecting a row of the pixel array unit 210), and a vertical driving circuit for supplying a pulse the row control line 215 corresponding to the pixel 211 on the readout address (row direction) stipulated by the vertical decoder to drive this. Note that the vertical decoder selects a row for electronic shutter or the like as well as a row for reading a signal.

The horizontal scanning circuit 212 selects an unshown column circuit within the column processing unit 226 in sync with the low-speed clock CLK2 sequentially, and guides the signal thereof to the horizontal signal line (horizontal output line) 218. For example, the horizontal scanning circuit 212 includes, for example, a horizontal decoder for stipulating a readout column in the horizontal direction (selecting each column circuit within the column processing unit 226), and a horizontal driving circuit for guiding each signal of the column processing unit 226 to the horizontal signal line 218 using a selection switch 227 in accordance with the readout address stipulated by the horizontal decoder. Note that as for the number of horizontal signal lines 218, for example, n number of bits (n is a positive integer) handled by a column AD circuit, specifically, for example, if 10 (=n) bits, there are disposed ten horizontal signal lines 218 corresponding to the number of bits thereof.

With the CMOS solid-state imaging device 201 having such a configuration, the pixel signals output from the pixels 211 are supplied to the column circuits of the column processing unit 226 via the vertical signal lines 219 in increments of vertical column.

Each column circuit of the column processing unit 226 receives one column worth of pixel signals, and processes the signals thereof. For example, each column circuit has an ADC (Analog Digital Converter) circuit for converting an analog into signal 10-bit digital data, for example, using the low-speed clock CLK2.

The column processing unit 226 can have a noise canceling function by devising the circuit configuration thereof, whereby the pixel signal of the voltage mode input via the vertical signal line 219 can be subjected to processing for obtaining the difference between a signal level (noise level) immediately after pixel rest and a true (corresponding to light reception amount) signal level Vsig. Thus, noise signal components called fixed pattern noise (FPN) or reset noise can be removed.

The analog pixel signal (or digital pixel data) processed at the column processing unit 226 is transmitted to the horizontal signal line 218 via a horizontal selection switch 217 which is driven by the horizontal selection signal from the horizontal scanning circuit 212, and further input to the output circuit 228. Note that the above-mentioned 10 bits are an example, other number of bits may be employed, such as less than 10 bits (e.g., 8 bits), the number of bits exceeding 10 bits (e.g., 14 bits), or the like.

According to such a configuration, a pixel signal is sequentially output regarding each vertical column for each row from the pixel array unit 210 where the pixels 211 serving as charge generating units are disposed in a matrix manner. Subsequently, one image, i.e., a frame image corresponding to the pixel array unit 210 where the light reception elements are disposed in a matrix manner, is indicated with a pixel signal group of the entire pixel array unit 210.

FIG. 14B illustrates a configuration example of an imaging device 200 using the CMOS solid-state imaging device 201. The imaging device 200 is employed for a camera (or camera system) or a portable device including an imaging function or the like, for example. This is also similar to a later-described imaging device 300.

The pixel signal derived from the output circuit 228 as CMOS output (Vout) is input to an image signal processing unit 240 shown in FIG. 14B. A control signal from a central control unit 242 configured of a CPU (Central Processing Unit), ROM (Read Only Memory), RAM (Random Access Memory), and so forth is input to the driving control unit (an example of a driving unit) 207 of the CMOS solid-state imaging device 201, and the image signal processing unit 240 provided at the subsequent stage of the CMOS solid-state imaging device 201. The driving control unit 207 determines driving timing based on the control signal from the central control unit 242. The pixel array unit 210 (specifically, transistors making up the pixels 211) of the CMOS solid-state imaging device 201 is driven based on a driving pulse from the driving control unit 207.

The central control unit 242 controls the driving control unit 207, and also controls signal processing, image output processing, and so forth at the image signal processing unit 240.

The image signal processing unit 140 performs, for example, AD conversion processing for digitizing the imaging signals R, G, and B of each pixel, synchronization processing for synchronizing digitized imaging data R, G, and B, vertical banding noise correction processing for correcting vertical banding noise components caused by smear phenomenon and blooming phenomenon, WB control processing for controlling white balance (WB) adjustment, gamma correction processing for adjusting a gradation level, dynamic range expanding processing for expanding a dynamic range by using the pixel information of two screens having different charge storage time, YC signal generation processing for generating luminance data (Y) and color data (3), or the like. Thus, an image based on primary color imaging data of red (R), green (G), and blue (B) (each piece of pixel data of R, G, and B) can be obtained.

Each image thus generated is transmitted to an unshown display unit, and is presented to an operator as a visible image, or is stored and saved as is in a storage device such as a hard disk device or the like, or is transmitted to another function unit as processed data.

Now, with the CMOS solid-state imaging device 201 according to the third embodiment (Application Example 2), an alternate placement layer 2 is provided above the pixel array unit 210 such that the lens center corresponds to each pixel 211. The plan state thereof is set to such as shown in FIG. 14C.

That is to say, first, as for the alternate placement layer 2, it is fundamental to employ the circular or circular ring shapes of the high refractive index layer 21_*k* and low refractive index layer 20_*j*, such as shown in FIGS. 1C and 12C. Subsequently, the alternate placement layer 2 is disposed such that the optical axis thereof faces the center of the pixel array unit 210. At this time, an arrangement needs to be made wherein the incident angle conversion function is enhanced the closer the incident position is to the end portion of the pixel array unit 210, and the change level of rate of the low refractive index layers 20 and high refractive index layers 21 is enhanced the closer the incident position is to the end portion of the pixel array unit 210. That is to say, it is desirable to provide a configuration wherein the alternate placement layer 2A shown in FIG. 1C having no asymmetry is employed at the center of the pixel array unit 210, and the alternate placement layer 2C shown in FIG. 12C is employed at the other portion and the asymmetry thereof is enhanced the closer the incident position is to the end portion of the pixel array unit 210. In short, a configuration is employed wherein symmetric circular or circular ring shapes are provided at the center of the pixel array unit 210, and more asymmetric shapes are provided the closer the incident position is to the end portion of the pixel array unit 210.

The asymmetric center of gravity position at that time is shifted in the center direction of the pixel array unit 210, and the amount of shifting is set so as to increase the closer the incident position is to the end portion of the pixel array unit 210. Thus, oblique incidence of the principal ray is corrected the closer the incident position is to the end portion of the pixel array unit 210, whereby the condensed point of each lens can be brought to the center of the corresponding pixel 211. We have found that such lens shapes are provided within the CMOS solid-state imaging device 201 (above the pixel array unit 210), whereby deterioration in sensitivity (shading) caused at the end portion of the pixel array unit 210 is reduced, and color mixtures decrease, and accordingly, color reproducibility improves.

<Third Embodiment: Application Example 3 (CCD Response)>

Figure 15A:
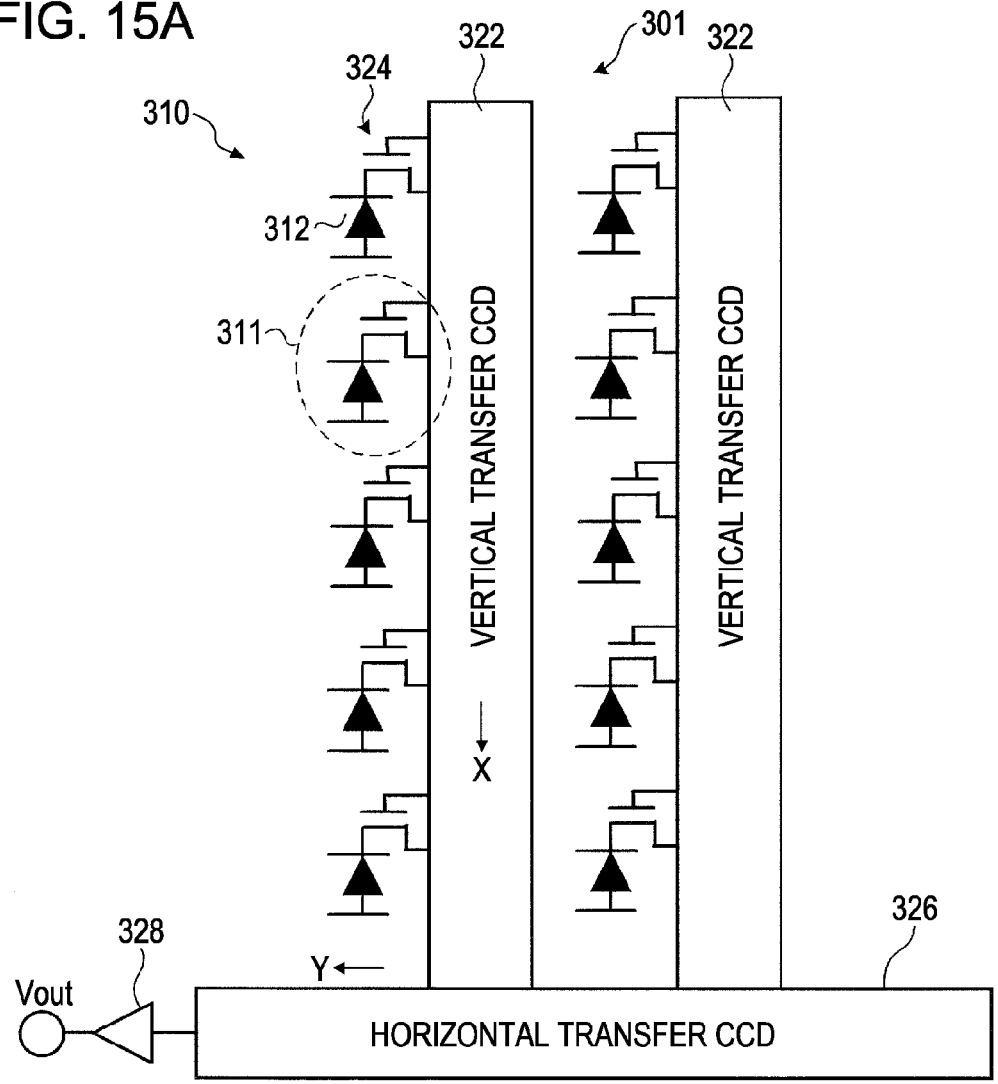
FIGS. 15A and 15B are circuit diagrams for describing a third example (application example 3: CCD response) of the solid-state imaging device to which the optical lens according to the third embodiment is applied.
Figure 15B:
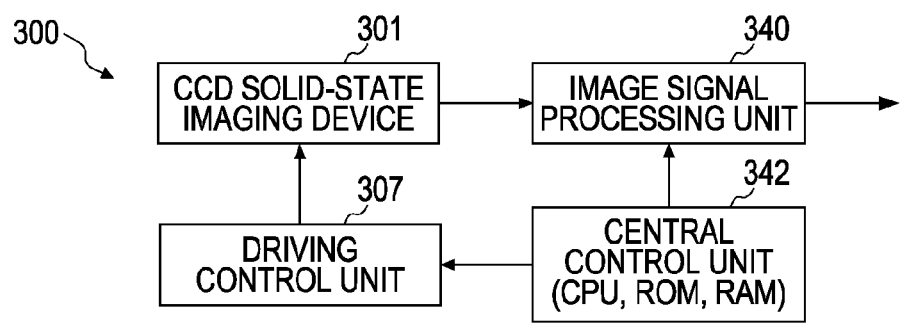
Figure 15C:
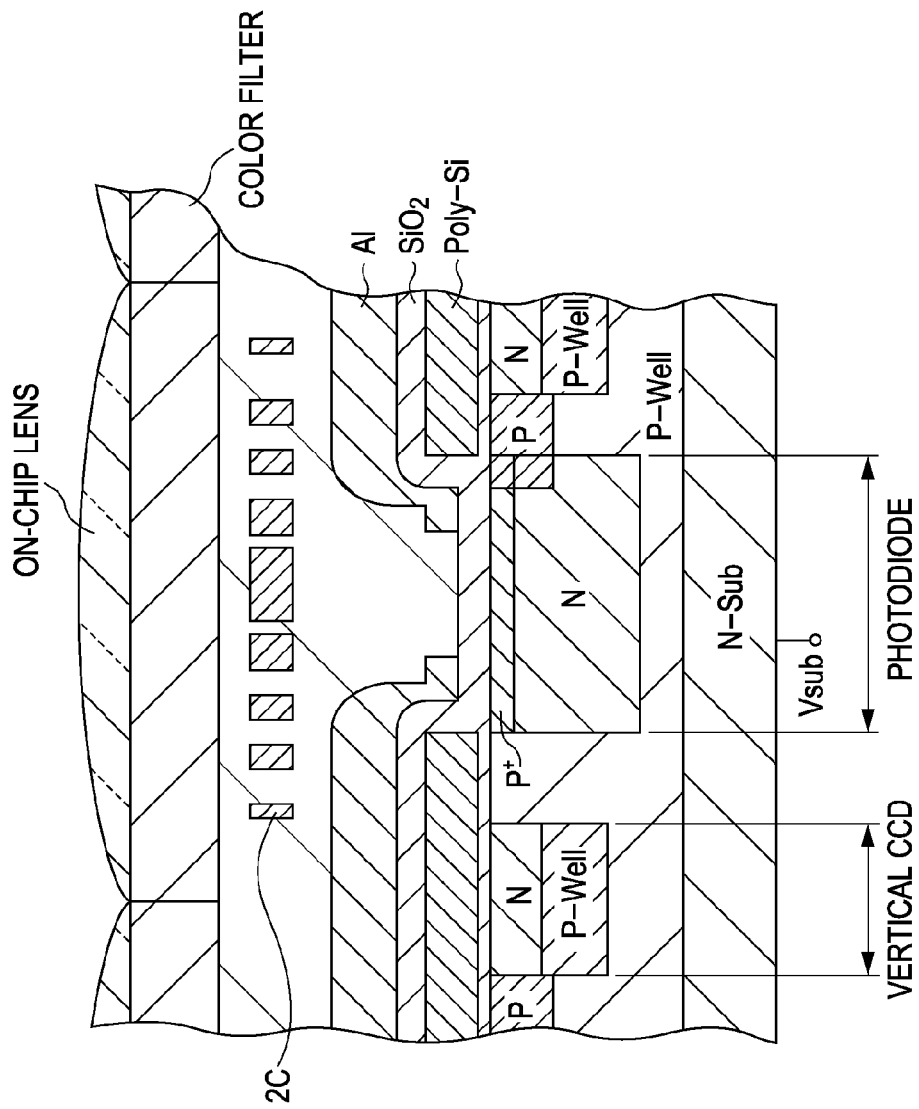
FIG. 15C is a cross-sectional configuration view in the vicinity of the substrate surface of the solid-state imaging device according to the third embodiment (application example 3)
Figure 15D:
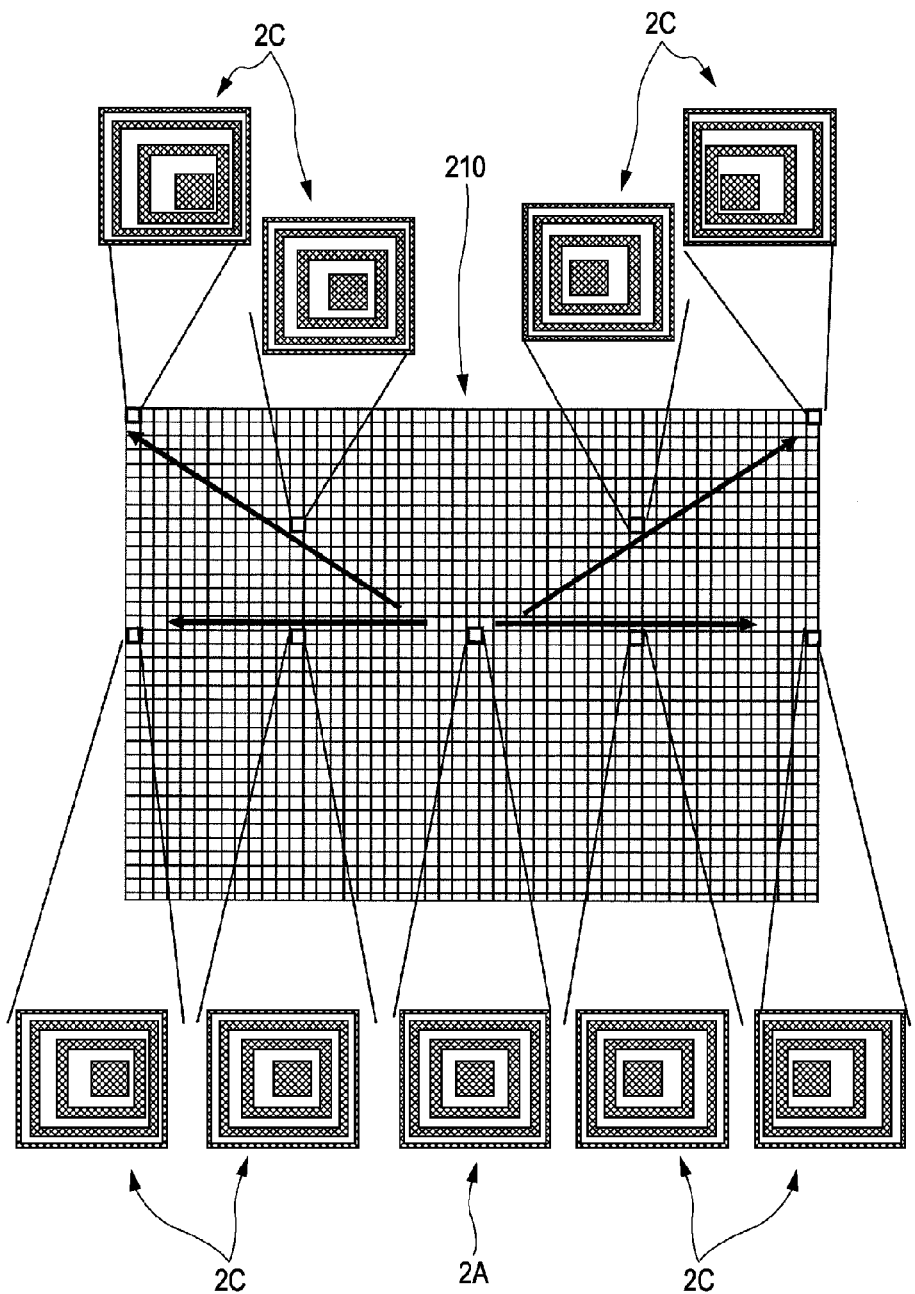
FIG. 15D is a plan schematic view of an alternate placement layer applied onto the pixel array unit of the solid-state imaging device according to the third embodiment (application example 3)

FIGS. 15A through 15D are diagrams for describing a third example (application example 3) of a solid-state imaging device to which the optical lens according to the third embodiment is applied. Here, FIGS. 15A and 15B are circuit diagrams of the solid-state imaging device according to the third embodiment (application example 3). FIG. 15C is a cross-sectional structural diagram around the substrate surface of the solid-state imaging device according to the third embodiment (application example 3). FIG. 15D is a plan schematic view of an alternate placement layer applied to the pixel array unit in the solid-state imaging device according to the third embodiment (application example 3). Note that, in FIG. 15D, with regard to a lens shape according to the alternate placement layer of each pixel, representative positions alone are illustrated by being extracted and enlarged from the entire pixel array unit.

The solid-state imaging device according to the third embodiment (application example 3) is a solid-state imaging device applied to a CCD solid-state imaging device (IT CCD image sensor) employing the interline transfer method, and hereafter, will be referred to a CCD solid-state imaging device 301.

As shown in FIG. 14A, the CCD solid-state imaging device 301 includes a pixel array unit 310 where multiple pixels 311 including a light reception element (an example of a charge generating unit) for outputting a signal corresponding to the amount of incident light are arrayed in a matrix manner (i.e., a two-dimensional matrix manner). The pixel array unit 310 specifically includes a photoelectric conversion element 312 also called a light reception element (charge generating unit) for outputting a signal corresponding to the amount of incident light.

Also, multiple vertical transfer CCDs 322 for vertically transferring the signal charge generated at the photoelectric conversion element 312 are provided in the vertical transfer direction. The charge transfer direction of the vertical transfer CCDs 322, i.e., the readout direction of a pixel signal is the vertical direction (X direction in the drawing).

With the configuration of the CCD solid-state imaging device 301 shown in FIG. 15A, only several pixels 311 are illustrated, but in reality, this is repeated in the lateral direction, and the result thereof is further repeated in the vertical direction.

Further, a MOS transistor making up a readout gate 324 lies between the vertical transfer CCD 322 and each photoelectric conversion element 312, and an unshown channel stop is provided at the boundary portion of each unit cell (increment component).

A pixel matrix unit 310 serving as an imaging area is configured of the multiple vertical transfer CCDs 322, which are provided for each vertical row of the pixels 311, for vertically transferring signal charge read out by the readout gate 324 from each pixel 311.

The signal charge accumulated in the photoelectric conversion element 312 of the pixel 311 is read out to the vertical transfer CCD 322 of the same vertical row by a driving pulse φROG corresponding to a readout pulse ROG being applied to the readout gate 324. The vertical transfer CCD 322 is transfer-driven, for example, by a drive pulse φVx based on a vertical transfer clock Vx such as three phases through eight phases, and transfers a portion equivalent to one scanning line (one line) of the readout signal charge in the vertical direction (referred to as line shifting) at a time in order during a part of a horizontal blanking period.

Also, with the CCD solid-state imaging device 301, one line worth of a horizontal transfer CCD 326 (H register portion, horizontal transfer portion) adjacent to each transfer destination side end portion of the multiple vertical transfer CCDs 322, i.e., the vertical transfer CCD 322 of the last row, extending in a predetermined (e.g., horizontal) direction is provided. The horizontal transfer CCD 326 is transfer-driven, for example, by drive pulses φH1 and φH2 based on two-phase horizontal transfer clocks H1 and H2, and transfers one line worth of signal charge transferred from the multiple vertical transfer CCDs 322 in the horizontal direction in order during a horizontal scanning period after a horizontal blanking period. Accordingly, multiple horizontal transfer electrodes corresponding to two-phase driving are provided.

With the end portion of the transfer destination of the horizontal transfer CCD 326, for example, there is provided an output amplifier 328 including a charge voltage conversion unit having a floating diffusion amplifier (FDA). The output amplifier 328 converts the signal horizontally transferred by the horizontal transfer CCD 326 into a voltage signal sequentially at the charge voltage conversion unit, amplifies this to a predetermined level, and output this. A pixel signal is derived from this voltage signal as CCD output (Vout) according to the incident amount of light from a subject. Thus, the CCD solid-state imaging device 301 employing the interline transfer method is configured.

The pixel signal derived from the output amplifier 328 as CCD output (Vout) is input to the image signal processing unit 340 shown in FIG. 15B. An image switching control signal from a central control unit 342 serving as an example of a signal switching control unit is input to the image signal processing unit 340. The CCD solid-state imaging device 301 is driven based on a drive pulse from a driving control unit (an example of a driving unit) 307.

FIG. 15B illustrates a configuration example of the imaging device 300 when employing the CCD solid-state imaging device 301. Basically, this configuration is the same as the configuration shown in FIG. 14B except that the imaging device is replaced from the CMOS solid-state imaging device 201 to the CCD solid-state imaging device 301.

Now, with the CCD solid-state imaging device 301 according to the third embodiment (application example 3), an alternate placement layer 2 is provided above the pixel array unit 310 such that the lens center corresponds to the center of each pixel 311. That is to say, a lens configuration employing the alternate placement layer 2 exists within the imaging device.

For example, FIG. 15C illustrates a cross-sectional structural diagram of the substrate surface and vicinity. With the pixels 311 for receiving incident light, an optical lens made up of an alternate placement layer is provided as an inner condensing lens corresponding to the photoelectric conversion element 312 made up of PN junction, and thereon, a color filter and on-chip lens are provided.

FIG. 15D illustrates the plan state thereof. Fundamentally, the same concept as the case of the CMOS solid-state imaging device 201 shown in FIG. 14C is applied. First, as for the alternate placement layer 2, it is fundamental to employ the rectangular or rectangular ring shapes of the high refractive index layer 21_k and low refractive index layer 20_j, such as shown in FIGS. 1E and 12E. Subsequently, the alternate placement layer 2 is disposed such that the optical axis thereof faces the center of the pixel array unit 310. At this time, it is desirable to provide a configuration wherein the alternate placement layer 2A shown in FIG. 1E having no asymmetry is employed at the center of the pixel array unit 310, and the alternate placement layer 2C shown in FIG. 12E is employed at the other portion and the asymmetry thereof is enhanced the closer the incident position is to the end portion of the pixel array unit 310. In short, a configuration is employed wherein symmetric rectangular or rectangular ring shapes are provided at the center of the pixel array unit 310, and more asymmetric shapes are provided the closer the incident position is to the end portion of the pixel array unit 310.

The asymmetric center of gravity position at that time is shifted in the center direction of the pixel array unit 310, and the amount of shifting is set so as to increase the closer the incident position is to the end portion of the pixel array unit 310. Thus, oblique incidence of the principal ray is corrected the closer the incident position is to the end portion of the pixel array unit 310, whereby the condensed point of each lens can be brought to the center of the corresponding pixel 311. We have found that such lens shapes are provided within the CCD solid-state imaging device 301 (above the pixel array unit 310), whereby deterioration in sensitivity (shading) caused at the end portion of the pixel array unit 310 is reduced, and color mixtures decrease, and accordingly, color reproducibility improves and a high image quality device can be obtained.

<Third Embodiment: Modification of Convex Lens+Incident Angle Conversion>

With the basic example of the third embodiment, in order to apply an asymmetric configuration to the alternate placement layer 2A having an symmetric configuration, the third asymmetrization method has been employed wherein the first and second asymmetrization methods are employed together, but only one thereof may be employed. This point is common to the first embodiment, wherein a convex lens providing method is not restricted to the third convex lens providing method for employing the first and second convex lens providing methods together, and may be configured of only one of the first and second convex lens providing methods.

For example, though not shown in the drawing, modification 1 can be provided by applying only the first asymmetrization method assuming a configuration wherein the widths of great refractive index layers (high refractive index layer 21_k) increase toward asymmetric center of gravity. In this case, as for small refractive index layers, all the widths need to be set to an equal width. In this case as well, even as viewed from either side of center of gravity, a configuration is provided wherein the width of the high refractive index layer 21_k having a great refractive index increases gradually toward asymmetric center of gravity.

Also, though not shown in the drawing, modification 2 can be provided by applying only the second asymmetrization method assuming a configuration wherein the widths of small refractive index layers (low refractive index layer 20_j) decrease toward asymmetric center of gravity. In this case, as for great refractive index layers (high refractive index layer 21_k), all the widths need to be set to an equal width. In this case as well, a configuration is provided wherein the width of the low refractive index layer 20_j having a small refractive index decreases gradually toward asymmetric center of gravity.

<Fourth Embodiment: Fundamentals of Concave Lens>

Figure 16:
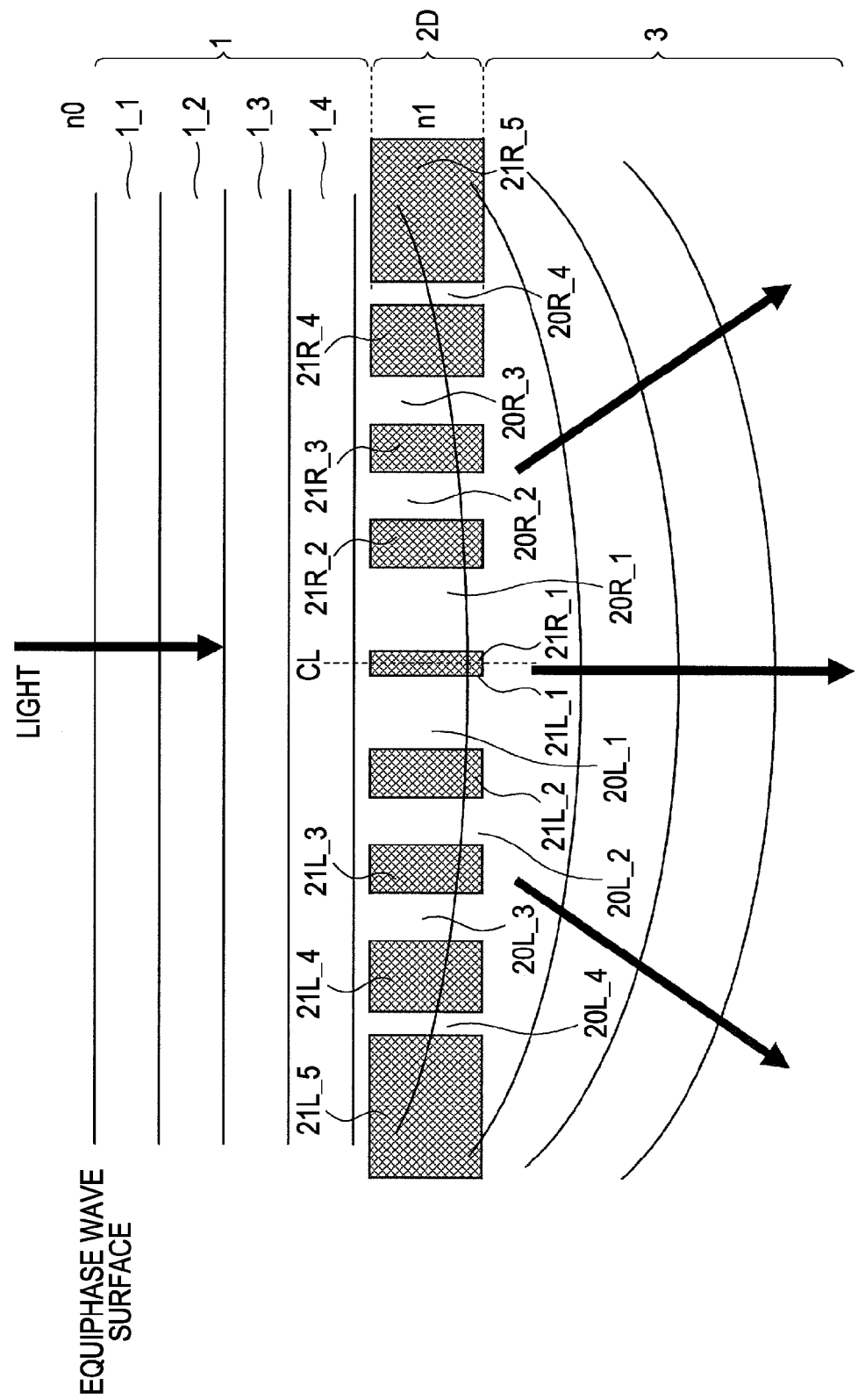
FIG. 16 is a diagram illustrating equiphase wave surfaces for describing the basic principle of an optical lens according to a fourth embodiment.

FIG. 16 is a diagram for describing the basic principle of a fourth embodiment of an optical lens. Here, FIG. 16 is a diagram illustrating equiphase wave surfaces for describing the basic principle of the fourth embodiment.

With the above-mentioned first through third embodiments, the convex lens function having a condensing effect is included in the alternate placement layers 2A through 2C, but this fourth embodiment has a feature in that a concave lens function having a diffusion effect is included in an alternate placement layer 2D.

In order to include a concave lens function having a diffusion effect in the alternate placement layer 2D, with the fourth embodiment, a symmetric configuration is employed wherein great refractive index layers having a width equal to or smaller than the wavelength order are disposed, in a plate shape, non-densely at the center and disposed densely farther away from the center. That is to say, the relation between the widths of the great refractive index layers and the widths of the small refractive index layers is inverted as to the first embodiment, whereby a concave lens function can be included in the alternate placement layer 2D.

In order to include a concave lens function by providing a configuration wherein density is low at the center and increases farther away from the center, for example, it is desirable to employ one of a first concave lens proving method wherein the widths of great refractive index layers decrease gradually toward the center of a lens, a second concave lens providing method wherein widths of small refractive index layers increase gradually toward the center of a lens, and a third concave lens providing method wherein the first concave lens providing method and second concave lens providing method are employed together.

From the perspective of diffusion efficiency, it is most effective to employ the third concave lens providing method. In this case, the wave face is a convex face, whereby diffusibility of light can be included.

Also, in a case wherein, with a process for embedding low refractive index layers, there is difficulty such that embedding widths cannot be narrowed due to insufficient lithography resolution, or embedding becomes poor due to occurrence of a void when narrowing the embedding widths, fabrication can be made by setting the widths of the low refractive index layers to equal widths that can be embedded using lithography like the fourth embodiment (modification 1). Particularly, this becomes an effective tool when this width that can be embedded is just at the wavelength order, where if the width is expanded further, continuity of equiphase wave surfaces (wave surfaces) is lost.

Also, in a case wherein, with a process for etching high refractive index layers using lithography, it is difficult to perform narrow width lithography or etching process such that widths cannot be narrowed due to insufficient lithography resolution, or width controllability deteriorates due to occurrence of side etching at the time of the etching process, fabrication can be made by setting the widths of the high refractive index layers to equal widths that can be subjected to etching using lithography like the fourth embodiment (modification 2). Particularly, this becomes an effective tool when this width that can be subjected to etching using lithography is just at the wavelength order, where if the width is expanded further, continuity of equiphase wave surfaces (wave surfaces) is lost.

As for the advantage of such a concave lens, for example, a recessed portion formed by subjecting the high refractive index layer 21_*k* to etching on a wiring layer including multiple wires is embedded with the low refractive index layer 20_*j*, whereby an inner diffusion lens (concave lens) can be formed as to each photoelectric conversion unit (light reception portion), and accordingly, the inner diffusion lens can be disposed at an appropriate position without depending on irregularities of wiring. Thus, incident light can be condensed at a photoelectric conversion unit in a most appropriate manner.

When the center of an inner diffusion lens is formed so as to be biased toward the center side of the pixel array unit (imaging area) from the center of a photoelectric conversion unit, shading due to oblique incident light is improved, and pupil correction can be performed. At least one of the multiple lenses is an on-chip lens formed above the inner diffusion lens, whereby incident light can be condensed at a light reception portion in collaboration with the on-chip lens serving as a condensing lens and the inner diffusion lens.

With the fourth embodiment as well, like the second embodiment, the alternate placement layer 2B having the incident angle conversion function (oblique light correction function) can be combined with the alternate placement layer 2D having the convex lens function. Also, like the third embodiment, the alternate placement layer 2D which includes both of the concave lens function and oblique incident light correction function can be provided by applying the arrangement of the alternate placement layer 2B according to the second embodiment having an asymmetric configuration wherein, with the lens center as a boundary, at one side many high refractive index layers having a great refractive index exist by ratio, and at the opposite side a few high refractive index layers exist by ratio.

As can be understood from the above-mentioned description, when providing a function as an optical member by arraying the low refractive index layer 20_*j* and high refractive index layer 21_*k* of which the widths are equal to or smaller than the wavelength order in the lateral direction, the layout relation of each piece of density of the high refractive index layer 21_*k* at the lens center and end portion is adjusted, whereby the convex lens function (condensability) can be provided, and the convex lens function (expandability) can be provided. The present embodiment can be applied to an optical device, such as the solid-state imaging device 100, a display, and so forth by providing condensability or expandability.

<Manufacturing Process>

Figure 17A:
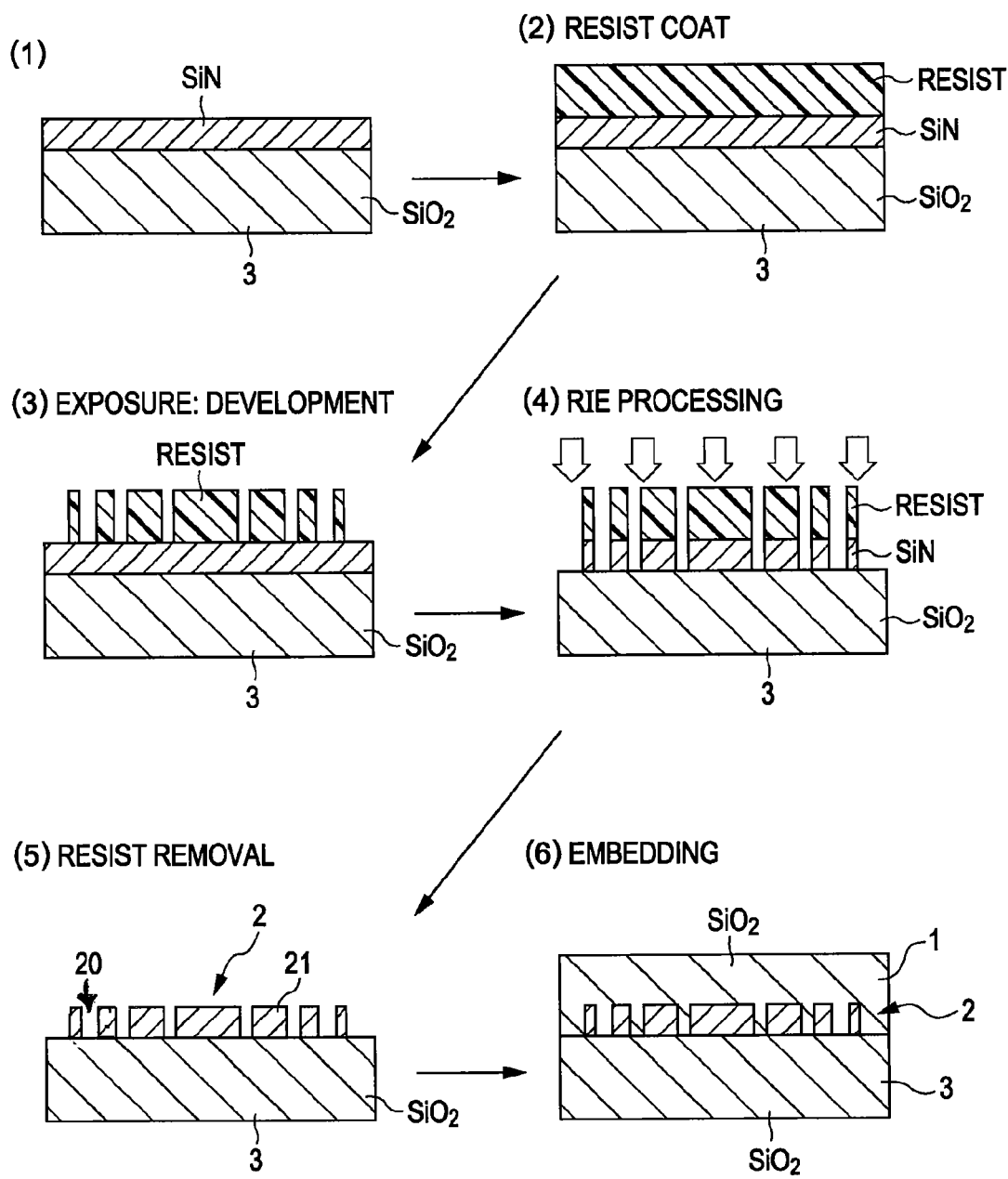
FIG. 17A is a conceptual diagram for describing a manufacturing process according to the present embodiment in a case wherein alternate placement layers according to the first through fourth embodiments are formed integral with the solid-state imaging device.
Figure 17B:
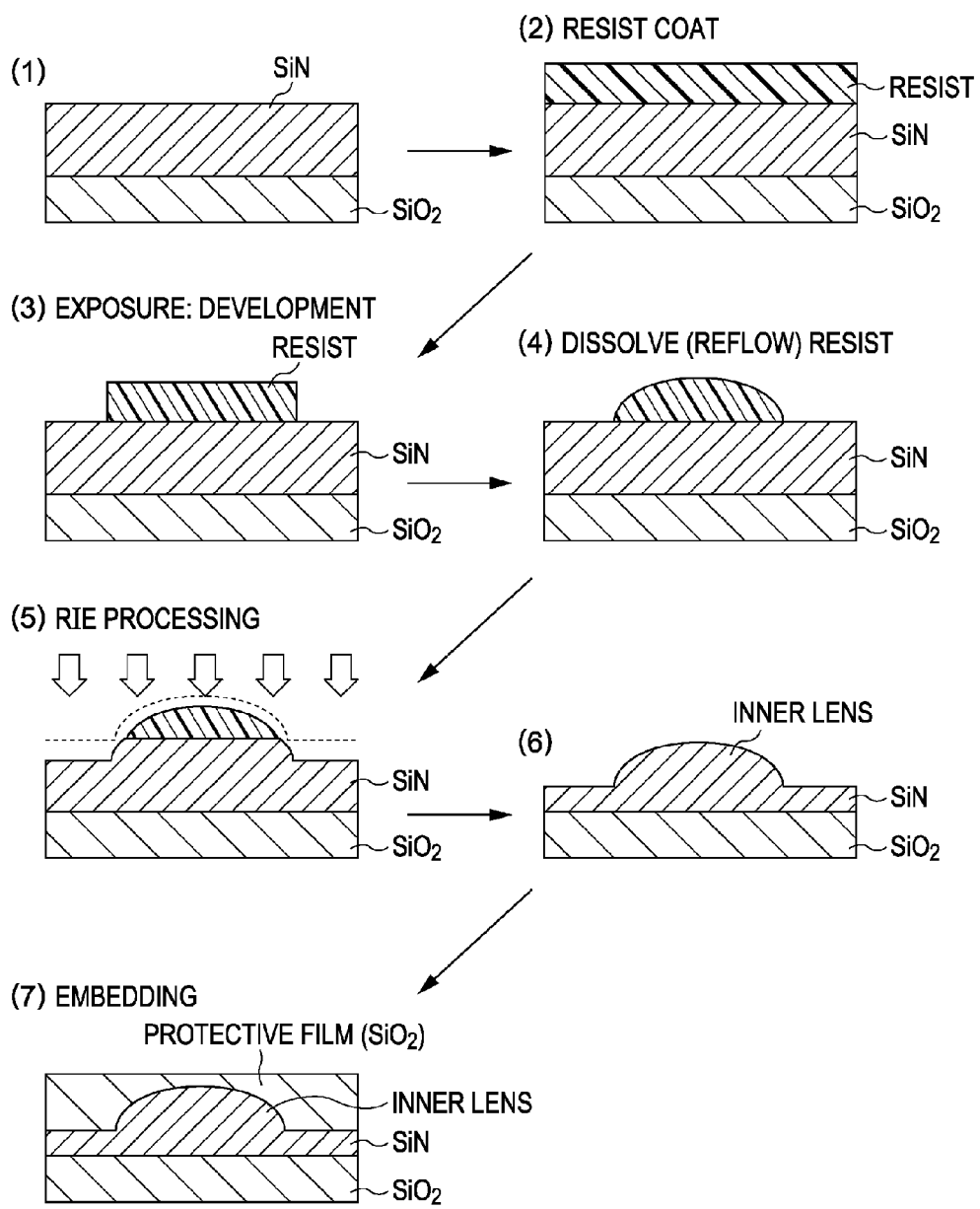
FIG. 17B is a conceptual diagram for describing a comparative example as to the manufacturing process according to the present embodiment (in the case of inner lens formation)
Figure 17C:
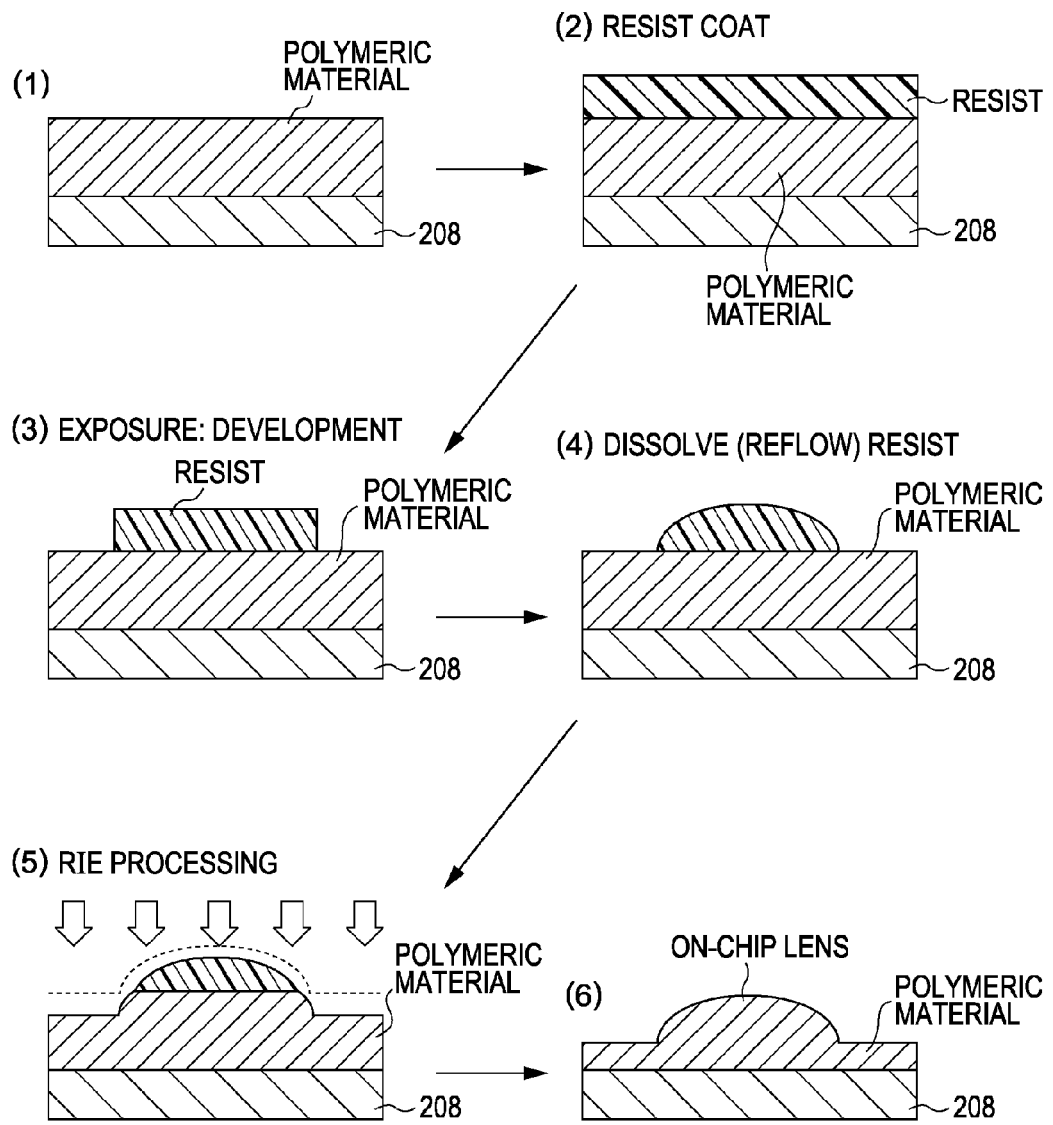
FIG. 17C is a conceptual diagram for describing a comparative example as to the manufacturing process according to the present embodiment (in the case of on-chip lens formation).

FIG. 17A is a conceptual diagram for describing the manufacturing process according to the present embodiment in a case wherein the alternate placement layer 2 (2A through 2D) according to the first through fourth embodiments is formed integral with the solid-state imaging device. FIGS. 17B and 17C are conceptual diagrams for describing comparison examples as to the manufacturing process according to the present embodiment. Here, FIG. 17B illustrates an inner lens manufacturing process, and FIG. 17C illustrates an on-chip lens manufacturing process.

In a case wherein the alternate placement layer 2 (2A through 2D) according to the first through fourth embodiments is formed integral with the solid-state imaging device, first, silicon oxide SiO2 (refractive index n1=1.46) making up a single material layer 3 serving as the medium of the optical lens 110 is formed with predetermined thickness on the upper layer of the silicon substrate (not shown in the drawing) where the pixel units have already been formed. A silicon nitride SiN thin film making up the thin-film layer 130 is formed on the upper layer of the silicon substrate (not shown in the drawing) as necessary, and on the upper layer thereof silicon oxide SiO2 making up the single material 3 serving as the medium of the optical lens 110 is formed with predetermined thickness. Now, the predetermined thickness means the distance (substantial lens length) from the surface of the silicon substrate to later-described silicon nitride SiN making up the alternate placement layer 2.

Subsequently, as shown in (1) in FIG. 17A, the silicon nitride SiN making up the alternate placement layer 2 is layered with predetermined thickness on the upper layer of the single material 3 made up of silicon oxide SiO2. Now, the predetermined thickness means the thickness of the alternate placement layer 2, i.e., lens thickness.

Subsequently, as with a resist coating process shown in (2) in FIG. 17A, a resist film is formed on the upper layer of the alternate placement layer 2 made up of silicon nitride SiN. Further, like exposure and development processes shown in (3) in FIG. 17A, the resist film is exposed using a resist pattern such that each of the low refractive index layer 20_*j* and high refractive index layer 21_*k* having a predetermined width which is changed gradually is arrayed in predetermined order, and the portion corresponding to the portion serving as the low refractive index layer 20_*j* is removed (etching) from the resist film. It goes without saying that the array position of each of the low refractive index layer 20_*j* and high refractive index layer 21_*k* is set to a position corresponding to the position of a pixel (particularly, light reception portion).

There is provided a single material layer 3 made up of silicon oxide SiO2 having the thickness corresponding to the lens length between the silicon nitride making up the alternate placement layer 2 and the unshown silicon substrate, so a problem due to damage by etching up to near the silicon substrate surface is not caused.

Subsequently, as with an opening (RIE processing) process shown in (4) in FIG. 17A, etching is performed using the RIE (Reactive Ion Etching) method through the opening portion of the resist film corresponding to the portion serving as the low refractive index layer 20_*j*, thereby providing opening portions on the silicon nitride SiN of the alternate placement layer 2, which reach the SiO2 film of the lowermost layer.

Subsequently, as with a resist removal process shown in (5) in FIG. 17A, the resist film on the silicon nitride SiN making up the alternate placement layer 2 is removed. Thus, the alternate placement layer 2 where the opening portion is formed at the portion serving as the low refractive index layer 20_*j* is formed on the upper layer of the single material layer 3 made up of silicon oxide SiO2.

Further, in the case of applying to an inner lens, for planarizing or the like, as with an embedding process shown in (6) in FIG. 17A, a silicon oxide SiO2 film which serves as the low refractive index layer 20_*j* and serves as protection of the alternate placement layer 2 is formed with predetermined thickness on the upper layer of the single material layer 3 made up of silicon oxide SiO2 where the alternate placement layer 2 where the opening portion is formed at the portion serving as the low refractive index layer 20_*j* is formed, for example, using CVD or the like again. Thus, the portion serving as the low refractive index layer 20_*j* of the alternate placement layer 2 made up of silicon nitride SiN where the opening portions are formed is embedded by silicon oxide SiO2, and a single material 1 of silicon oxide SiO2 serving as a medium at the light incident side is formed with predetermined thickness.

Though not shown in the drawing, further thereon a color filer or micro lens may be formed so as to correspond to a pixel.

On the other hand, in the case of applying to an on-chip lens to be disposed on a color filter, the embedding process shown in (6) in FIG. 17A is unnecessary.

Note that, of the manufacturing process shown here, with the embedding process, not only the portion serving as the low refractive index layer 20_j is embedded by silicon oxide SiO2, but also a silicon oxide SiO2 film is formed on the upper layer of the alternate placement layer 2 where the low refractive index layer 20_j and high refractive index layer 21_k are alternately disposed, thereby forming a single material layer 1, but forming the single material layer 1 is not indispensable. Also, in extreme cases, the entire embedding process can be omitted. In this case, the opening portions provided in silicon nitride SiN are not embedded by silicon oxide SiO2, so the low refractive index layer 20_j is the air.

In any case, an on-chip lens employing the arrangement of the alternate placement layer 2 is formed on the uppermost layer of the imaging device. In this case, in reality, the surface thereof comes into contact with the air.

Thus, the manufacturing process according to the present embodiment includes no reflow process, and fabrication can be made only by simple and easy-to-use processing technology of lithography and etching, whereby an easy-to-use process having no complicated process such as etchback or the like can be provided, and not only reduction in the number of processes and reduction in cost are realized, but also advantages of reproducibility, uniformity, and mass productivity can be obtained.

Further, each of the low refractive index layer 20_j and high refractive index layer 21_k having a predetermined width which is changed gradually can be arrayed in predetermined order, by design of the photoresist mask. A lens effect according to the alternate placement layer 2 can be changed as appropriate by adjusting the width and number of arrays of each rectangular low refractive index layer 20_j and each rectangular high refractive index layer 21_k. An asymmetric configuration can be readily fabricated in the in-plane direction, and accordingly, the width of designing can optically spread as compared with a case wherein an existing spherical lens is manufactured.

On the other hand, with the manufacturing process of the comparative example shown in FIG. 17B, in the case of forming an inner lens, first, as shown in (1) in FIG. 17B, silicon nitride SiN serving as the medium of a lens is formed on silicon oxide SiO2 with predetermined thickness. The predetermined thickness is a level somewhat thicker than the thickness of the ultimate inner lens.

Next, as with a resist coating process shown in (2) in FIG. 17B, a resist film is formed on the upper layer of a lens medium layer. Further, as with an exposure and development process shown in (3) in FIG. 17B, a resist pattern such as lenses being arrayed in predetermined order is employed to exposure the resist film, and remove the portion corresponding to the portion equivalent to between the resist film and an adjacent lens (etching).

Subsequently, as with a reflow process shown in (4) in FIG. 17B, resist is solved to form a lens shape. For example, resist is solved (reflowed) by setting postbake to 150° C., thereby forming a lens shape. Accordingly, as for resist, a heat-proof weak material is necessary.

Subsequently, as with an etchback (RIE processing) process shown in (5) in FIG. 17B, etching is performed using the RIE (Reactive Ion Etching) method, thereby removing resist. Thus, as shown in (6) in FIG. 17B, a convex lens is formed on a lens medium layer. At this time, there is a possibility that a problem may be caused wherein gain enters (a depository film is formed) to narrow a gap between lenses.

Subsequently, in order to flatten a surface, as with an embedding process shown in (7) in FIG. 17B, a silicon oxide SiO2 film is formed with predetermined thickness. Though not shown in the drawing, further thereon a color film or micro lens may be formed so as to correspond to a pixel.

On the other hand, in the case of forming an on-chip lens to be disposed on a color filter, first, as shown in (1) in FIG. 17C, a polymeric material such as OPV or the like serving as a lens medium is formed with predetermined thickness on the upper layer of a color filter to be formed further on the upper layer above the silicon substrate 102. The predetermined thickness is a level somewhat thicker than the thickness of the ultimate inner lens.

Hereafter, in the same way as that in the case of forming the above-mentioned inner lens, the processes up to the etchback (RIE processing) process shown in (5) in FIG. 17C are performed, thereby forming a convex lens, as shown in (6) in FIG. 17C.

In the case of applying to an on-chip lens, the embedding process shown in (6) in FIG. 17B according to inner lens formation is unnecessary. Note however, for the sake of surface protection or the like, a polymeric material having a low refractive index may be further embedded depending on cases.

Thus, with the manufacturing process according to the comparative example, a convex lens is formed by reflow and etchback regardless of whether to form an inner lens or on-chip lens. With reflow of resist serving as the origin of a lens shape, in order to fabricate a spherical shape using surface tension, an asymmetric configuration cannot be provided within a surface. Also, the number of processes increases, and cost increases.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a solid state image device, comprising the steps of:

providing a silicon substrate having pixel unit therein, each pixel unit including a portion that converts light into an electrical charge; and forming an optical member by (a) forming a first single material layer film on the substrate, the single material having a refractive index of n0, (b) forming a thin film on the single material layer film, the thin film having a refractive index of n1, (c) forming openings in the thin film that extend to the single material layer film, and (d) forming a second single material layer film on the thin film so as to cover the thin film and fill the openings, wherein, n0<n1, the first and second material layer films are made of the same material, the openings in the thin film are such that the single material layer filling the openings and the remaining thin film material form an alternate placement layer, the alternate placement layer being comprised of laterally distributed separate high refractive index layers having a greater refractive index n1 and separate lower refractive index layers having a small refractive index n0, which refractive index layers are each relatively thin in a lateral direction relative to an optical axis as compared with an optical length of the optical member, the high and low refractive index layers are disposed alternately in the lateral direction, the alternate placement layer is effective as a condensing lens for light passing therethrough and the optical member has a mechanical center relating to the lateral direction.

2. The method of claim 1, wherein the first and second single material layers are made of silicon dioxide.

3. The method of claim 1, wherein the thin film is made of silicon nitride.

4. The method of claim 2, wherein the thin film is made of silicon nitride.

5. The method of claim 1, wherein the high and low refractive index layers are positioned concentrically about the optical axis.

6. The method of claim 1, wherein:
the widths of said high refractive index layers successively increase toward the mechanical center of said member; and
the widths of said low refractive index layers successively decrease toward the mechanical center of said member.

7. The method of claim 5, wherein:
the widths of said high refractive index layers successively increase toward the mechanical center of said member; and
the widths of said low refractive index layers successively decrease toward the mechanical center of said member.

8. The method of claim 1, wherein said high refractive index layers are each disposed symmetrically so as to be disposed densely at the mechanical center of said optical member along said lateral direction, and disposed non-densely along said lateral direction farther away from said mechanical center.

9. The method of claim 1, wherein:
said high refractive index layers are disposed such that each width of said high refractive index layers increases gradually toward the mechanical center of said optical member; and
said low refractive index layers are disposed such that each width of said low refractive index layers decreases gradually toward the mechanical center of said optical member.

10. The method of claim 1, wherein:
said high refractive index layers are disposed such that each width of said high refractive index layers increases gradually toward the mechanical center of said optical member;
and said low refractive index layers are disposed so as to have an equal width.

11. The method of claim 1, wherein:
said low refractive index layers are disposed such that each width of said low refractive index layers decreases gradually toward the mechanical center of said optical member; and
said high refractive index layers are disposed so as to have an equal width.

12. The method of claim 1, wherein said high refractive index layers are each disposed symmetrically so as to be disposed non-densely at the mechanical center of said member, and disposed densely farther away from said center.

13. The method of claim 12, wherein:
said high refractive index layers are disposed such that each width of said high refractive index layers decreases gradually toward the mechanical center of said optical member; and
said low refractive index layers are disposed such that each width of said low refractive index layers increases gradually toward the mechanical center of said member.

14. The method of claim 12, wherein:
said high refractive index layers are disposed such that each width of said high refractive index layers decreases gradually toward the mechanical center of said member; and
said low refractive index layers are disposed so as to have an equal width.

15. The method of claim 12, wherein:
said low refractive index layers are disposed such that each width of said low refractive index layers increases gradually toward the mechanical center of said member; and
said high refractive index layers are disposed so as to have an equal width.

16. The method of claim 1, wherein each width of at least one kind of layer of said high refractive index layers and said low refractive index layers is disposed asymmetrically in said lateral direction.

17. The method of claim 1, wherein:
said high refractive index layers are disposed such that each width of said high refractive index layers increases gradually toward the optical barycentric position from one end of said member; and
said low refractive index layers are disposed such that each width of said low refractive index layers decreases gradually toward the optical barycentric position from one end of said member.

18. The method of claim 16, wherein:
said high refractive index layers are disposed such that each width of said high refractive index layers increases gradually toward an optical barycentric position from one end of said member; and said low refractive index layers are disposed so as to have an equal width.

19. The method of claim 16, wherein:
said low refractive index layers are disposed such that each width of said high refractive index layers decreases gradually toward an optical barycentric position from one end of said member; and
said high refractive index layers are disposed so as to have an equal width.

20. The method of claim 16, wherein said high refractive index layers are each disposed asymmetrically so as to be disposed densely at the mechanical center of said optical member, and disposed non-densely farther away from said mechanical center.

21. The method of claim 16, wherein said high refractive index layers are each disposed asymmetrically so as to be disposed non-densely at the mechanical center of said optical member, and disposed densely farther away from said mechanical center.

* * * * *